(12) United States Patent (10) Patent No.: US 12,113,101 B2
Pidaparthi et al. (45) Date of Patent: Oct. 8, 2024

(54) METHOD AND SYSTEM OF JUNCTION TERMINATION EXTENSION IN HIGH VOLTAGE SEMICONDUCTOR DEVICES

(71) Applicant: SEMICONDUCTOR COMPONENTS INDUSTRIES, LLC, Scottsdale, AZ (US)

(72) Inventors: Subhash Srinivas Pidaparthi, Santa Clara, CA (US); Andrew P. Edwards, Santa Clara, CA (US); Clifford Drowley, Santa Clara, CA (US); Kedar Patel, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/369,600

(22) Filed: Jul. 7, 2021

(65) Prior Publication Data

US 2022/0013626 A1 Jan. 13, 2022

Related U.S. Application Data

(60) Provisional application No. 63/049,562, filed on Jul. 8, 2020.

(51) Int. Cl.
*H01L 29/06* (2006.01)
*H01L 21/265* (2006.01)
*H01L 21/266* (2006.01)
*H01L 21/324* (2006.01)
*H01L 29/40* (2006.01)

(52) U.S. Cl.
CPC .... *H01L 29/0615* (2013.01); *H01L 21/26546* (2013.01); *H01L 21/266* (2013.01); *H01L 21/3245* (2013.01); *H01L 29/401* (2013.01); *H01L 29/402* (2013.01)

(58) Field of Classification Search
CPC .......... H01L 29/0615; H01L 21/26546; H01L 21/266; H01L 21/3245; H01L 29/401; H01L 29/402
See application file for complete search history.

(56) References Cited

U.S. PATENT DOCUMENTS 5,914,500 A * 6/1999 Bakowski ........... H01L 29/1608
257/E29.022
7,759,186 B2 7/2010 Imhoff et al.
(Continued)

*Primary Examiner* — Syed I Gheyas
(74) *Attorney, Agent, or Firm* — Kevin B. Jackson

(57) ABSTRACT

A method for manufacturing a semiconductor device includes: providing a semiconductor substrate; epitaxially growing a first semiconductor layer coupled to the semiconductor substrate; epitaxially growing a second semiconductor layer coupled to the first semiconductor layer, wherein the second semiconductor layer comprises a contact region and a terminal region surrounding the contact region; forming a mask layer on the second semiconductor layer, wherein the mask layer is patterned with a tapered region aligned with the terminal region of the second semiconductor layer; implanting ions into the terminal region of the second semiconductor layer using the mask layer to form a tapered junction termination element in the terminal region of the second semiconductor layer; and forming a contact structure in the contact region of the second semiconductor layer.

19 Claims, 67 Drawing Sheets

(56) References Cited

U.S. PATENT DOCUMENTS

| | | |
|---|---|---|
| 8,969,180 B2 | 3/2015 | Nie et al. |
| 2010/0055882 A1* | 3/2010 | Imhoff ................ H01L 29/868 |
| | | 257/E21.334 |
| 2014/0206179 A1* | 7/2014 | Nie .................... H01L 29/8083 |
| | | 438/478 |
| 2017/0222047 A1* | 8/2017 | Conway ............ H01L 29/66924 |
| 2019/0131446 A1* | 5/2019 | Rupp ................ H01L 29/66712 |

* cited by examiner

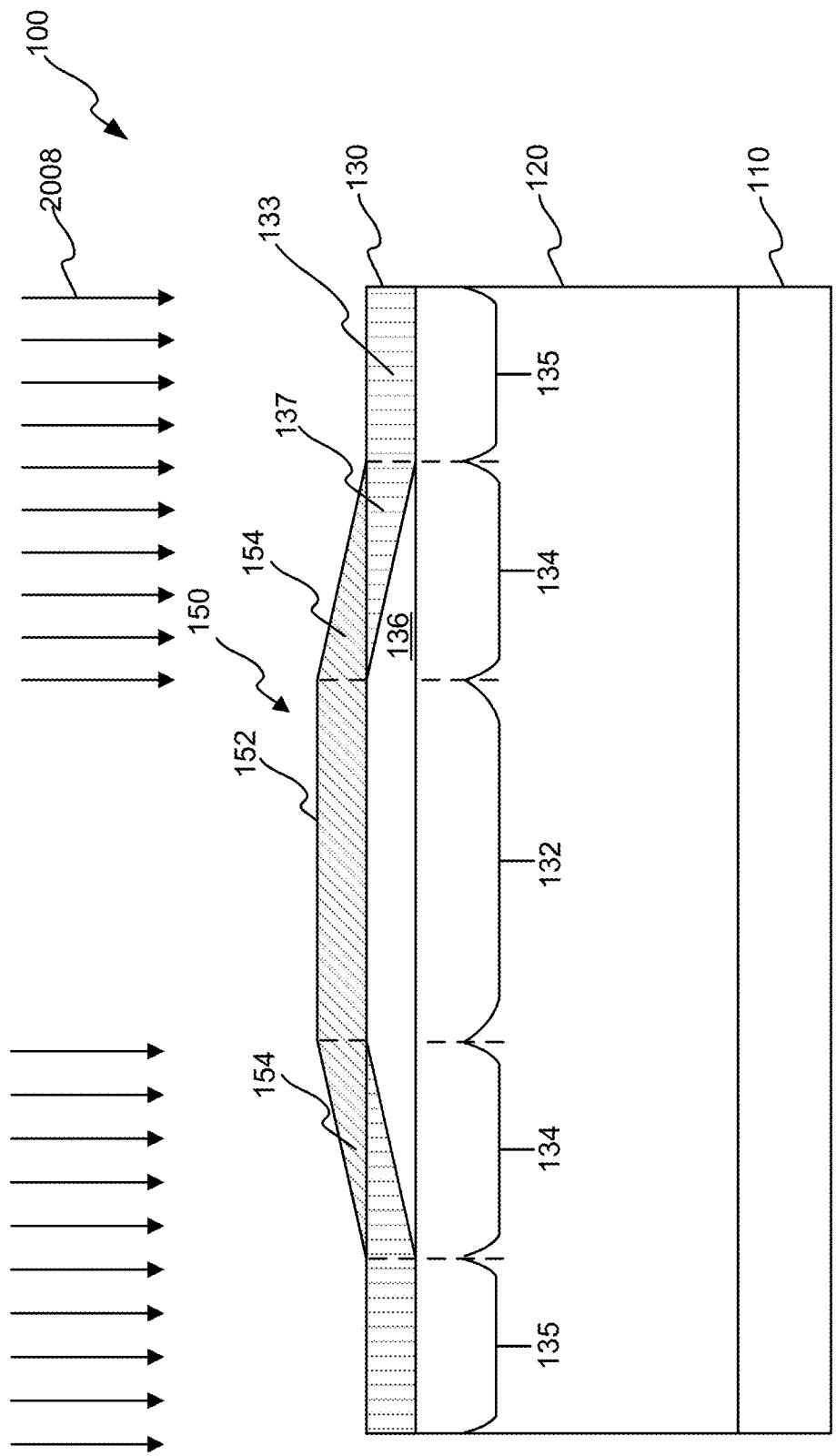

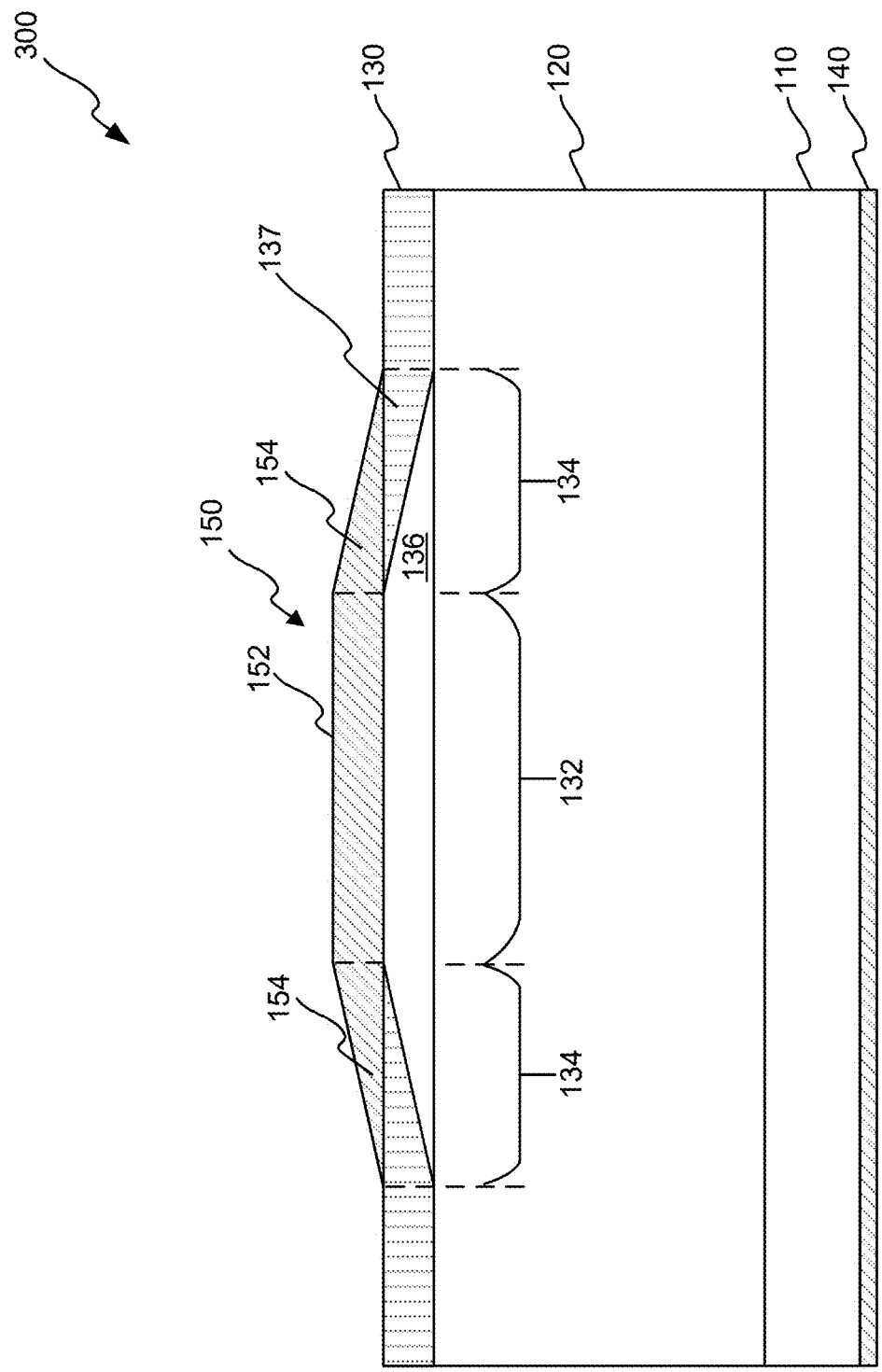

METHOD AND SYSTEM OF JUNCTION TERMINATION EXTENSION IN HIGH VOLTAGE SEMICONDUCTOR DEVICES

CROSS-REFERENCES TO RELATED APPLICATIONS

This application claims the benefit and priority to U.S. Provisional Patent Application No. 63/049,562, filed on Jul. 8, 2020, the disclosure of which is hereby incorporated by reference in its entirety for all purposes.

BACKGROUND OF THE INVENTION

Power electronics are widely used in a variety of applications. Power semiconductor devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage-power transmission system. Vertical power devices, in which the primary current flows from the top surface vertically down through the substrate, are often used in applications that require high voltage and/or current levels. Despite the progress made in power electronics, there is a need in the art for improved electronics systems and methods of operating the same.

SUMMARY OF THE INVENTION

The present invention relates generally to electronic devices. More specifically, the present invention relates to forming junction termination extension (JTE) structures using implantation processes in III-nitride semiconductor materials. Merely by way of example, the invention has been applied to methods and systems for providing junction termination for semiconductor devices using ion implantation into gallium nitride (GaN) based epitaxial layers to modulate the conductivity of the epitaxial layers as a function of position. Embodiments of the present invention provide JTE structures operable to electrically relax corner electrical fields. The methods and techniques can be applied to a variety of power semiconductor devices, such as Schottky diodes, PN diodes, vertical junction field-effect transistors (JFETs), thyristors, bipolar junction transistors (BJTs), and other devices.

In one aspect of the present invention, a method for manufacturing a semiconductor device includes: providing a semiconductor substrate comprising a first side and second side, wherein the semiconductor substrate is characterized by a first conductivity type; epitaxially growing a first semiconductor layer coupled to the first side of the semiconductor substrate, wherein the first semiconductor layer is characterized by the first conductivity type; epitaxially growing a second semiconductor layer coupled to the first semiconductor layer, wherein the second semiconductor layer is characterized by a second conductivity type opposite the first conductivity type, and wherein the second semiconductor layer comprises a contact region and a terminal region surrounding the contact region; forming a mask layer on the second semiconductor layer, wherein the mask layer is patterned with a planar region aligned with the contact region and a tapered region aligned with the terminal region of the second semiconductor layer; implanting ions into the terminal region of the second semiconductor layer using the mask layer to form a tapered junction termination element in the terminal region of the second semiconductor layer; removing the mask layer; and forming a contact structure in the contact region of the second semiconductor layer.

In one aspect of the present invention, a semiconductor device includes: a semiconductor substrate comprising a first side and second side, wherein the semiconductor substrate is characterized by a first conductivity type; a first epitaxial semiconductor layer coupled to the first side of the semiconductor substrate, wherein the first epitaxial semiconductor layer is characterized by the first conductivity type; a second epitaxial semiconductor layer coupled to the first semiconductor layer, wherein the second semiconductor layer is characterized by a second conductivity type opposite the first conductivity type, and wherein the second semiconductor layer comprises a contact region and a terminal region surrounding the contact region, wherein the terminal region of the second semiconductor layer comprises a tapered junction termination element; and a contact structure formed in the contact region of the second semiconductor layer.

In some embodiments, the contact structure includes a third epitaxial semiconductor layer coupled to the contact region of the second epitaxial semiconductor layer, wherein the third epitaxial semiconductor layer is characterized by the second conductivity type, and a metallic structure electrically coupled to the third epitaxial semiconductor layer. The third epitaxial semiconductor layer can partially overlap the tapered junction termination element. A dopant concentration of the third epitaxial semiconductor layer can be greater than a dopant concentration of the second epitaxial semiconductor layer. The contact region of the second epitaxial semiconductor layer can include a recess, wherein the contact structure comprises a metallic structure formed in the recess, and wherein the metallic structure is electrically coupled to the second epitaxial semiconductor layer. The semiconductor substrate can be characterized by a first n-type dopant concentration and the second epitaxial semiconductor layer can be characterized by a second n-type dopant concentration less than the first n-type dopant concentration.

In another aspect of the present invention, a method for manufacturing a semiconductor device includes: providing a semiconductor substrate comprising a first side and second side, wherein the semiconductor substrate is characterized by a first conductivity type; epitaxially growing a first semiconductor layer coupled to the first side of the semiconductor substrate, wherein the first semiconductor layer is characterized by the first conductivity type; epitaxially growing a second semiconductor layer coupled to the first semiconductor layer, wherein the second semiconductor layer is characterized by a second conductivity type opposite the first conductivity type, and wherein the second semiconductor layer comprises a contact region and a terminal region surrounding the contact region; forming a dielectric layer coupled to the second semiconductor layer, wherein the dielectric layer comprises a dielectric terminal region aligned with the terminal region of the second semiconductor layer; forming a mask layer on the dielectric layer, wherein the mask layer is patterned with a tapered region aligned with the dielectric terminal region of the dielectric layer; etching the dielectric layer using the mask layer as a mask to form a tapered profile at the dielectric terminal region of the dielectric layer; removing the mask layer; implanting ions into the terminal region of the second semiconductor layer using the dielectric layer to form a tapered junction termination element in the terminal region of the second semiconductor layer; removing the dielectric layer; and forming a contact structure in the contact region of the second semiconductor layer.

In another aspect of the present invention, a method for manufacturing a semiconductor device includes: providing a III-nitride substrate comprising a first side and second side, wherein the III-nitride substrate is characterized by a first conductivity type; epitaxially growing a first III-nitride layer coupled to the first side of the III-nitride substrate, wherein the first III-nitride layer is characterized by the first conductivity type; epitaxially growing a second III-nitride layer coupled to the first III-nitride layer, wherein the second III-nitride layer is characterized by a second conductivity type opposite the first conductivity type, and wherein the second III-nitride layer comprises a contact region and a terminal region surrounding the contact region; forming a metal layer coupled to an upper surface of the second III-nitride layer; forming a mask layer on the second III-nitride layer; patterning the mask layer using a greyscale mask to form a tapered region in the mask layer that is aligned with the terminal region of the second III-nitride layer; implanting ions into the terminal region of the second III-nitride layer using the mask layer to form a tapered junction termination element in the terminal region of the second III-nitride layer; removing the mask layer; and forming a metal layer coupled to the second side of the III-nitride substrate.

In another aspect of the present invention, a method for manufacturing a semiconductor device includes: providing a III-nitride substrate comprising a first side and second side, wherein the III-nitride substrate is characterized by a first conductivity type; epitaxially growing a first III-nitride layer coupled to the first side of the III-nitride substrate, wherein the first III-nitride layer is characterized by the first conductivity type; epitaxially growing a second III-nitride layer coupled to the first III-nitride layer, wherein the second III-nitride layer is characterized by the first conductivity type; forming a hardmask layer on the second III-nitride layer, wherein the hardmask layer is patterned with a set of openings exposing a portion of a upper surface of the second III-nitride layer; etching the second III-nitride layer and a portion of the first III-nitride layer using the hardmask layer as a mask to form a plurality of first trenches; selectively regrowing a third III-nitride layer in the plurality of first trenches, wherein the third III-nitride layer is characterized by a second conductivity type opposite the first conductivity type; removing the hardmask layer; forming a source metal layer coupled to a top surface of the second III-nitride layer; forming a gate metal layer coupled to an upper surface of the third III-nitride layer; forming a mask layer on the third III-nitride layer; patterning the mask layer using a greyscale mask to form a tapered region in the mask layer that is aligned with a terminal region of the third III-nitride layer; implanting ions into the terminal region of the third III-nitride layer using the mask layer to form a tapered junction termination element in the terminal region of the third III-nitride layer; removing the mask layer; and forming a metal layer coupled to the second side of the III-nitride substrate.

In another aspect of the present invention, a method for manufacturing a semiconductor device includes: providing a III-nitride substrate comprising a first side and second side, wherein the III-nitride substrate is characterized by a first conductivity type; epitaxially growing a first III-nitride layer coupled to the first side of the III-nitride substrate, wherein the first III-nitride layer is characterized by the first conductivity type; epitaxially growing a second III-nitride layer coupled to the first III-nitride layer, wherein the second III-nitride layer is characterized by the first conductivity type; forming a hardmask layer on the second III-nitride layer, wherein the hardmask layer is patterned with a set of openings exposing a portion of a upper surface of the second III-nitride layer; etching the second III-nitride layer and a portion of the first III-nitride layer using the hardmask layer as a mask to form a plurality of first trenches; forming a III-nitride gate layer in the plurality of first trenches by implantation of dopants, wherein the III-nitride gate layer is characterized by a second conductivity type opposite the first conductivity type; removing the hardmask layer; forming a source metal layer coupled to a top surface of the second III-nitride layer; forming a gate metal layer coupled to the III-nitride gate layer; forming a mask layer on the III-nitride gate layer; patterning the mask layer using a greyscale mask to form a tapered region in the mask layer that is aligned with a terminal region of the III-nitride gate layer; implanting ions into the terminal region of the III-nitride gate layer using the mask layer to form a tapered junction termination element in the terminal region of the III-nitride gate layer; removing the mask layer; and forming a metal layer coupled to the second side of the III-nitride substrate.

In another aspect of the present invention, a method for manufacturing a semiconductor device includes: providing a III-nitride substrate comprising a first side and second side, wherein the III-nitride substrate is characterized by a first conductivity type; epitaxially growing a first III-nitride layer coupled to the first side of the III-nitride substrate, wherein the first III-nitride layer is characterized by the first conductivity type; epitaxially growing a second III-nitride layer coupled to the first III-nitride layer, wherein the second III-nitride layer is characterized by the first conductivity type; forming a hardmask layer on the second III-nitride layer, wherein the hardmask layer is patterned with a set of openings exposing a portion of a upper surface of the second III-nitride layer; etching the second III-nitride layer and a portion of the first III-nitride layer using the hardmask layer as a mask to form a plurality of first trenches; applying a layer of diffusion dopant material to the plurality of first trenches; performing a thermal treatment to diffuse dopants of the layer of diffusion dopant material into the second III-nitride layer to form a doped III-nitride gate layer; removing the layer of diffusion dopant material and the hardmask layer; forming a source metal layer coupled to a top surface of the second III-nitride layer; forming a gate metal layer coupled to the doped III-nitride gate layer; forming a mask layer on the doped III-nitride gate layer; patterning the mask layer using a greyscale mask to form a tapered region in the mask layer that is aligned with a terminal region of the doped III-nitride gate layer; implanting ions into the terminal region of the doped III-nitride gate layer using the mask layer to form a tapered junction termination element in the terminal region of the doped III-nitride gate layer; removing the mask layer; and forming a metal layer coupled to the second side of the III-nitride substrate.

Numerous benefits are achieved by way of the present invention over conventional techniques. For example, embodiments of the present invention provide a method for manufacturing semiconductor devices with a tapered junction termination element, which can alleviate the edge effect of the electrical field at the termination of a PN junction in the semiconductor device. Therefore, a breakdown voltage of the semiconductor device can be improved. By forming the tapered junction termination element with a tapered mask layer, embodiments of the present invention can provide an effective JTE structure using one masking process in the manufacturing flow of the semiconductor devices, which reduces the manufacturing cost. Embodiments of the present invention form the tapered junction termination element using an ion implantation process. By controlling relevant parameters of the ion implantation process, embodiments of the present invention may adapt to different thicknesses or dopant concentrations of the semiconductor layer in which the tapered junction termination element is formed. Furthermore, embodiments of the present invention can be applied independent of the doping of the semiconductor layers. These and other embodiments of the invention along with many of its advantages and features are described in more detail in conjunction with the text below and attached figures.

The ion implantation processes used herein implants ionic species to increase the resistivity (i.e., decrease the conductivity) of predetermined portions of the semiconductor layer to provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, or decreasing the density of ionized acceptors (donors for n-type material). Some or all of these mechanisms may provide for increased resistivity. Throughout the specification, reference is made to decreased conductivity or increased resistivity, which can also be referred to as a decrease in active charge, a decrease in active dopant species, or the like. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. The present invention is not limited by the physical mechanism resulting in the spatial conductivity modulation.

BRIEF DESCRIPTION OF THE DRAWINGS

FIGS. 2A-2I illustrate the intermediate stages of a method for manufacturing a semiconductor device according to some embodiments of the present invention.

FIGS. 4A-4G illustrate the intermediate stages for manufacturing a semiconductor device according to another embodiment of the present invention.

DETAILED DESCRIPTION OF THE INVENTION

Embodiments of the present invention relate to methods and systems to improve the performance of a junction termination structure in semiconductor devices. Embodiments of the present invention are applicable to a variety of semiconductor manufacturing operations including in the manufacturing of III-nitride semiconductor devices. Merely by way of example, embodiments are applied in the fabrication of Schottky diodes, PN diodes, vertical JFETs, thyristors, BJTs, and other devices, but embodiments of the present invention have applicability to a variety of device structures.

Figure 1:
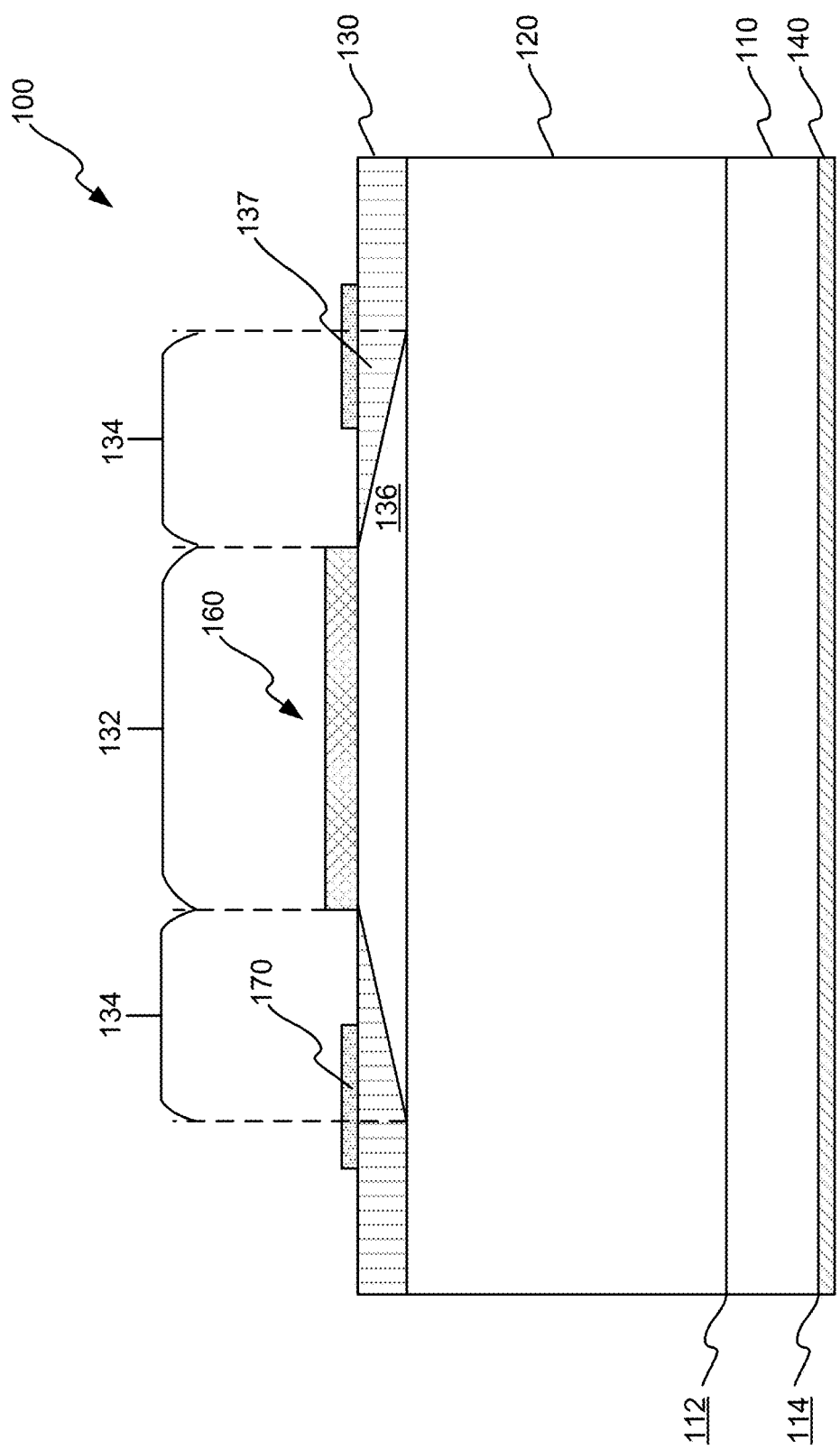
FIG. 1 illustrates a partial cross-sectional view of a semiconductor device according to an embodiment of the present invention.

FIG. 1 illustrates a partial cross-sectional view of a semiconductor device 100 according to an embodiment of the present invention. As shown in FIG. 1, semiconductor device 100 may include a semiconductor substrate 110 having a first side 112 and second side 114, a epitaxially grown first semiconductor layer 120 coupled to first side 112 of semiconductor substrate 110, and a second semiconductor layer 130 coupled to first semiconductor layer 120. Second semiconductor layer 130 includes a contact region 132 and a terminal region 134 surrounding contact region 132. Terminal region 134 of second semiconductor layer 130 includes a tapered junction termination element 136 and an implanted zone 137 characterized by a conductivity less than a conductivity of second semiconductor layer 130. Semiconductor device 100 further includes a contact structure 160 formed in contact region 132 of second semiconductor layer 130. In some embodiments, semiconductor device 100 may include a metallic layer 140 coupled to second side 114 of semiconductor substrate 110. In some embodiments, semiconductor device 100 may further include a metallic field plate 170 coupled to terminal region 134 of second semiconductor layer 130.

In some embodiments, semiconductor substrate 110 is formed from n-type GaN material. For example, semiconductor substrate 110 can have an n+ conductivity type, having a dopant concentration of about $1\times10^{17}$ $cm^{-3}$ to $1\times10^{19}$ $cm^{-3}$. In some embodiment, first semiconductor layer 120 is epitaxially grown on first side 112 of semiconductor substrate 110. First semiconductor layer 120 may be formed from n-type GaN material. In some embodiments, first semiconductor layer 120 can serve as a drift region for a Schottky diode or a vertical JFET, and therefore, first semiconductor layer 120 can have n− conductivity type, with a dopant concentration of about $1\times10^{16}$ $cm^{-3}$ to $1\times10^{17}$ $cm^{-3}$. In some embodiments, first semiconductor layer 120 can have a thickness of about 0.5 μm to 100 μm. In some embodiments, second semiconductor layer 130 may be formed of a p-type GaN material. For example, second semiconductor layer 130 may include p+ conductivity type, having a dopant concentration of about $1\times10^{18}$ $cm^{-3}$ to about $1\times10^{20}$ $cm^{-3}$. In some embodiments, second semiconductor layer 130 is epitaxially grown on first semiconductor layer 120. In some embodiments, second semiconductor layer 130 is formed using diffusion from a gas-phase or solid-state diffusion source. In some embodiments, second semiconductor layer 130 is formed using ion implantation of acceptor dopants, followed by annealing to remove implant damage and activate the implanted dopants. In some embodiments, second semiconductor layer 130 may have a thickness of about 0.01 μm to 5 μm.

As shown in FIG. 1, tapered junction termination element 136 has a linear profile in terminal region 134. Thus, a thickness of tapered junction termination element 136 measured from a lower surface to an upper surface of second semiconductor layer 130 decreases linearly with a lateral distance from contact region 132. In other embodiments, the tapering is non-linear as appropriate to the particular applications. In some embodiments, tapered junction termination element 136 may be formed by an ion implantation process, which will be described in detail below. In some embodiments, the ion species used in the implantation process are different from the dopant species used for second semiconductor layer 130. In some embodiments, due to lower conductivity of implanted zone 137, tapered junction termination element 136 alleviates the edge effect formed at the PN junction between first semiconductor layer 120 and second semiconductor layer 130. In some other embodiments, implanted zone 137 may be formed as a non-conducting zone according to the particular application.

Figure 2A:
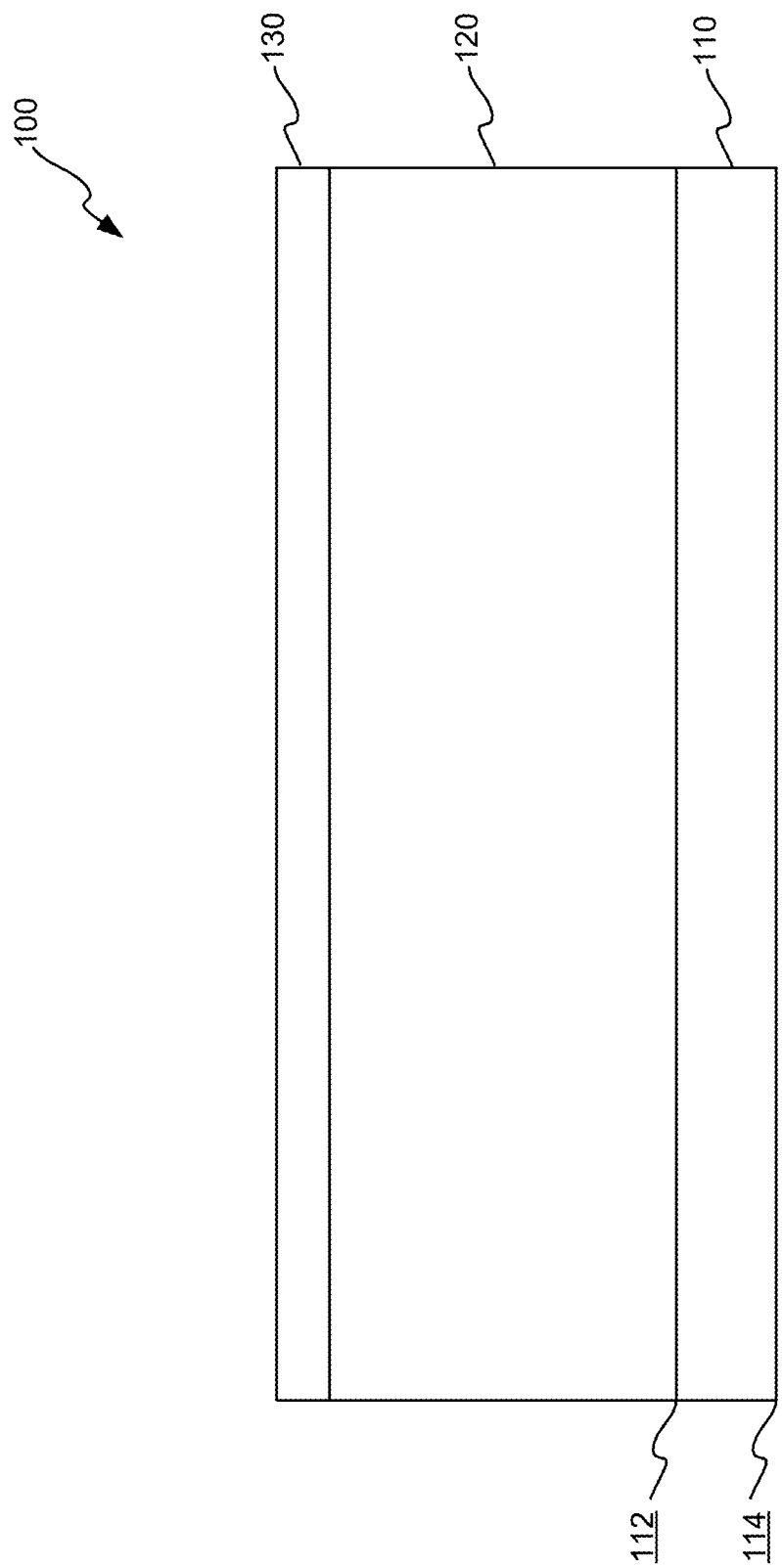

FIGS. 2A-2G illustrate the intermediate stages of a method for manufacturing a semiconductor device according to some embodiments of the present invention. FIG. 2A illustrates a partial cross-sectional view of semiconductor device 100 having semiconductor substrate 110 (e.g., an n+ doped semiconductor substrate) with first side 112 and second side 114, first semiconductor layer 120 (e.g., an n− doped semiconductor layer) epitaxially grown on first side 112 of semiconductor substrate 110, and second semiconductor layer 130 (e.g., a p+ doped semiconductor layer) on first semiconductor layer 120.

Figure 2B:
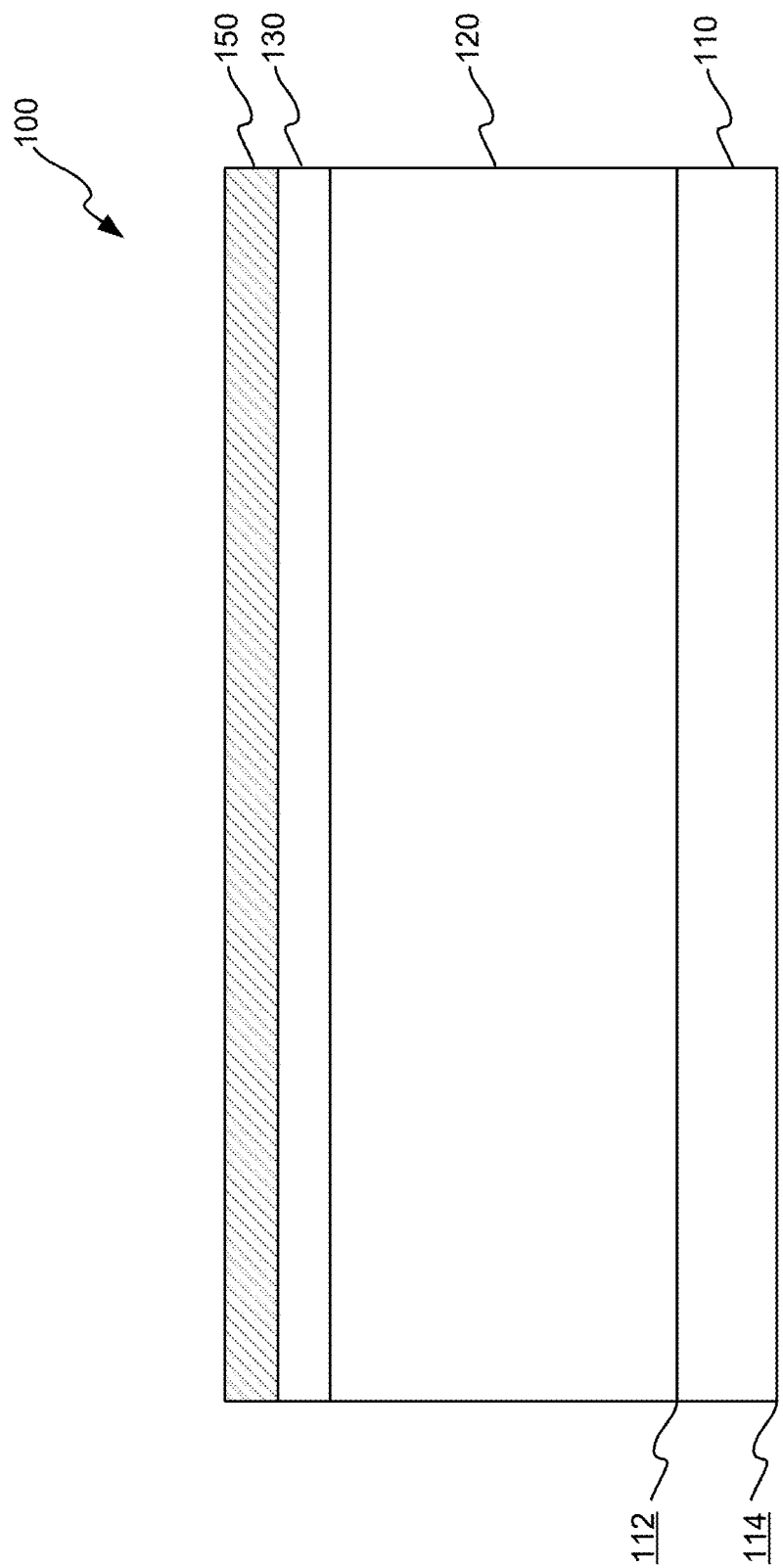
Figure 2C:
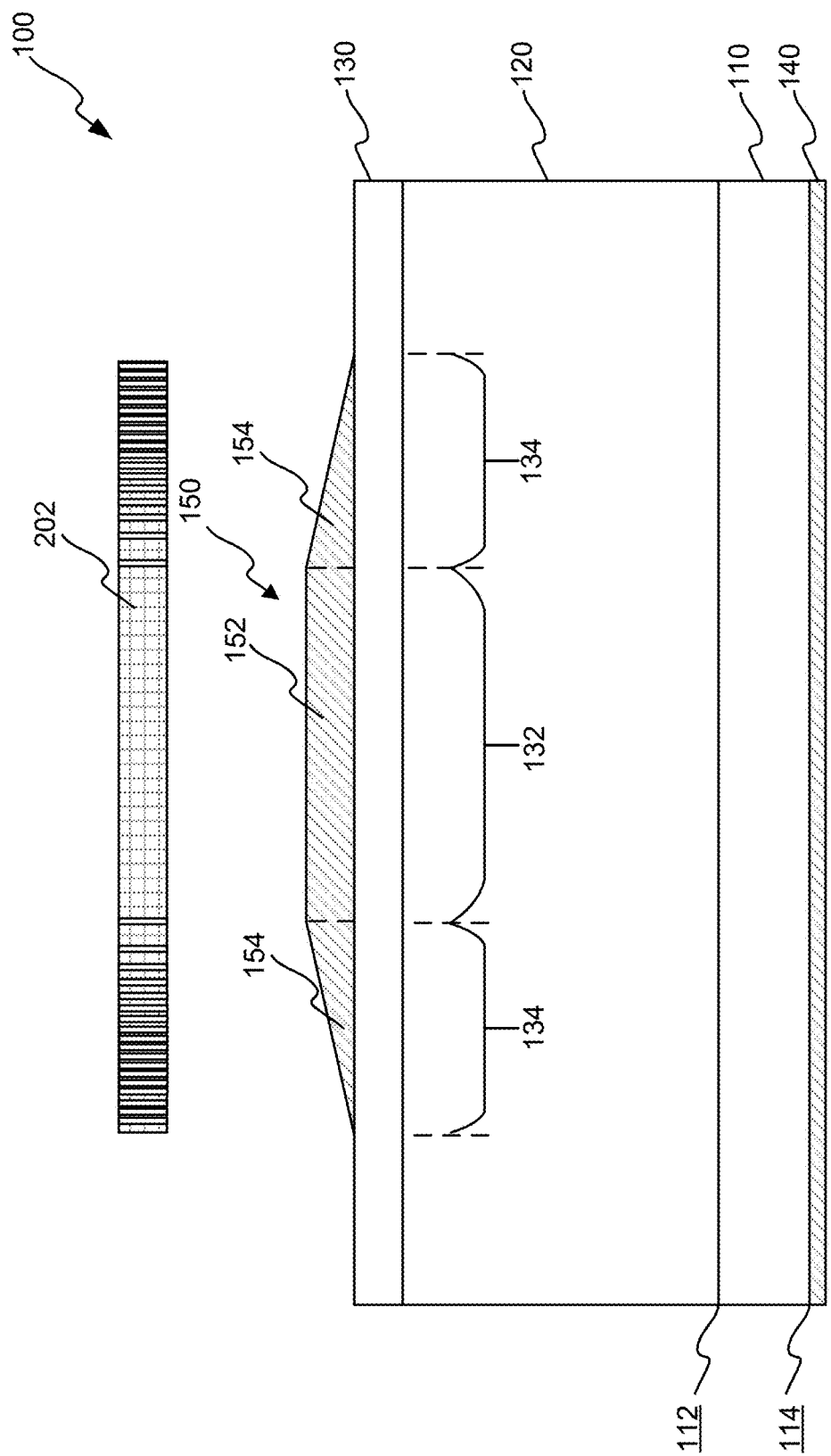

As illustrated in FIG. 2B, a mask layer 150 is formed on second semiconductor layer 130. Referring to FIG. 2C, a photolithography process is performed using a photomask 202 as a mask to pattern mask layer 150 to form a tapered region 154 in mask layer 150. Some examples of photomask 202 and examples of processes of forming tapered region 154 will be described below. As described above with reference to FIG. 1, second semiconductor layer 130 include contact region 132, and terminal region 134 adjoining contact region 132. For convenience of description, mask layer 150 may include a planar region 152 aligned with contact region 132 of second semiconductor layer 130, and a tapered region 154 aligned with terminal region 134 of second semiconductor layer 130. It should be noted that tapered region 154 is illustrated as symmetric in FIG. 2B for the purpose of clarity and simplicity. For purposes of clarity and simplicity, the subsequent figures adopt the symmetric arrangement, however, this is not required by the present invention. In some other embodiments, tapered regions 154 on both sides of planar region 152 may not be symmetric, and may have different tapering and lateral lengths. In some other embodiments, mask layer 150 may have only one tapered region 154 at one side of planar region 152. In some embodiments, mask layer 150 may include a photoresist that can be patterned using a photolithography process to form tapered region 154.

Figure 2D:
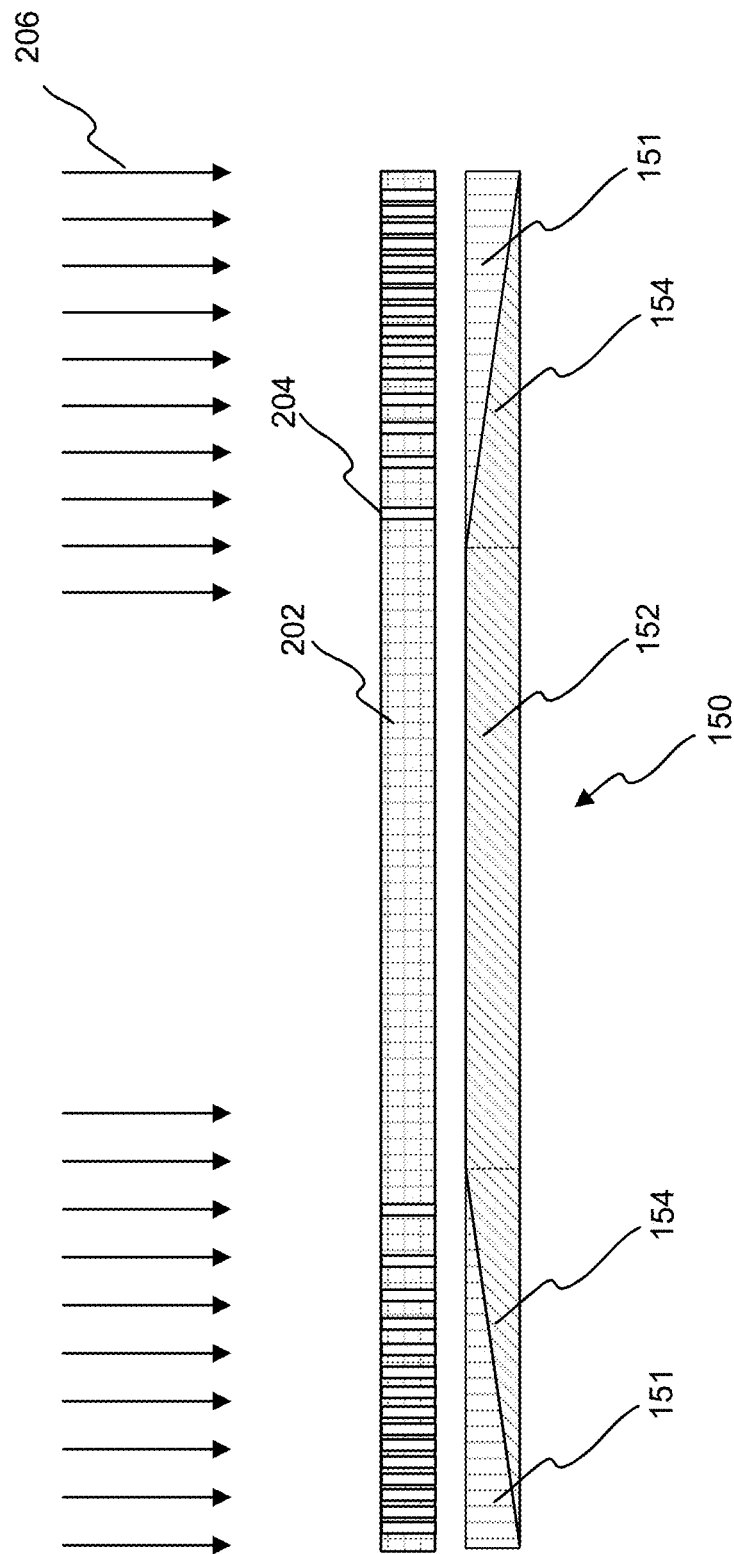

FIG. 2D illustrates a method for forming mask layer 150 according to an embodiment of the present invention. As shown in FIG. 2D, mask layer 150 may include a positive photoresist, and a photomask 202 used in the photolithography process may be a grayscale photomask with openings 204 increasing in duty cycle as a function of lateral distance from planar region 152. In other words, the distance between adjacent openings 204 decreases with the lateral distance from planar region 152, thereby producing a grayscale photomask with greater transparency as a function of lateral distance from planar region 152. In the photolithography process, light 206 (e.g., 365 nm wavelength ultraviolet light) irradiates mask layer 150 through openings 204 in photomask 202. Openings 204 are smaller than the resolution of the exposure system, such that the openings are not imaged in the photoresist, but the average intensity of light transmitted through the openings does expose the photoresist. The resulting variation in exposure causes a corresponding variation in the amount of resist developed and removed after exposure, with high exposure doses (larger openings or more densely spaced openings) resulting in more resist removal. The amount of removal can be calibrated against the opening size for a given incoming light 206 intensity, allowing the desired profile to be achieved. An upper tapered portion 151 of mask layer 150 is developed and then removed to form the tapered region 154 of mask layer 150. The length and tapering of tapered region 154 may be adjusted by controlling the distribution of openings 204 in the photomask 202. The method for forming tapered region 154 of mask layer 150 is not limited to the above-mentioned example. One of ordinary skill in the art may contemplate other methods for forming tapered region 154 of mask layer 150, all of which fall within the scope of protection of the present disclosure.

Figure 2E:
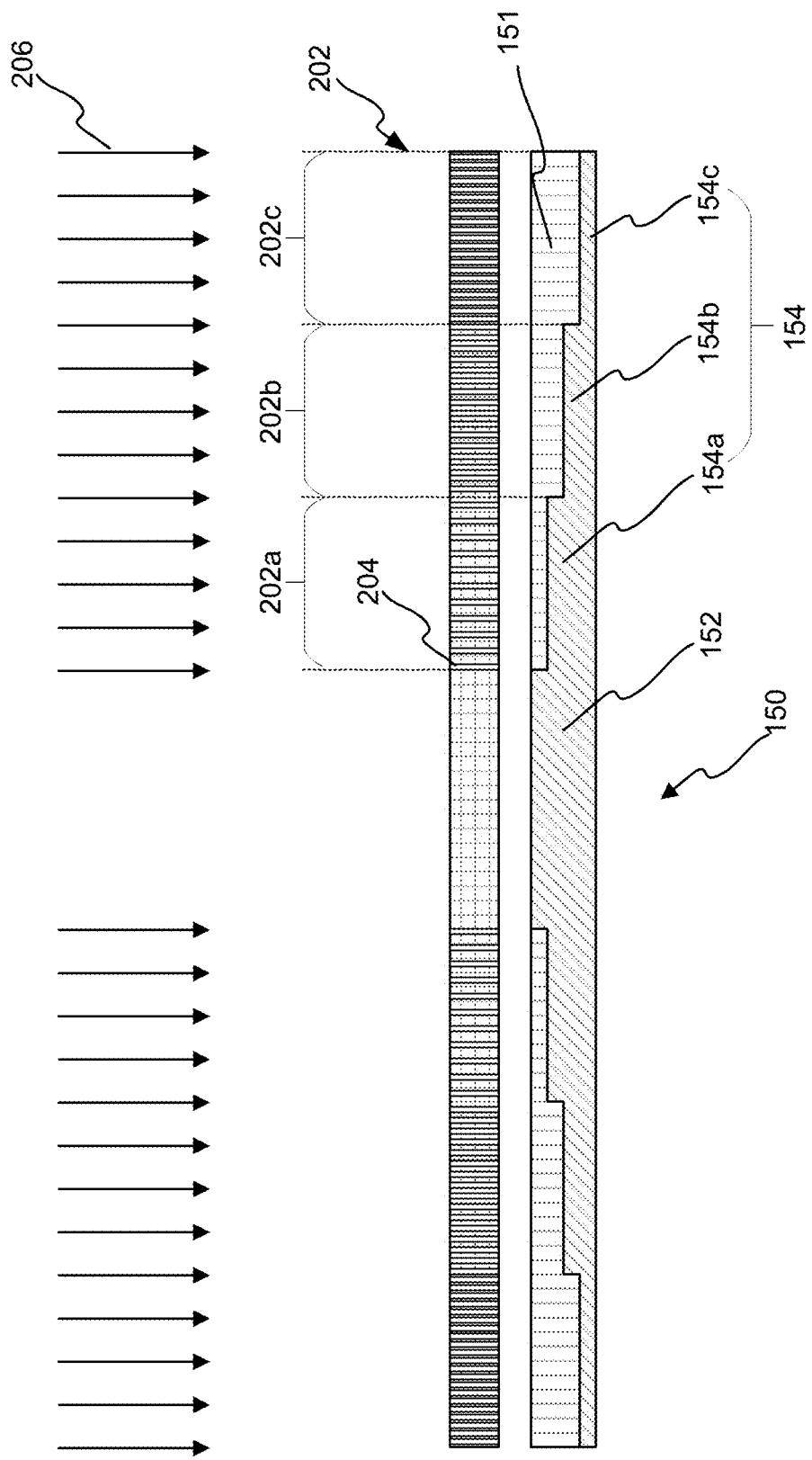

FIG. 2E illustrates another method of forming mask layer 150 according to another embodiment of the present invention. As shown in FIG. 2E, tapered region 154 may be stepwise instead of linear, and include first tapered region 154a, second tapered region 154b having a thickness less than that of first tapered region 154a, and third tapered region 154c having a thickness less than that of second tapered region 154b. To form such a tapered region 154, the density of openings 204 is segmented, that is, the density of openings 204 in first region 202a of photomask 202 aligned with first tapered region 154a is small, the density of openings 204 in second region 202b of photomask 202 aligned with second tapered region 154b is larger that of first region 202a, and the density of openings 204 in third region 202c of photomask 202 aligned with third tapered region 154c is larger than that of second region 202b. In other embodiments, the diameter of openings 204 in respective regions 202a, 202b, and 202c may be different, such that first region 202a, second region 202b, and third region 202c can provide different exposure doses to mask layer 150, where first region 202a provides the lowest exposure dose, second region 202b provides a higher exposure dose than that of first region 202a, and third region 202c provides a higher exposure dose than that of second region 202b. In the photolithography process, light 206 (e.g., 365 nm wavelength ultraviolet light) irradiates mask layer 150 through openings 204 in photomask 202. The amount of photoresist removal can be calibrated against the opening size for a given incoming light 206 intensity, allowing the desired profile to be achieved. An upper tapered portion 151 of mask layer 150 is developed and then removed to form the tapered region 154 of mask layer 150.

As shown in FIG. 2E, first tapered region 154a, second tapered region 154b, and third tapered region 154c may have same lateral dimensions. However, this is not required by the present invention. In some other embodiments, first tapered region 154a, second tapered region 154b, and third tapered region 154c may have different lateral dimensions as appropriate to particular applications. Such different lateral dimensions may be implemented by controlling the segmentation of first regions 202a, second region 202b, and third region 202c.

It should be noted the mask layer 150 with tapered region 154 illustrated in FIGS. 2D and 2E is provided to illustrated examples, either of which may be applied to the embodiments of the present invention as illustrated below. For purposes of clarification, the below embodiments adopt mask layer 150 illustrated in FIG. 2D.

FIG. 2F is a partial cross-sectional view illustrating ion implantation into portions of second semiconductor layer 130 to form tapered junction termination element 136. An ion beam 2008 irradiates second semiconductor layer 130 through mask layer 150. Due to tapered region 154 of mask layer 150, implanted ions stop in second semiconductor layer 130 to form implanted zone 137. The implanted ion species may be argon, nitrogen, helium, hydrogen, or other appropriate species that reduce the electrical conductivity in second semiconductor layer 130. In some embodiments, the implantation energy may be about 20 keV to 1500 keV depending on the desired profile of tapered junction termination element 136. In one embodiment, relatively higher implantation energy (e.g., 200 keV-1500 keV) may be used to perform a single implantation process. In another embodiment, relatively lower implantation energy (e.g., 50 keV-150 keV) may be used during a process that includes multiple implantations and implantation energies. In one embodiment, the implantation species include argon, the implant doses of which may be in the range of about $1\times10^{12}$ cm$^{-3}$ to $5\times10^{16}$ cm$^{-2}$. In another embodiment, the implantation species include nitrogen, the implant doses of which may be in the range of about $1\times10^{12}$ cm$^{-3}$ to $1\times10^{16}$ cm$^{-2}$. In yet another embodiment, the implantation species include helium, the implant doses of which may be in the range of about $1\times10^{14}$ cm$^{-3}$ to $1\times10^{16}$ cm$^{-2}$. In some embodiments, the implanted species may be singly ionized. In some embodiments, the implanted species may be doubly ionized. In some embodiments, the implanted species may be triply ionized. The angle of taper of junction termination element 136 may be different from the masking layer taper in region 154, depending on the relative stopping power of the mask layer 150 and second semiconductor layer 130 to the implanted ions.

In some embodiments, ion beam 2008 also irradiates an outer region 135 of second semiconductor layer 130 that surrounds terminal region 134 and which is not covered by mask layer 150. As shown in FIG. 2F, the ion implantation process, therefore, forms a peripheral implanted zone 133 in second semiconductor layer 130 that has the same conductivity as implanted zone 137. In some other embodiments not shown, outer region 135 may be protected by a mask layer from the ion implantation process. In such embodiments, the peripheral implanted zone 133 is not formed.

Figure 2G:
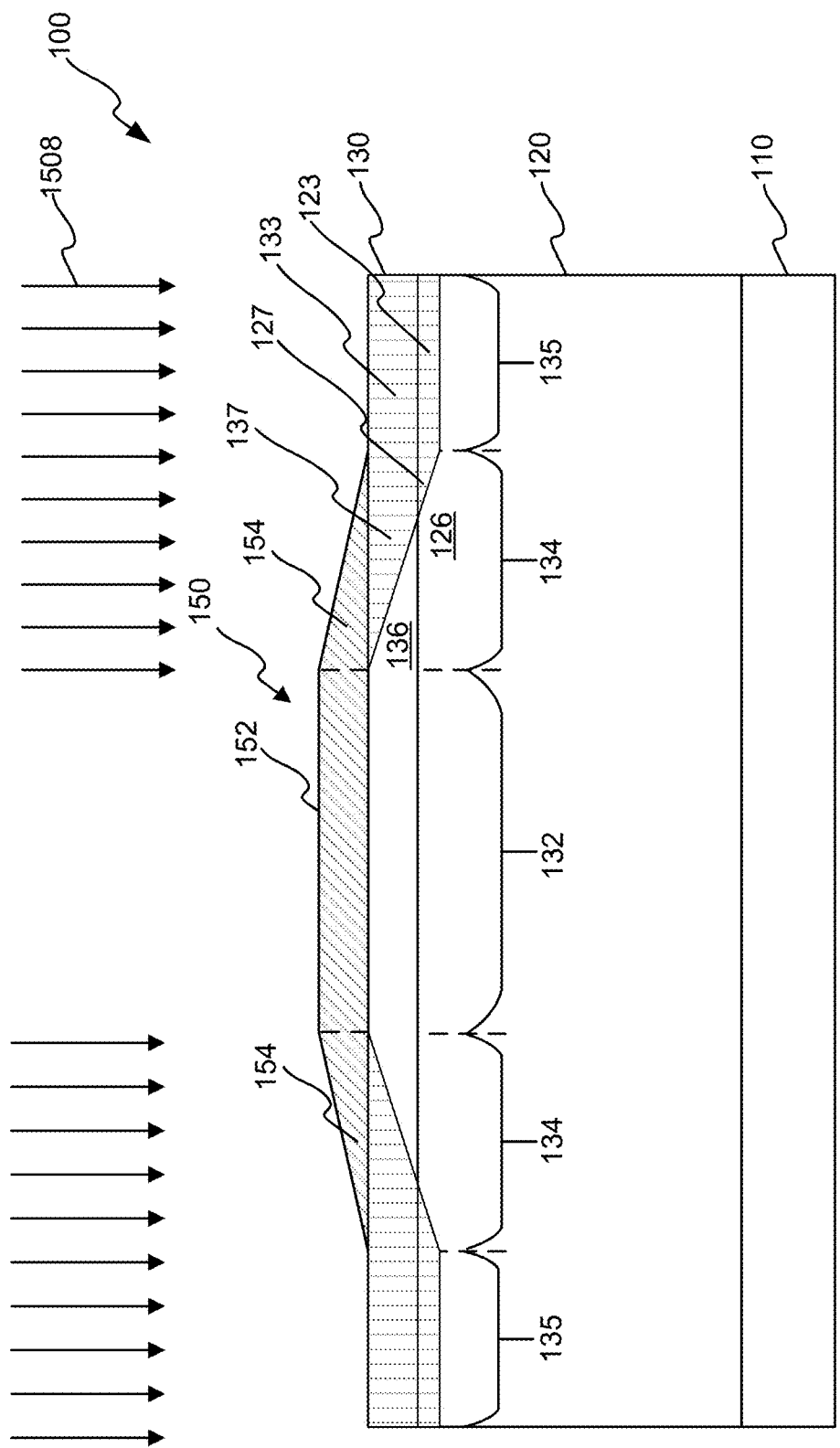

FIG. 2G illustrates the ion implantation process in another embodiment of the present invention. The ion implantation process may implant ions through the thickness of second semiconductor layer 130 and ions may stop in first semiconductor layer 120 to form a tapered implanted zone 127 in an area of first semiconductor layer 120 that is partially aligned with terminal region 134. Thus, a tapered termination element 126 is formed in first semiconductor layer 120. Like peripheral implanted zone 133 in second semiconductor layer 130, a peripheral implanted zone 123 is formed in an area of first semiconductor layer 120 that is aligned with outer region 135 of second semiconductor layer 130. In some other embodiments, if outer region 135 is protected by a mask layer from the ion implantation process, peripheral implanted zone 123 is not formed. By controlling the ion implantation processing, a multi-zone junction termination structure including tapered junction termination element 136 and tapered termination element 126 can be formed using one masking process in the manufacturing flow of the semiconductor device, which can significantly reduce process costs.

For clarity of description, the following process is described based on the embodiment as shown in FIG. 2F. It should be noted that the following processes equally apply to embodiment as shown in FIG. 2G.

Figure 2H:
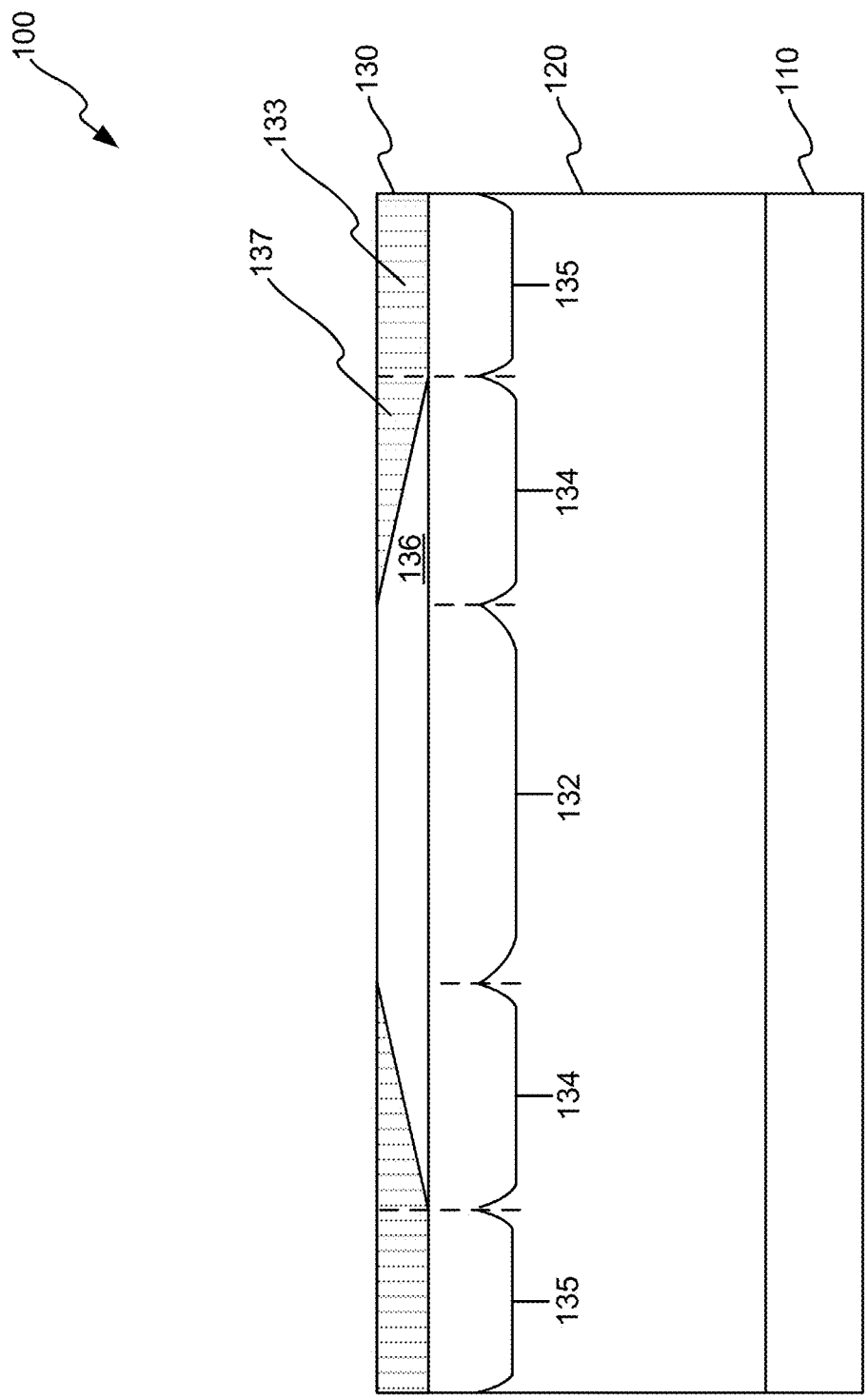

As shown in FIG. 2H, mask layer 150 (shown in FIG. 2C) is removed after the ion implantation process is completed. In some embodiments, mask layer 150 is removed by wet etching or dry etching using one or more processing techniques. For example, mask layer 150 may be removed by ashing in an oxygen plasma, followed by a wet clean treatment such as a sulfuric acid/hydrogen peroxide mixture at 65-120° C.

Figure 2I:
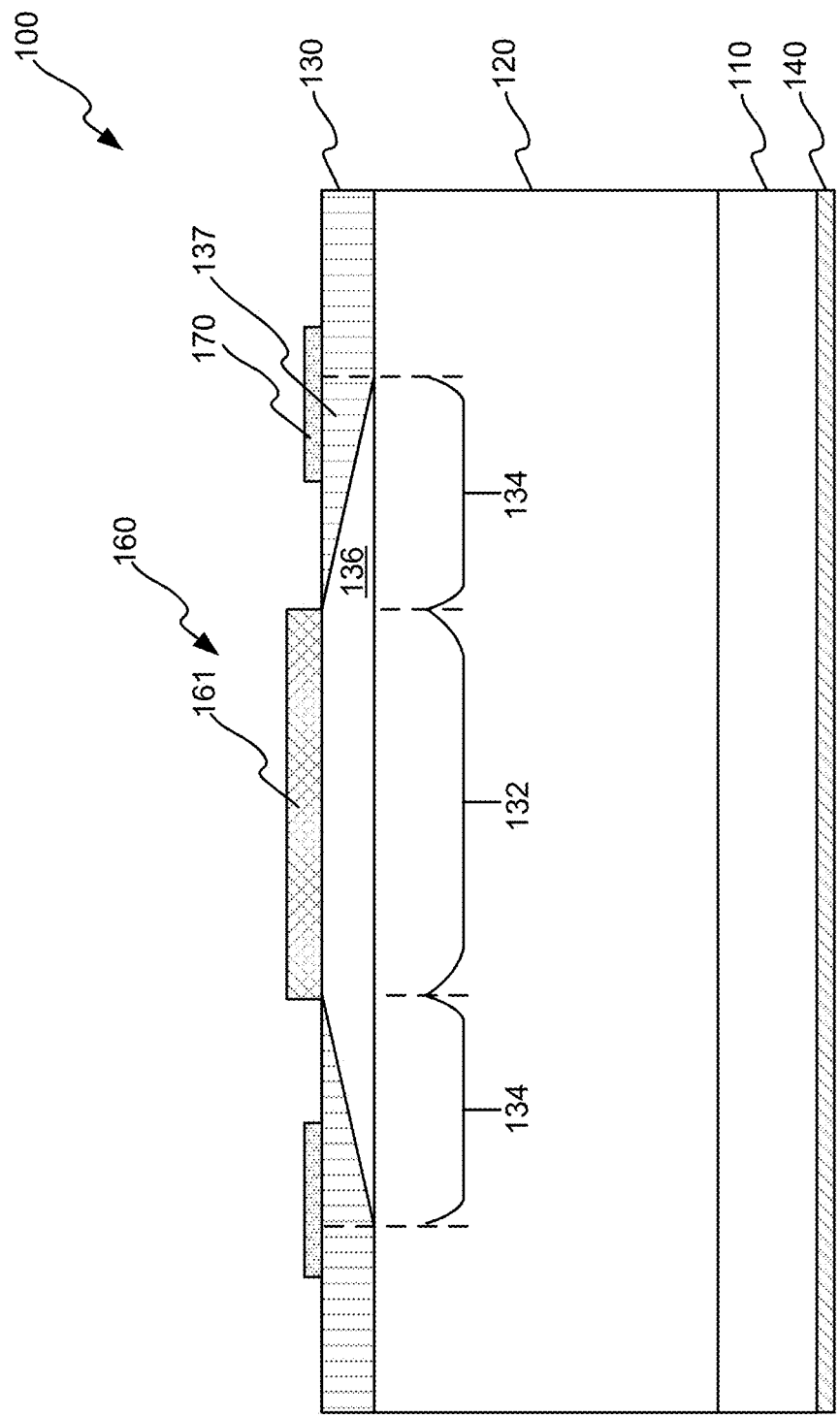

Referring to FIG. 2I, after removal of mask layer 150, a contact structure 160 is formed in contact region 132 of second semiconductor layer 130. In some embodiments, contact structure 160 includes metallic structure 161. For example, metallic structure 161 may include nickel, platinum, palladium, silver, gold, the combination thereof, and the like. Contact structure 160 makes an ohmic contact with second semiconductor layer 130. Tapered junction termination element 136 makes the electrical field extend laterally to alleviate the edge effect of the electrical field. In some embodiments not shown, contact structure 160 may overlap a portion of tapered junction termination element 136 to improve the performance of tapered junction termination element 136 in alleviating the edge effect of the electrical field.

As shown in FIG. 2I, in some embodiments, semiconductor device 100 may further include a metallic field plate 170 formed on tapered junction termination element 136. Specifically, metallic field plate 170 is formed on the upper surface of implanted zone 137. Metallic field plate 170 may include the same metal as metallic structure 161. In some embodiments, metallic field plate 170 may include different metals from metallic structure 161 depending on the particular applications. Metallic field plate 170 may provide additional coupling of the electrical field to further alleviate the edge effect.

As shown in FIG. 2I, a metallic layer 140 is formed on a second side of semiconductor substrate 110. In some embodiments, metallic layer 140 may include one or more layers of ohmic metal that serve as an ohmic contact for the cathode of a Schottky diode. For example, metallic layer 140 may include a titanium-aluminum (Ti/Al) metal.

Figure 3A:
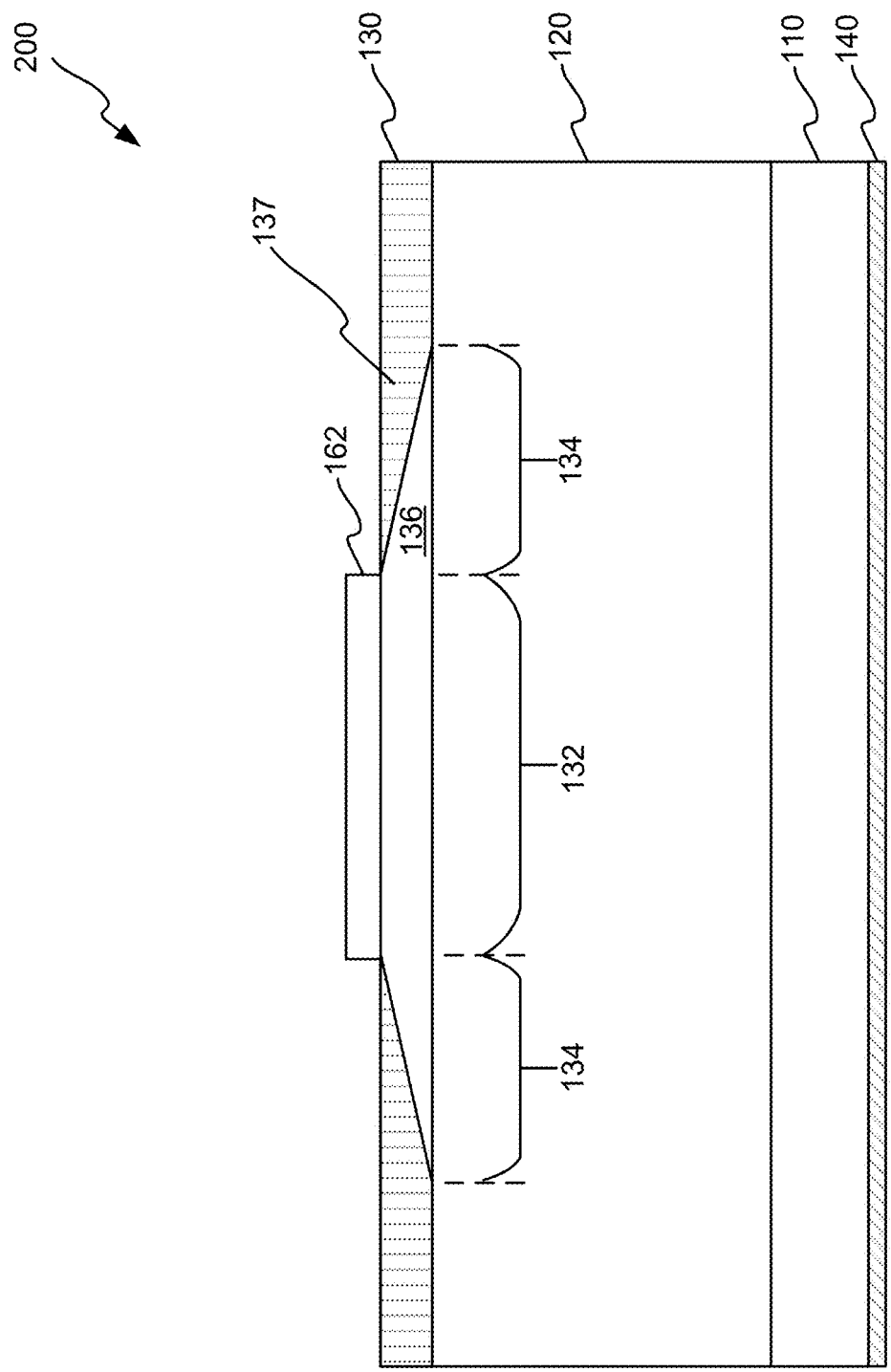
FIGS. 3A-3B illustrate the intermediate stages for manufacturing a semiconductor device according to another embodiment of the present invention.
Figure 3B:
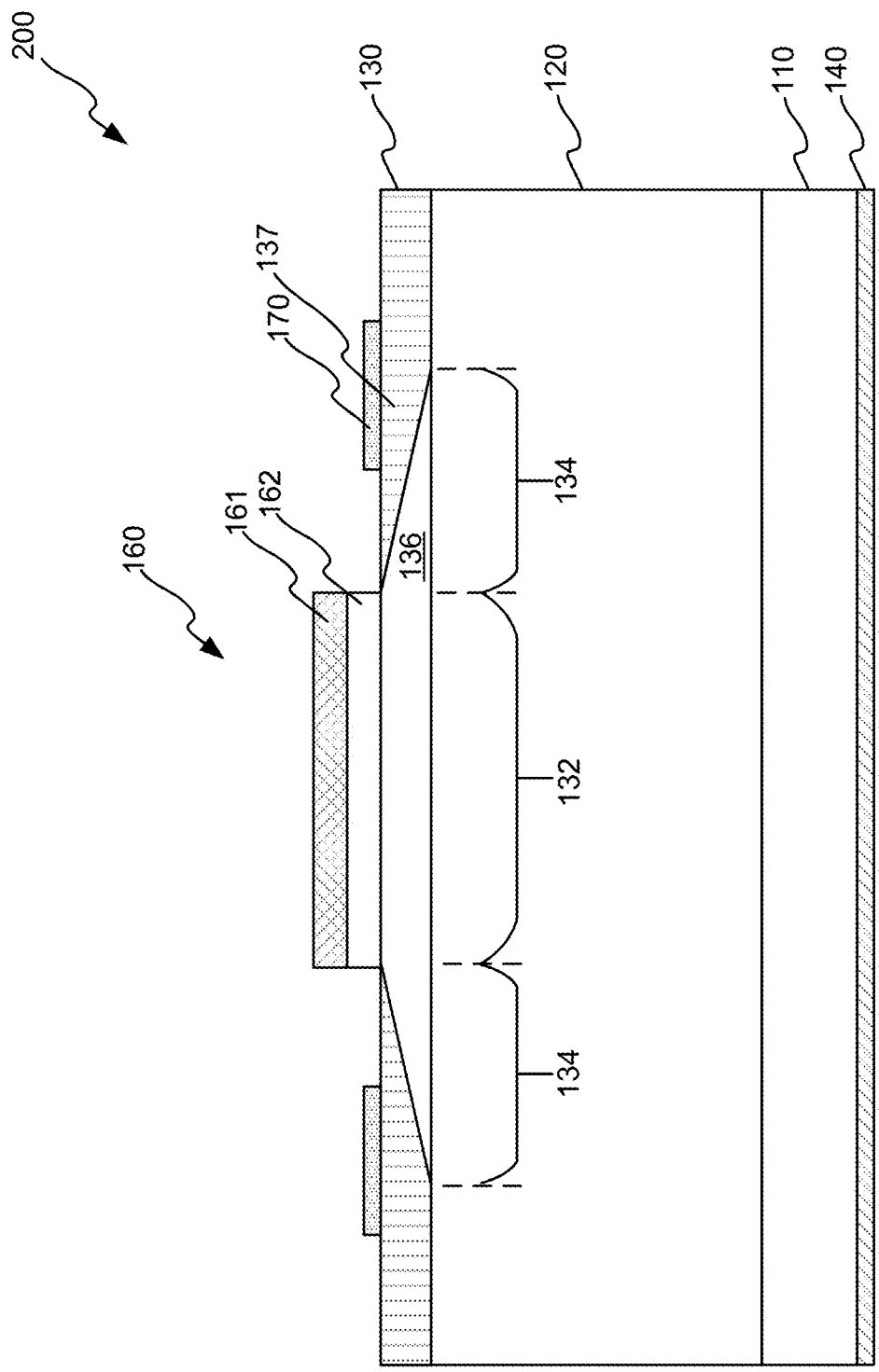

FIGS. 3A-3B illustrate the intermediate stages for manufacturing a semiconductor device according to another embodiment of the present invention. The steps as described above referring to FIGS. 2A-2F equally apply to semiconductor device 200. Therefore, the description referring to FIGS. 2A-2F is omitted for clarity of description.

As shown in FIG. 3A, a third semiconductor layer 162 is formed in contact region 132 of second semiconductor layer 130 after the removal of mask layer 150 (shown in FIG. 2E). In some embodiments, third semiconductor layer 162 is epitaxially grown in contact region 132 of second semiconductor layer 130. Third semiconductor layer 162 may include p+ doped GaN material, having a dopant concentration of about $1 \times 10^{17}$ cm$^{-3}$ to about $5 \times 10^{20}$ cm$^{-3}$. In some embodiment, third semiconductor layer 162 may have a thickness of about 0.01 μm to 5 μm. In some embodiments, third semiconductor layer 162 may include Al$_x$Ga$_{1-x}$N material, having a thickness of 0.01 μm-0.05 μm. In some embodiments not shown, third semiconductor layer 162 may overlap a portion of tapered junction termination element 136.

Referring to FIG. 3B, a metallic structure 161 is formed on third semiconductor layer 162. In some embodiments, metallic structure 161 include metallic structures. For example, metallic structure 161 may include nickel, platinum, palladium, silver, gold, the combination thereof, and the like. Metallic structure 161 and third semiconductor layer 162 constitute contact structure 160. In some embodiments, semiconductor device 200 is manufactured as a BJT, in which contact structure 160 may serve as a base contact of the BJT. In some embodiments, semiconductor device 200 is manufactured as a vertical JFET, in which contact structure 160 may serve as a gate contact of the vertical JFET. In some embodiments, semiconductor device 200 is manufactured as a Schottky diode, in which third semiconductor layer 162 comprising Al$_x$Ga$_{1-x}$N material serves as a barrier layer.

Referring to FIG. 3B, semiconductor device 200 may further include a metallic field plate 170 formed on tapered junction termination element 136. Specifically, metallic field plate 170 is formed on the upper surface of implanted zone 137. Metallic field plate 170 may include the same metal as metallic structure 161. In some embodiments, metallic field plate 170 may include different metals from metallic structure 161 depending on the particular applications. Metallic field plate 170 may provide additional coupling of the electrical field to further alleviate the edge effect.

FIGS. 4A-4G illustrate the intermediate stages for manufacturing a semiconductor device according to another embodiment of the present invention. The steps as described above referring to FIGS. 2A-2D equally apply to semiconductor device 300. Therefore, the description referring to FIGS. 2A-2D is omitted for clarity of description.

FIG. 4A illustrates semiconductor device 300 after the ion implantation process as described referring to FIG. 2D is performed. As shown in FIG. 4A, mask layer 150 is not removed from second semiconductor layer 130 after the ion implantation process.

Figure 4B:
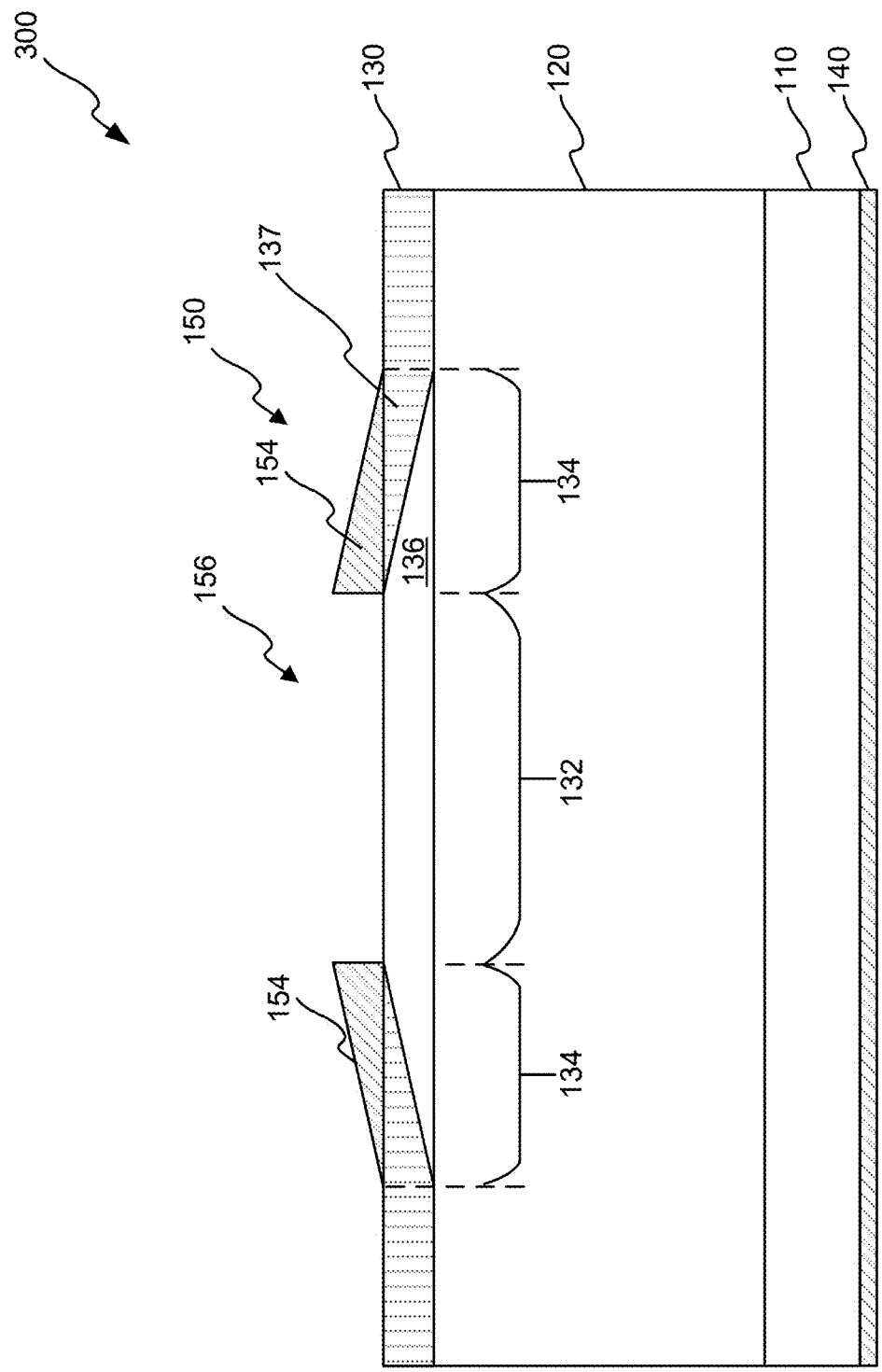

Referring to FIG. 4B, planar region 152 (shown in FIG. 2C) of mask layer 150 is removed to expose an upper surface of contact region 132 of second semiconductor layer 130. In some embodiments, planar region 152 may be removed using an etching process to form an opening 156. For example, the etching process can include a reactive-ion etching (ME) process.

Figure 4C:
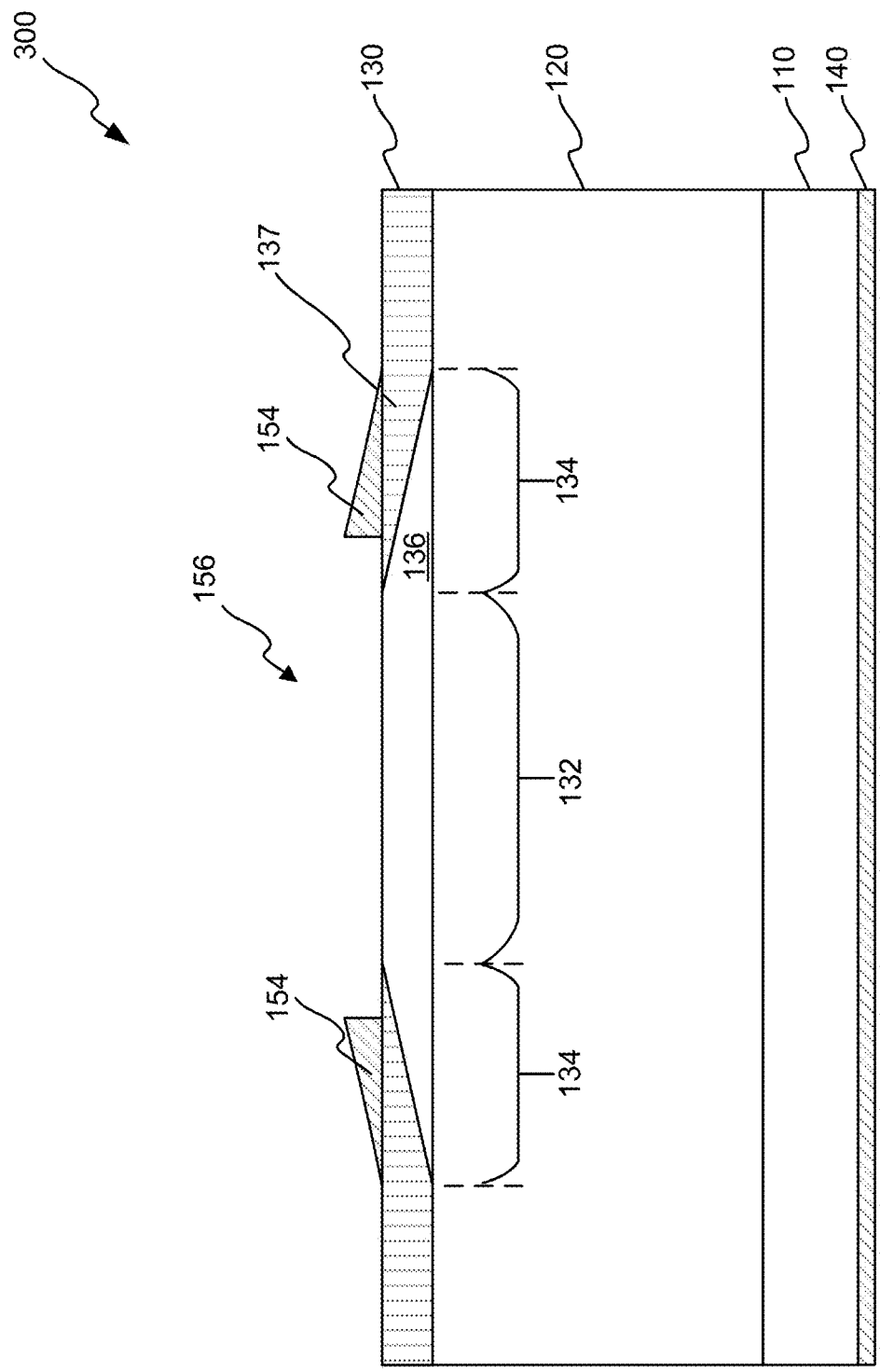

Referring to FIG. 4C, in some embodiments, planar region 152 and a portion of tapered region 154 are removed using an RIE process to form opening 156. The upper surface of contact region 132 and a portion of the upper surface of terminal region 134 is exposed in opening 156.

Figure 4D:
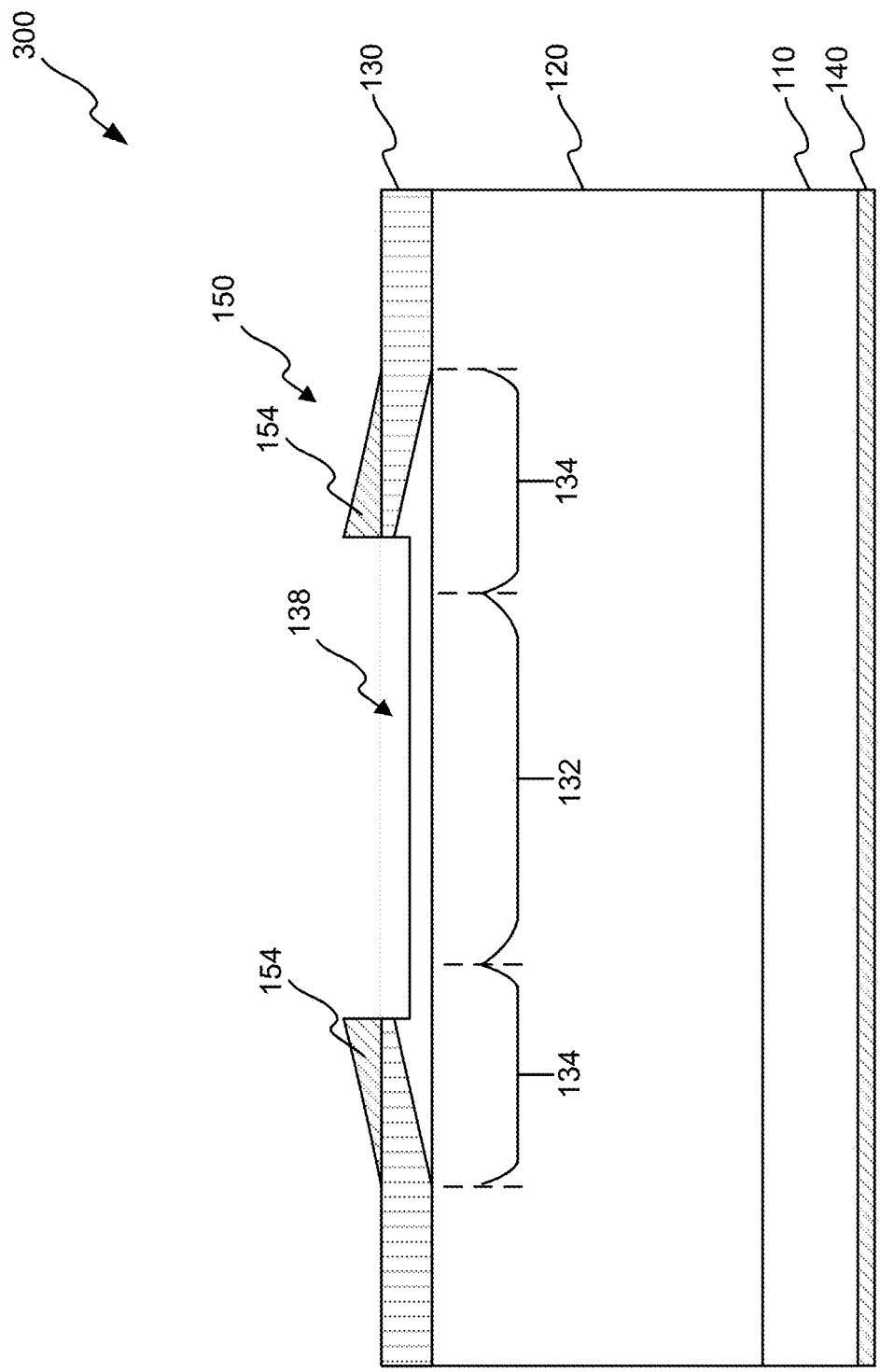
Figure 4E:
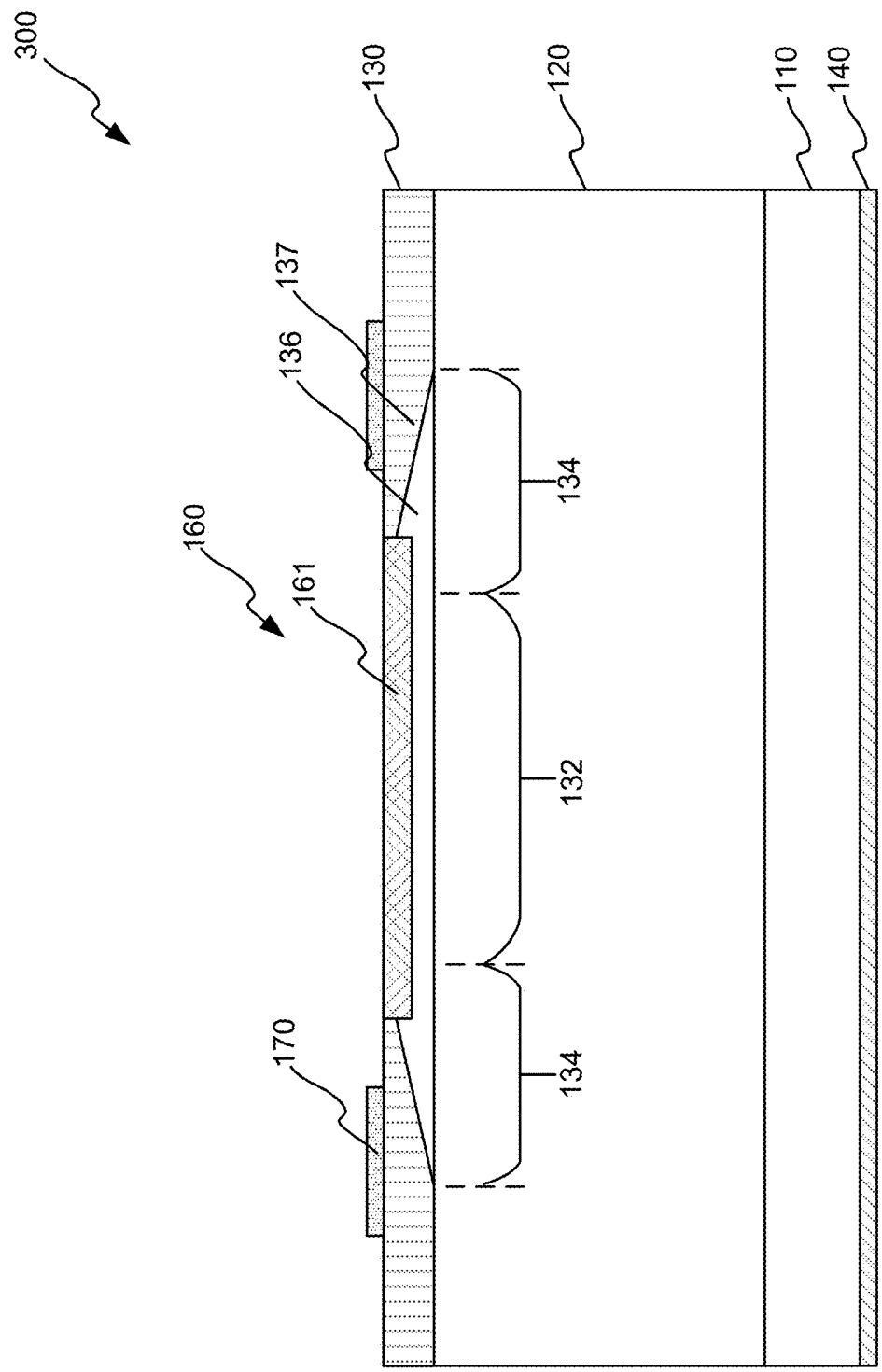

Referring to FIG. 4D, the etching process continues to extend into at least a portion of the thickness of second semiconductor layer 130 to form a recess 138 in second semiconductor layer 130. Referring to FIG. 4E, contract structure 160 is formed within recess 138. In some embodiments, contact structure 160 includes metallic structure 161. For example, metallic structure 161 may include nickel, platinum, palladium, silver, gold, the combination thereof, and the like.

As shown in FIG. 4E, in some embodiments, semiconductor device 300 may further include a metallic field plate 170 formed over tapered junction termination element 136. Specifically, metallic field plate 170 is formed on the upper surface of implanted zone 137. Metallic field plate 170 may include the same metal as metallic structure 161. In some embodiments, metallic field plate 170 may include different metals from metallic structure 161 depending on the particular applications. Metallic field plate 170 may provide additional coupling of the electrical field to further alleviate the edge effect.

Figure 4F:
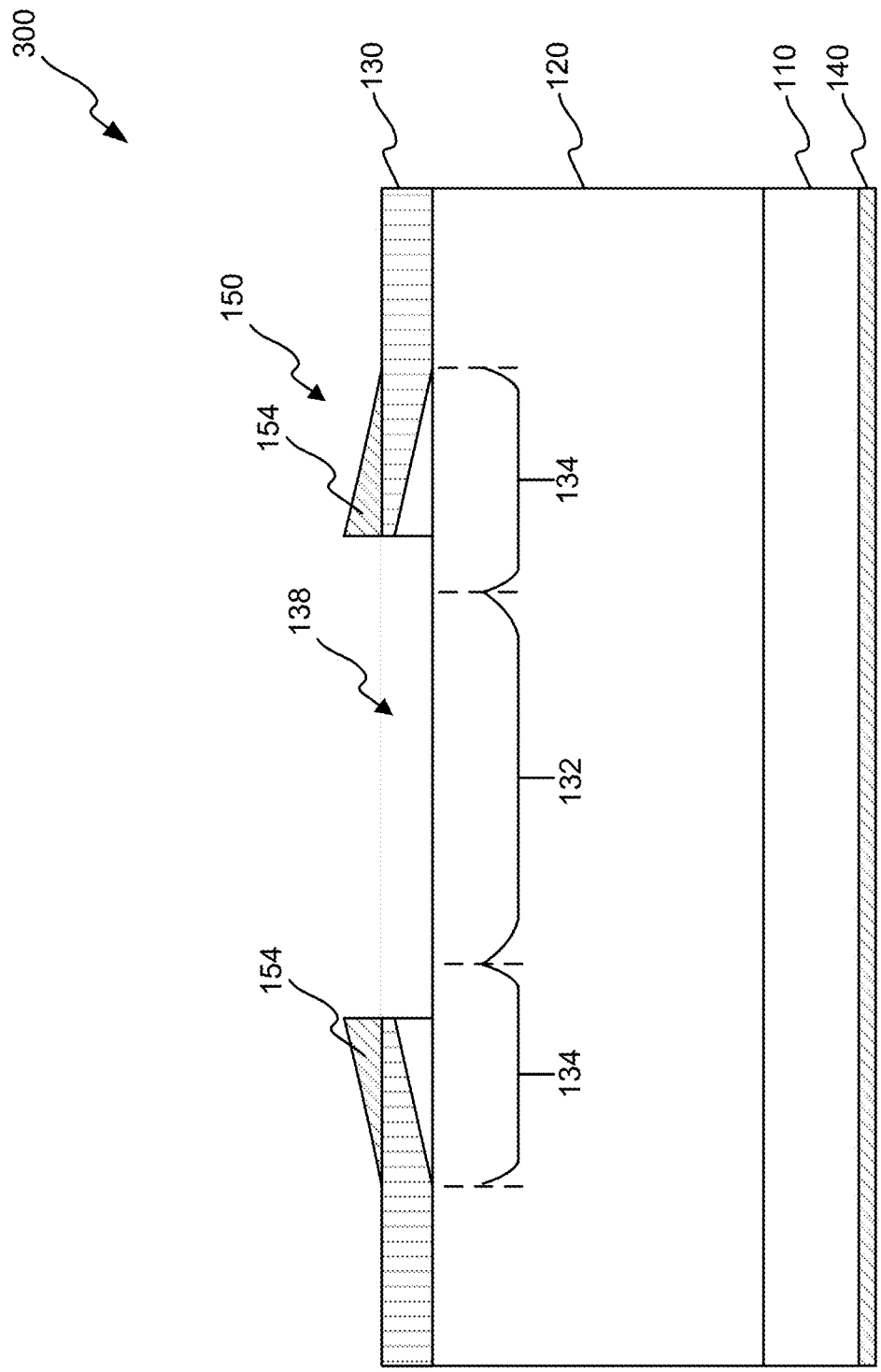
Figure 4G:
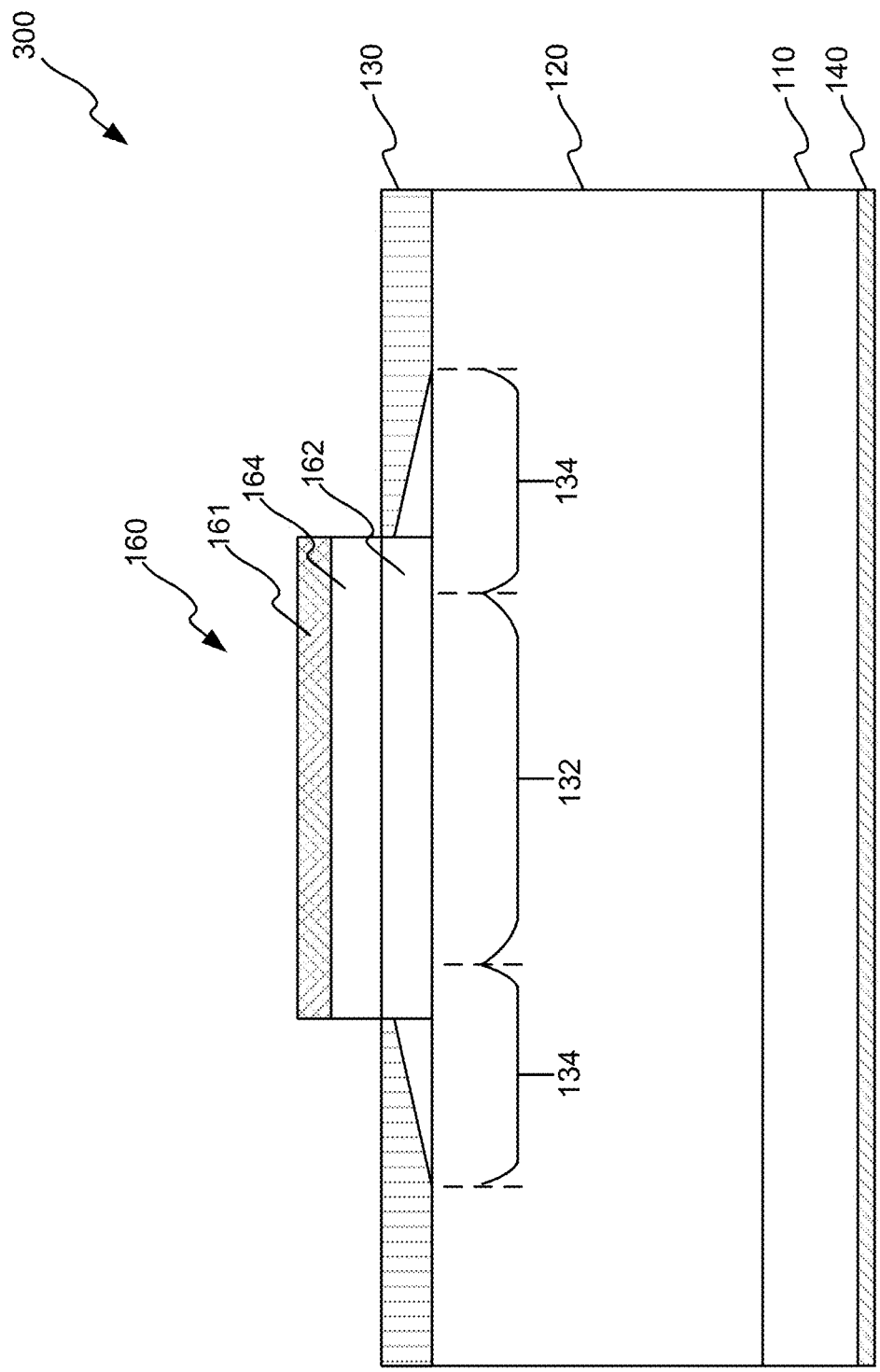

Referring to FIG. 4F, in some embodiments, recess 138 may extend through the thickness of second semiconductor layer 130 to expose the upper surface of first semiconductor layer 120. Then, mask layer 150 is removed. Referring to FIG. 4G, a third semiconductor layer 162 is formed within recess 138. In some embodiments, third semiconductor layer 162 is epitaxially grown within recess 138. In some embodiments, third semiconductor layer 162 can have n conductivity type, with a dopant concentration of about $1 \times 10^{14}$ cm$^{-3}$ to $1 \times 10^{18}$ cm$^{-3}$. In some embodiments, third semiconductor layer 162 can have a thickness of about 0.01 μm to 10 μm. In some embodiments, third semiconductor layer 162 is coplanar with second semiconductor layer 130. In some embodiments, third semiconductor layer 162 is thicker than second semiconductor layer 130.

Next, a fourth semiconductor layer 164 is formed on third semiconductor layer 162. In some embodiments, fourth semiconductor layer 164 is epitaxially grown on third semiconductor layer 162. In some embodiments, fourth semiconductor layer 164 can have n+ conductivity type, with a dopant concentration of about $1 \times 10^{16}$ cm$^{-3}$ to $1 \times 10^{20}$ cm$^{-3}$. In some embodiments, fourth semiconductor layer 164 can have a thickness of about 0.05 μm to 20 μm. In some embodiments, fourth semiconductor layer 164 is omitted. Thereafter, metallic structure 161 is formed on fourth semiconductor layer 164. For example, metallic structure 161 may include nickel, platinum, palladium, silver, gold, the combination thereof, and the like. Third semiconductor layer 162, fourth semiconductor layer 164, and metallic structure 161 constitute contact structure 160. In some embodiments, semiconductor device 300 is manufactured as a vertical JFET, in which contact structure 160 serves as a source contact, and third semiconductor layer 162 and fourth semiconductor layer 164 serve as a channel region for the source contact. In some embodiments, semiconductor device 300 is manufactured as a Schottky diode, in which contact structure 160 serves as the Schottky-contact anode, and third semiconductor layer 162 and fourth semiconductor layer 164 serve as the upper portion of the diode cathode.

Figure 5:
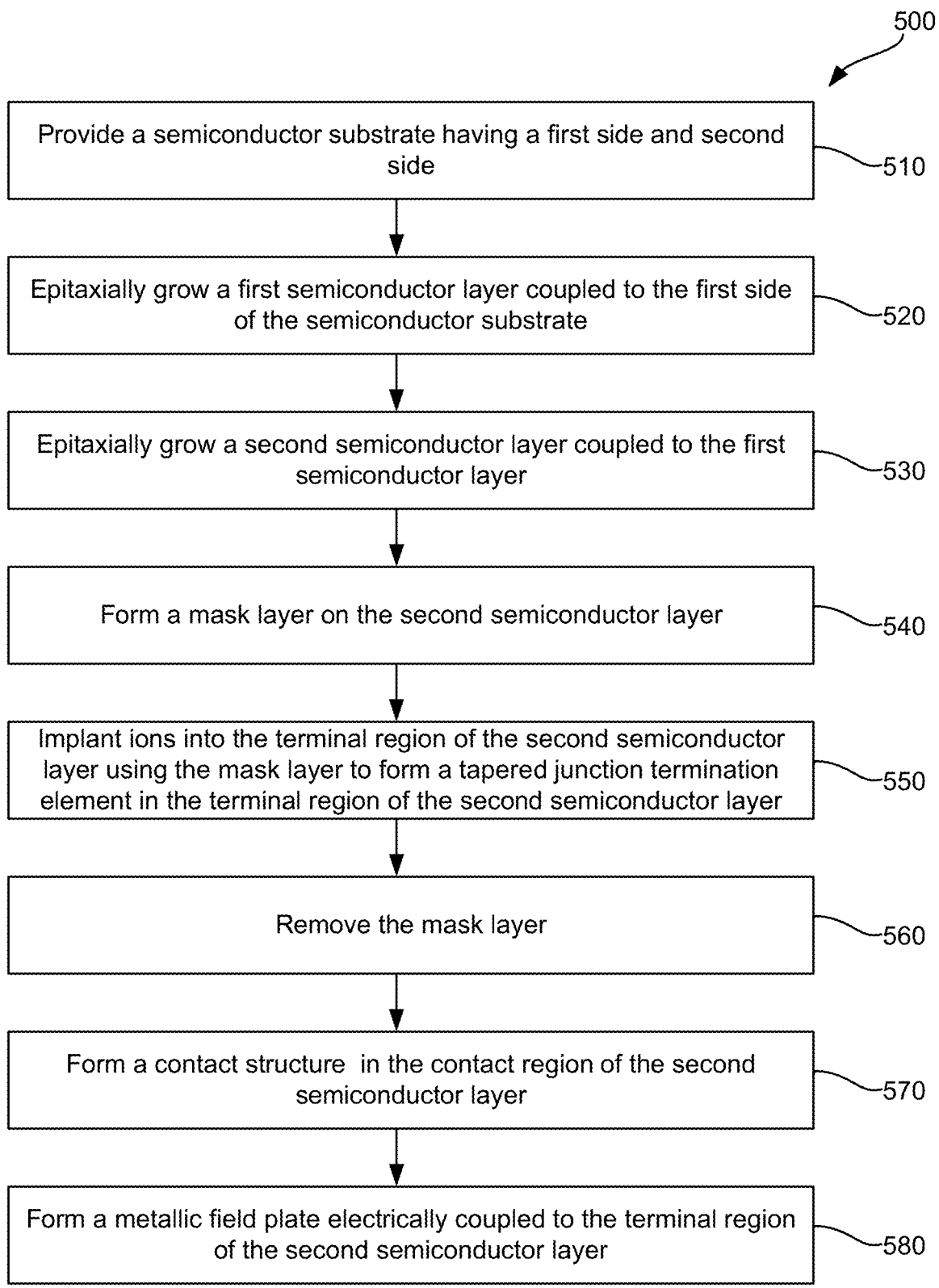
FIG. 5 illustrates a method for manufacturing a semiconductor device according to an embodiment of the present invention.

FIG. 5 illustrates a method for manufacturing a semiconductor device according to an embodiment of the present invention. In some embodiments, method 500 includes providing a semiconductor substrate having a first side and second side (510). The semiconductor substrate is characterized by a first conductivity type. For example, the semiconductor substrate includes n+ type GaN material, having a dopant concentration of about $1\times10^{17}$ cm$^{-3}$ to $1\times10^{19}$ cm$^{-3}$.

Method 500 includes epitaxially growing a first semiconductor layer coupled to the first side of the semiconductor substrate (520). In some embodiments, the first semiconductor layer is characterized by the first conductivity type. For example, the first semiconductor layer may include n-type GaN material, having a dopant concentration of about $1\times10^{14}$ cm$^{-3}$ to $1\times10^{18}$ cm$^{-3}$. In some embodiments, the first semiconductor layer can have a thickness of about 0.5 μm to 100 μm.

Next, method 500 may include epitaxially growing a second semiconductor layer coupled to the first semiconductor layer (530). In some embodiments, the second semiconductor layer is characterized by a second conductivity type opposite the first conductivity type. For example, the second semiconductor layer may include p-type GaN material, having a dopant concentration of about $1\times10^{17}$ cm$^{-3}$ to about $1\times10^{20}$ cm$^{-3}$. In some embodiments, the second semiconductor layer may have a thickness of about 0.01 μm to 5 μm. In some embodiments, the second semiconductor layer includes a contact region and a terminal region surrounding the contact region.

Then, method 500 may include forming a mask layer on the second semiconductor layer (540). In some embodiments, the mask layer is patterned with a planar region aligned with the contact region and a tapered region aligned with the terminal region of the second semiconductor layer. In some embodiments, the mask layer may include a photoresist that can be patterned using a photolithography process to form the tapered region. In some embodiments, the mask layer may be patterned using the photolithography process as described above with reference to FIG. 2C.

Method 500 may further include implanting ions into the terminal region of the second semiconductor layer using the mask layer to form a tapered junction termination element in the terminal region of the second semiconductor layer (550). In some embodiments, the implanted ions stop in the second semiconductor layer to form an implanted zone that is characterized by a conductivity less than a conductivity of the second semiconductor layer. In some embodiments, the implanted ion species may be argon, nitrogen, helium, hydrogen, oxygen, or other appropriate species that reduce the electrical conductivity in the second semiconductor layer. In some embodiments, the implantation energy may be about 20 keV to 1500 keV depending on the desired profile of the tapered junction termination element. In one embodiment, relatively higher implantation energy (e.g., 200 keV-1500 keV) may be used to perform a single step implantation process. In another embodiment, relatively lower implantation energies (e.g., 50 keV-150 keV) may be used to perform multiple implantations. In one embodiment, the implantation species include argon, the implant doses of which may be in the range of about $1\times10^{12}$ cm$^{-3}$ to $5\times10^{16}$ cm$^{-2}$. In another embodiment, the implantation species include nitrogen, the implant doses of which may be in the range of about $1\times10^{12}$ cm$^{-3}$ to $1\times10^{16}$ cm$^{-2}$. In yet another embodiment, the implantation species include helium, the implant doses of which may be in the range of about $1\times10^{14}$ cm$^{-3}$ to $1\times10^{16}$ cm$^{-2}$.

In some embodiments, the ion implantation process is performed on an outer region of the second semiconductor layer that surrounds the terminal region and is not covered by the mask layer. The ion implantation process, therefore, forms a peripheral implanted zone in the second semiconductor layer.

In some embodiments, the ion implantation process may implant ions through the thickness of the second semiconductor layer and ions may stop in the first semiconductor layer to form a tapered termination element in an area of the first semiconductor layer that is aligned with the terminal region. Like the peripheral implanted zone in the second semiconductor layer, a peripheral implanted zone is formed in an area of the first semiconductor layer that is aligned with the outer region of the second semiconductor layer.

Then, method 500 may include removing the mask layer (560) and forming a contact structure in the contact region of the second semiconductor layer (570). In some embodiments, forming the contact structure in the contact region of the second semiconductor layer may include forming a metallic structure electrically coupled to the contact region of the second semiconductor layer. In some embodiments, the metallic structure may overlap a portion of the tapered junction termination element.

In some embodiments, method 500 may further include forming a metallic field plate electrically coupled to the terminal region of the second semiconductor layer (580). In some embodiments, the metallic field plate may include the same metal as the metallic structure. In some embodiments, the metallic field plate may include different metals from the metallic structure depending on the particular applications.

Figure 6:
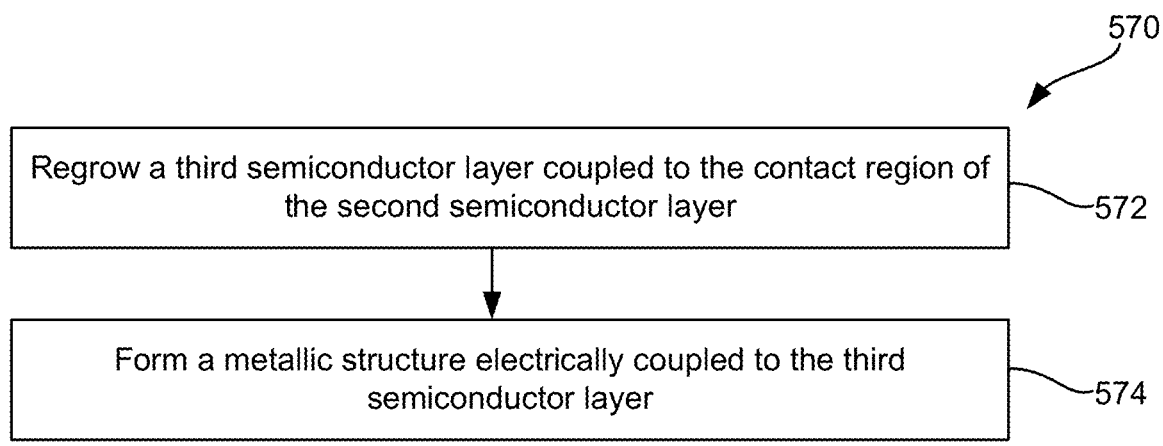
FIG. 6 illustrates a flowchart of the substeps in a process of forming a contact structure according to another embodiment of the present invention.

In some embodiments, the contact structure may vary depending on the particular applications. FIG. 6 illustrates a flowchart of the substeps in a process of forming a contact structure according to another embodiment. The step for forming the contact structure (570) may include regrowing a third semiconductor layer coupled to the contact region of the second semiconductor layer (572). In some embodiments, the third semiconductor layer is characterized by the second conductivity type. For example, the third semiconductor layer may include p+ doped GaN material, having a dopant concentration of about $1\times10^{17}$ cm$^{-3}$ to about $5\times10^{20}$ cm$^{-3}$. In some embodiments, the dopant concentration of the third semiconductor layer is greater than that of the second semiconductor layer. In some embodiment, the third semiconductor layer may have a thickness of about 0.01 μm to 5 μm. In some embodiments, the third semiconductor layer may include $Al_xGa_{1-x}N$ material, having a thickness of 0.01 μm-0.05 μm. In some embodiments, the third semiconductor layer may overlap a portion of the tapered junction termination element.

Then, the step for forming the contact structure (570) may include forming a metallic structure electrically coupled to the third semiconductor layer (574).

Figure 7:
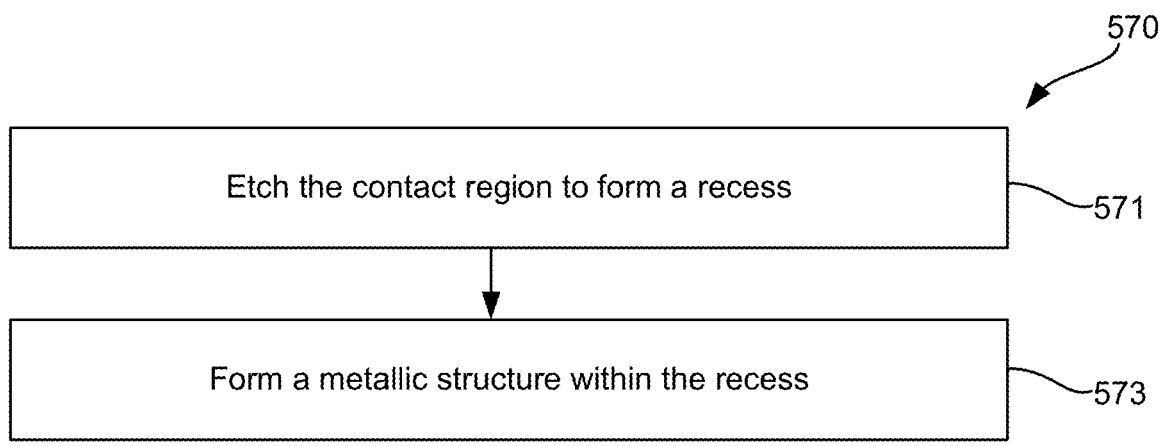
FIG. 7 illustrates a flowchart of the substeps in a process of forming a contact structure according to another embodiment of the present invention.

FIG. 7 illustrates a flowchart of the substeps in a process of forming a contact structure according to another embodiment of the present invention. The step for forming the contact structure (570) may include etching the contact region to form a recess (571). In some embodiments, the recess extends at least a portion of a thickness of the second semiconductor layer. In some embodiments, the etching process may include an RIE process. Then, the step for forming the contact structure (570) further includes forming a metallic structure within the recess (573). In some embodiments, the metallic structure may include nickel, platinum, palladium, silver, gold, the combination thereof, and the like.

Figure 8:
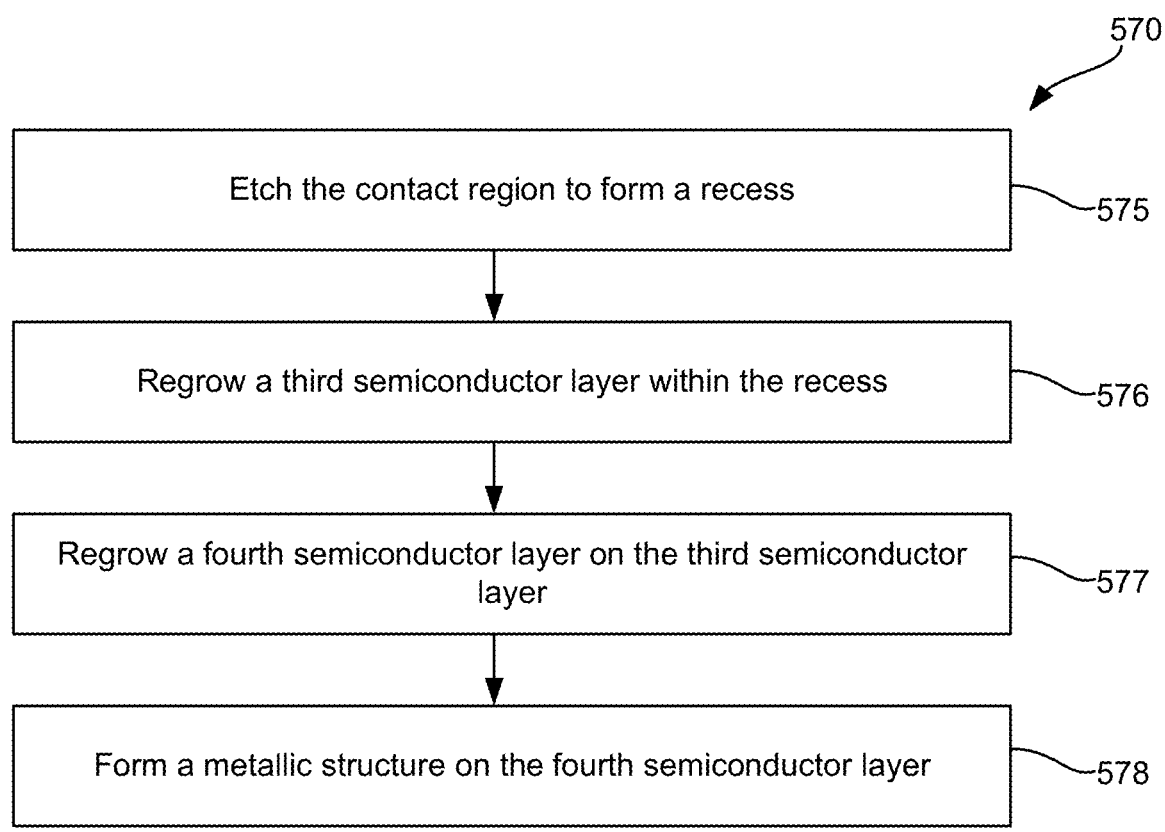
FIG. 8 illustrates a flowchart of the substeps in a process of forming a contact structure according to yet another embodiment of the present invention.

FIG. 8 illustrates a flowchart of the substeps in a process of forming a contact structure according to yet another embodiment of the present invention. The step for forming the contact structure (570) may include etching the contact region to form a recess (575). In this embodiment, the recess extends through the thickness of the second semiconductor layer to expose an upper surface of the first semiconductor layer.

Then, the step for forming the contact structure (570) may further include regrowing a third semiconductor layer within the recess (576). In some embodiments, the third semiconductor layer can have n conductivity type, with a dopant concentration of about $1\times10^{14}$ cm$^{-3}$ to $1\times10^{18}$ cm$^{-3}$. In some embodiments, the third semiconductor layer can have a thickness of about 0.01 µm to 10 µm. In some embodiments, the third semiconductor layer is coplanar with the second semiconductor layer. In some embodiments, the third semiconductor layer is thicker than the second semiconductor layer.

Then, the step for forming the contact structure (570) may further include regrowing a fourth semiconductor layer on the third semiconductor layer (577). In some embodiments, the fourth semiconductor layer can have n+ conductivity type, with a dopant concentration of about $1\times10^{16}$ cm$^{-3}$ to $1\times10^{20}$ cm$^{-3}$. In some embodiments, the fourth semiconductor layer can have a thickness of about 0.05 µm to 20 µm. In some embodiments, the fourth semiconductor layer is omitted.

Next, the step for forming the contact structure (570) may include forming a metallic structure on the fourth semiconductor layer (578). In some embodiments, the metallic structure may include nickel, platinum, palladium, silver, gold, the combination thereof, and the like.

It should be understood that the specific steps illustrated in FIGS. 5-8 provide a particular method of manufacturing a semiconductor device with a tapered junction termination element according to an embodiment of the present invention. Other sequences of steps may also be performed according to alternative embodiments. For example, alternative embodiments of the present invention may perform the steps outlined above in a different order. Moreover, the individual steps illustrated in FIGS. 5-8 may include multiple substeps that may be performed in various sequences as appropriate to the individual steps. Furthermore, additional steps may be added or removed depending on a particular application. One of ordinary skill in the art would recognize many variations, modifications, and alternatives.

Figure 9:
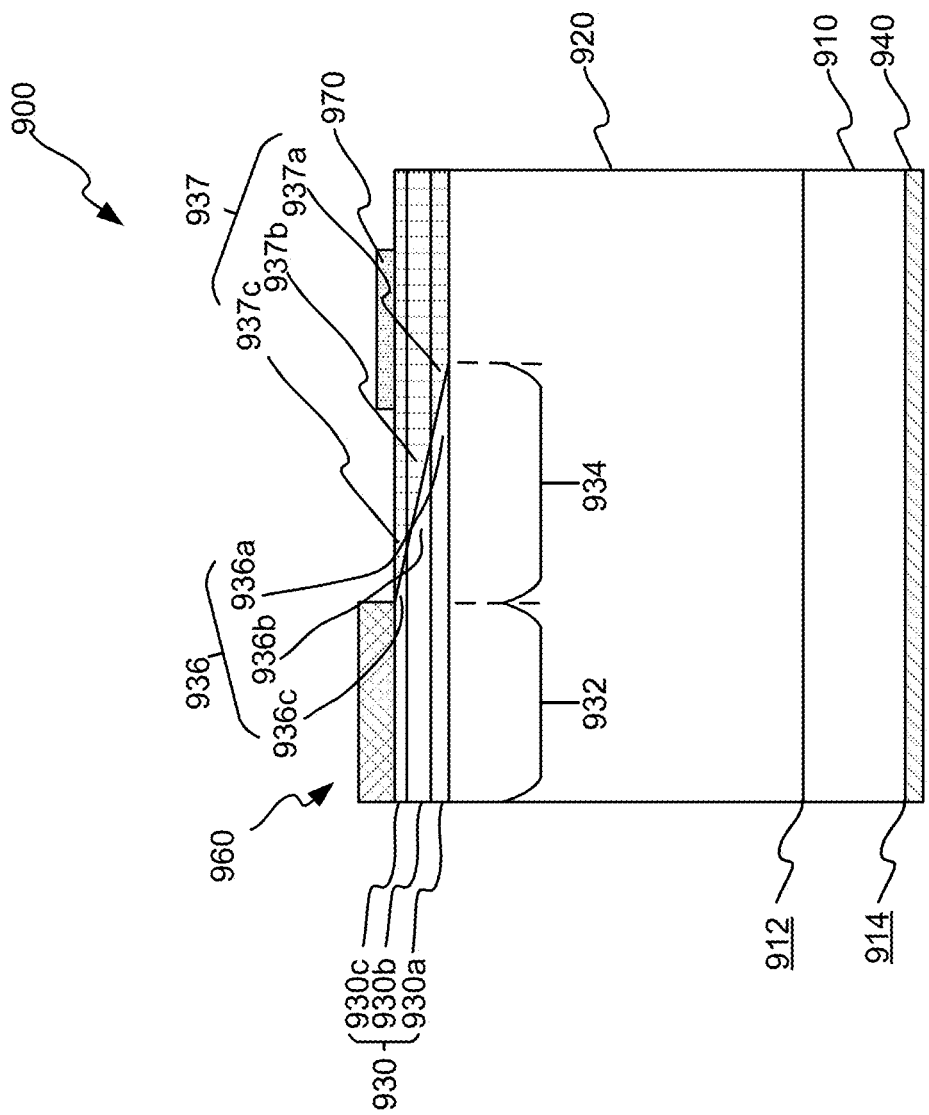
FIG. 9 illustrates a semiconductor device according to an embodiment of the present invention.

FIG. 9 illustrates a semiconductor device 900 according to an embodiment of the present invention. For clarity of illustration, FIG. 9 shows one half of semiconductor device 900. As shown in FIG. 9, semiconductor device 900 may include a semiconductor substrate 910 having a first side 912 and second side 914, a first semiconductor layer 920 (e.g., an epitaxial semiconductor layer) coupled to first side 912 of semiconductor substrate 910, and an epitaxially grown semiconductor structure 930 coupled to first semiconductor layer 920. Semiconductor structure 930 may include a second semiconductor layer 930a coupled to first semiconductor layer 920, a third semiconductor layer 930b coupled to second semiconductor layer 930a, and a fourth semiconductor layer 930c coupled to third semiconductor layer 930b. In some embodiments, second semiconductor layer 930a may include n-doped GaN material, third semiconductor layer 930b may include p-doped GaN material, and fourth semiconductor layer 930c may include n-doped material. In some embodiments, second semiconductor layer 930a may include p-doped GaN material, third semiconductor layer 930b may include n-doped GaN material, and fourth semiconductor layer 930c may include p-doped material. One of ordinary skill should understand that the present invention is not limited to semiconductor structure 930. Alternative semiconductor structures including more or less semiconductor layers may be utilized according to embodiments of the present invention. The conductivity type, the dopant concentration, and/or the thickness of respective semiconductor layers may vary as appropriate to the particular applications.

As shown in FIG. 9, semiconductor structure 930 may include a contact region 932 and a terminal region 934 surrounding contact region 932. Terminal region 934 of semiconductor structure 930 includes a tapered junction termination structure 936 and a tapered implanted zone 937. Specifically, tapered junction terminal structure 936 may include a second tapered junction termination element 936a formed in second semiconductor layer 930a, a third tapered junction termination element 936b formed in third semiconductor layer 930b, and a fourth tapered junction termination element 936c formed in fourth semiconductor layer 930c. Tapered implanted zone 937 include a second tapered implanted zone 937a formed in second semiconductor layer 930a, a third tapered implanted zone 937b formed in third semiconductor layer 930b, and a fourth tapered implanted zone 937c formed in fourth semiconductor layer 930c. Second tapered implanted zone 937a has a conductivity lower than the conductivity of second semiconductor layer 930a, third tapered implanted zone 937b has a conductivity lower than the conductivity of third semiconductor layer 930b, and fourth tapered implanted zone 937c has a conductivity lower than the conductivity of fourth semiconductor layer 930c. One of ordinary skill in the art should understand that the above description of the ion implantation process referring to FIGS. 2C-2D may be used to form tapered junction termination structure 936.

Referring to FIG. 9, semiconductor device 900 further includes a contact structure 960 formed in contact region 932 of semiconductor structure 930. In some embodiments, semiconductor device 900 may include a metallic layer 940 coupled to second side 914 of semiconductor substrate 910. In some embodiments, semiconductor device 900 may further include a metallic field plate 970 electrically coupled to tapered junction termination structure 936 of semiconductor structure 930.

Figure 10A:
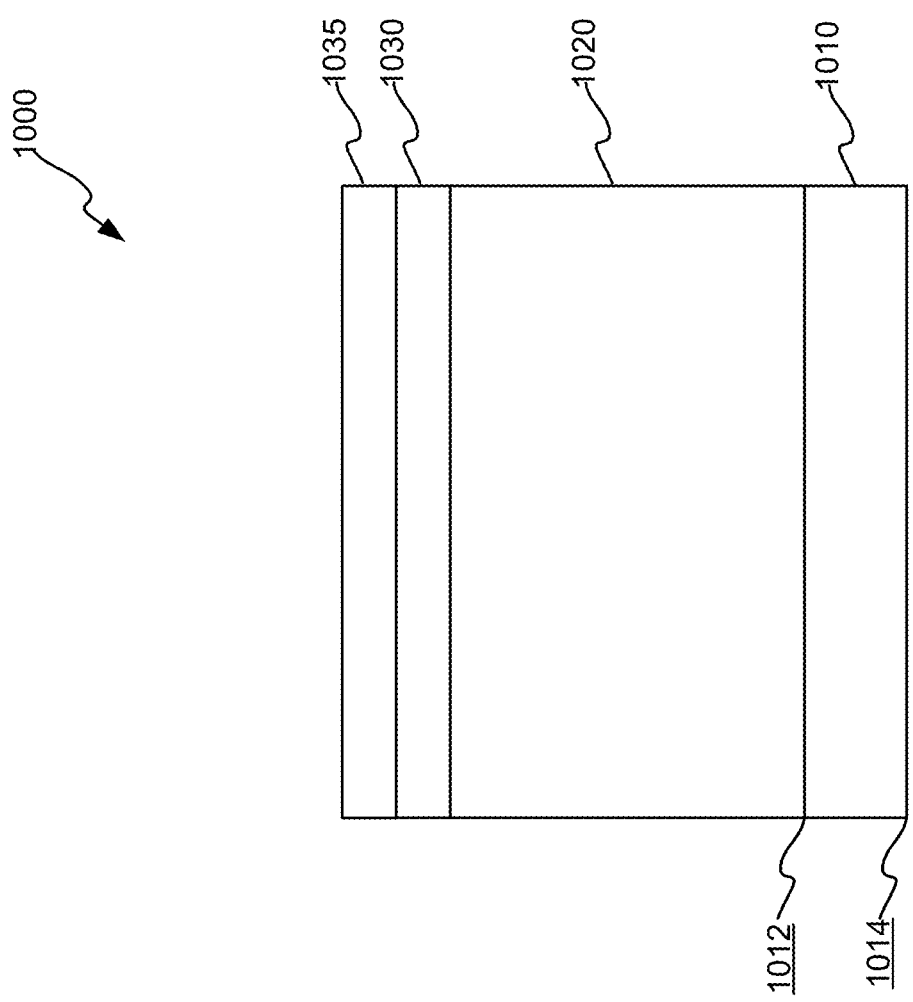
FIGS. 10A-10G illustrate the intermediate stages of a method for manufacturing a semiconductor device according to some embodiments of the present invention.

FIGS. 10A-10G illustrate the intermediate stages of a method for manufacturing a semiconductor device according to some embodiments of the present invention. FIG. 10A illustrates a partial cross-sectional view of semiconductor device 1000 having semiconductor substrate 1010 (e.g., an n+ doped semiconductor substrate) with first side 1012 and second side 1014, first semiconductor layer 1020 (e.g., an n− doped semiconductor layer) epitaxially grown on first side 1012 of semiconductor substrate 1010, and second semiconductor layer 1030 (e.g., a p+ doped semiconductor layer) epitaxially grown on first semiconductor layer 1020. Different from the embodiment shown in FIG. 2A, semiconductor device 1000 further includes a dielectric layer 1035 formed on second semiconductor layer 1030. Dielectric layer 1035 may be used in subsequent processes to form a tapered junction termination element in second semiconductor layer 1030.

Figure 10B:
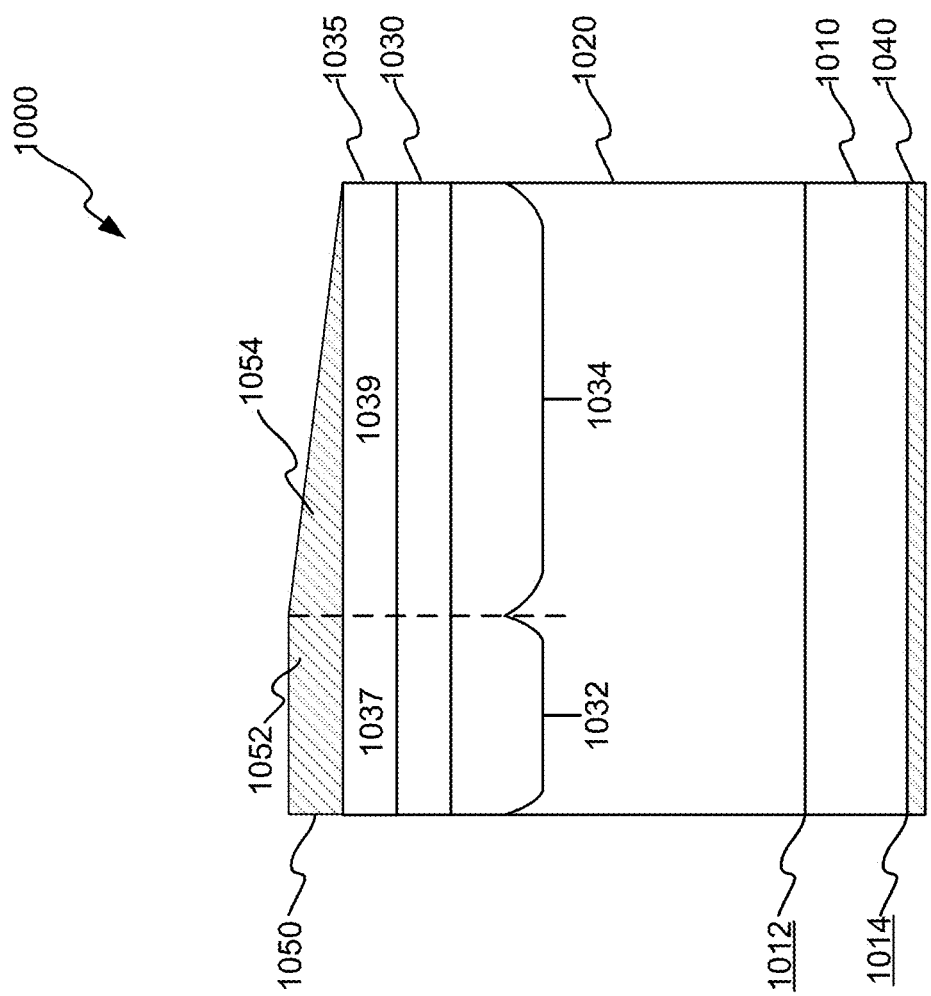

As illustrated in FIG. 10B, a mask layer 1050 is formed on second semiconductor layer 1030. In a manner similar to that described above in relation to FIG. 1, second semiconductor layer 1030 includes contact region 1032 for coupling with a contact structure, and terminal region 1034 adjoining contact region 1032. For convenience of description, mask layer 1050 may include a planar region 1052 aligned with contact region 1032 of second semiconductor layer 1030, and a tapered region 1054 aligned with terminal region 1034 of second semiconductor layer 1030. Correspondingly, dielectric layer 1035 includes a dielectric contact region 1037 aligned with contact region 1032, and a dielectric terminal region 1039 aligned with terminal region 1034. In a manner similar to that described above in relation to FIG. 2B, mask layer 1050 may include a photoresist that can be patterned using a photolithography process to form tapered region 1054. The method for forming the mask layer described with reference to FIG. 2C may be used to form mask layer 1050.

As shown in FIG. 10B, a metallic layer 1040 is formed at second side 1014 of semiconductor substrate 1010. In some embodiments, metallic layer 1040 may include one or more layers of ohmic metal that serve as an ohmic contact for the cathode of a Schottky diode. For example, metallic layer 1040 may include a titanium-aluminum (Ti/Al) metal.

Figure 10C:
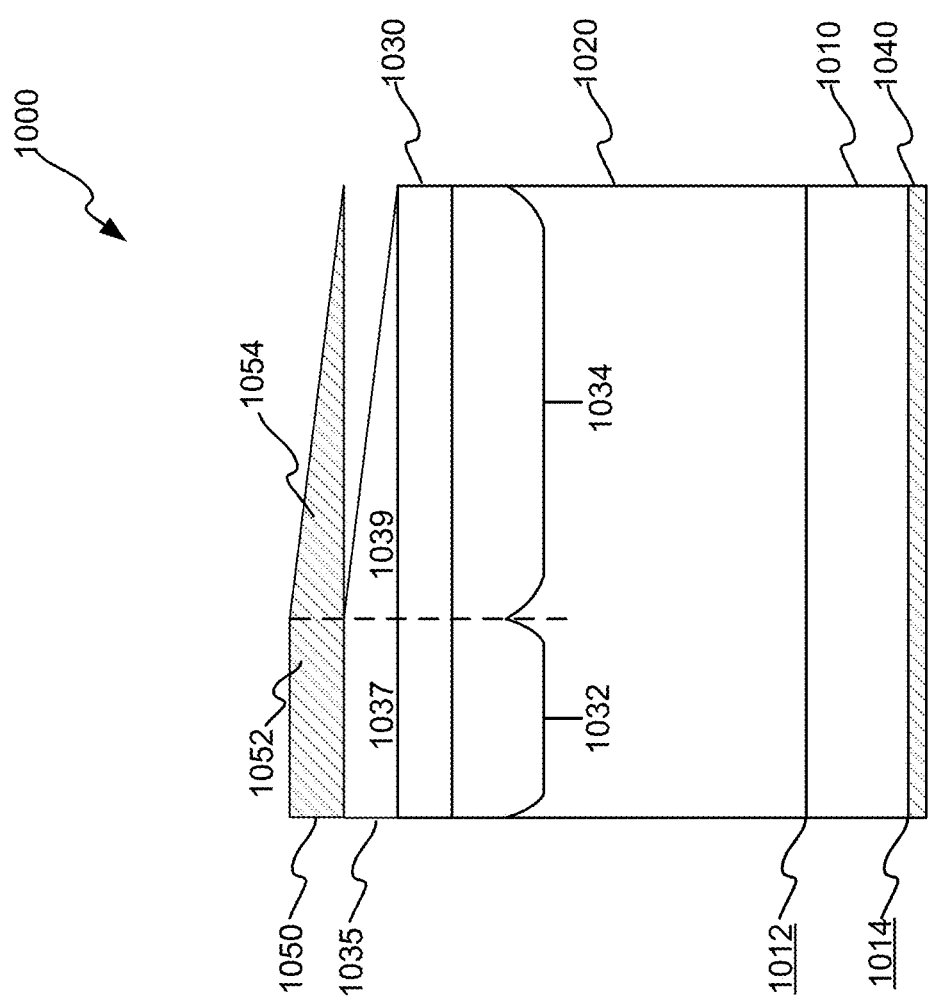

Referring to FIG. 10C, an etching process is performed at dielectric terminal region 1039 using mask layer 1050 as a mask in such a manner as to remove a portion of material at dielectric terminal region 1039 and transfer a taper from mask layer 1050 to dielectric layer 1035 in the dielectric terminal region 1039. Thus, the etching process removes portions of mask layer 1050 and transfers the taper into dielectric layer 1035 according to the relative etch rates of the materials forming mask layer 1050 and dielectric layer 1035. After the etching process, dielectric terminal region 1039 has a tapered profile. In some embodiments, the etching process may include an RIE process, such as an ME process using fluorine-based or chlorine-based chemistries. In some embodiments, mask layer 1050 may include a photoresist, and dielectric layer 1035 may include oxide or nitride material. For example, dielectric layer 1035 may include silicon dioxide material. In some embodiments, an etch selectivity between the mask layer 1050 and dielectric layer 1035 may be selected as 1:1 to make the tapering of dielectric terminal region 1039 conform the tapered profile of tapered region 1054 of mask layer 1050. In some other embodiments, different etch selectivity may be selected depending on the composition and thickness of dielectric layer 1035. In such embodiments, the taper profile of dielectric terminal region 1039 may be steeper or more gradual than tapered region 1054 of mask layer 1050, depending on whether the etch rate of dielectric layer 1035 is faster or slower, respectively, than the etch rate of mask layer 1050.

Figure 10D:
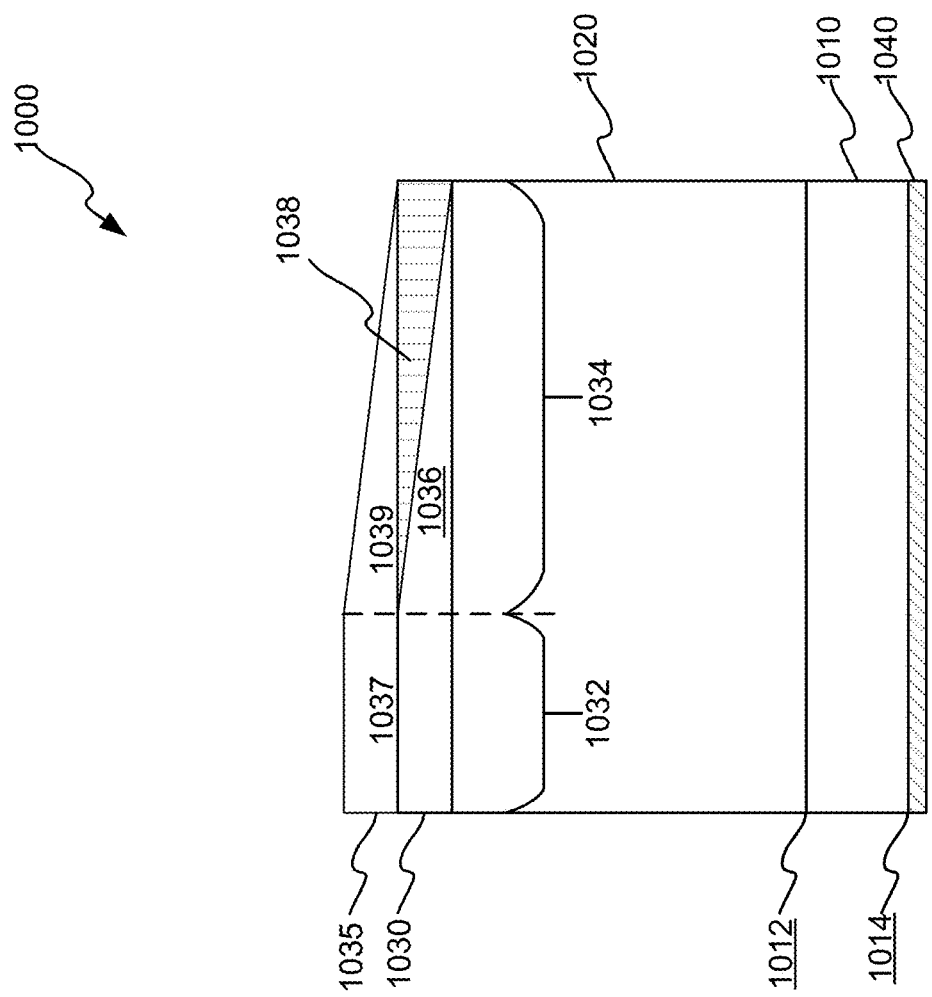

Referring to FIG. 10D, any remaining portion of mask layer 1050 (shown in FIG. 10B) is removed after the etching process is completed. In some embodiments, mask layer 1050 is removed by wet etching or dry etching using one or more processing techniques. For example, mask layer 1050 may be removed by ashing in an oxygen plasma, followed by a wet clean treatment such as a sulfuric acid/hydrogen peroxide mixture at 65-120° C.

Then, an ion implantation process is performed through dielectric layer 1035 to form a tapered junction termination element 1036 in second semiconductor layer 1030. The ion implantation, as described with reference to FIG. 2D, may be used to perform the ion implantation process. As shown in FIG. 10D, due to the tapered profile of dielectric terminal region 1039, implantation ions stop in second semiconductor layer 1030 to form tapered implanted zone 1038. Thus, tapered junction termination element 1036 is formed. The implanted ion species may be argon, nitrogen, helium, hydrogen, oxygen, silicon, or other appropriate species that reduce the electrical conductivity in second semiconductor layer 1030. In some embodiments, the implantation energy may be about 20 keV-1500 keV depending on the desired profile of tapered junction termination element 1036. In one embodiment, relatively higher implantation energy (e.g., 200 keV-1500 keV) may be used to perform a single step implantation process. In another embodiment, relatively lower implantation energy (e.g., 50 keV-150 keV) may be used to perform multiple implantations. In one embodiment, the implantation species include argon, the implant doses of which may be in the range of about $1 \times 10^{12}$ $cm^{-3}$ to $5 \times 10^{16}$ $cm^{-2}$. In another embodiment, the implantation species include nitrogen, the implant doses of which may be in the range of about $1 \times 10^{12}$ $cm^{-3}$ to $1 \times 10^{16}$ $cm^{-2}$. In yet another embodiment, the implantation species include helium, the implant doses of which may be in the range of about $1 \times 10^{14}$ $cm^{-3}$ to $1 \times 10^{16}$ $cm^{-2}$. Dielectric layer 1035 provides additional advantages for the ion implantation process, especially in an ion implantation process using a high dose and high energy, or in multiple-step ion implantation processes using a low dose and low energy. In such embodiments, dielectric layer 1035 eliminates the need for the removal of photoresist after the ion implantation process.

Figure 10E:
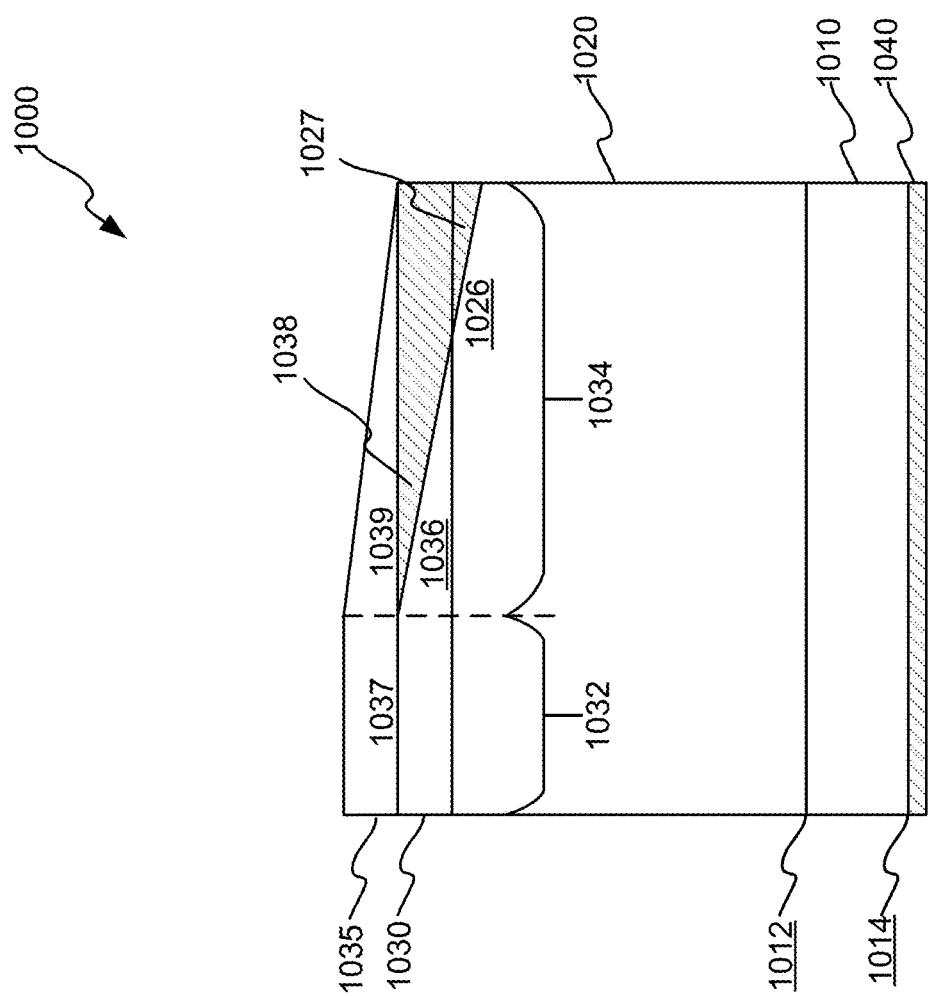

FIG. 10E illustrates the ion implantation process in another embodiment of the present invention. The ion implantation process may implant ions through the thickness of second semiconductor layer 1030 and ions may stop in first semiconductor layer 1020 to form a tapered implanted zone 1027 in an area of first semiconductor layer 1020 that is aligned with terminal region 1034. Thus, a tapered termination element 1026 is formed in first semiconductor layer 1020.

After the formation of tapered junction termination element 1036, an optional high-temperature anneal process may be performed to activate the implanted ions and/or repair the damage in second semiconductor layer 1030. For example, a rapid thermal anneal (RTA) process may be performed.

Figure 10F:
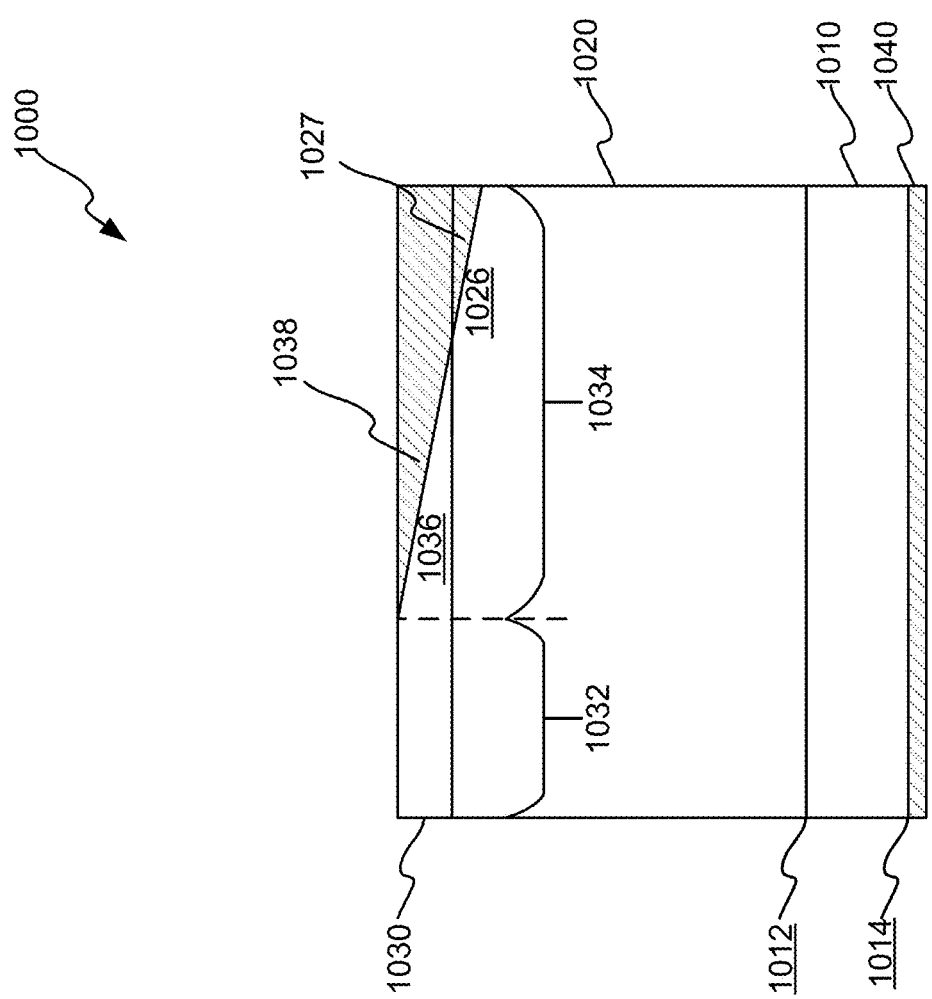

Referring to FIG. 10F, dielectric layer 1035 (shown in FIG. 10) is removed after the ion implantation process is completed. In some embodiments, dielectric layer 1035 is removed by wet etching or dry etching using one or more processing techniques. For example, dielectric layer 1035 may be removed by wet etching in a solution of hydrofluoric acid.

Figure 10G:
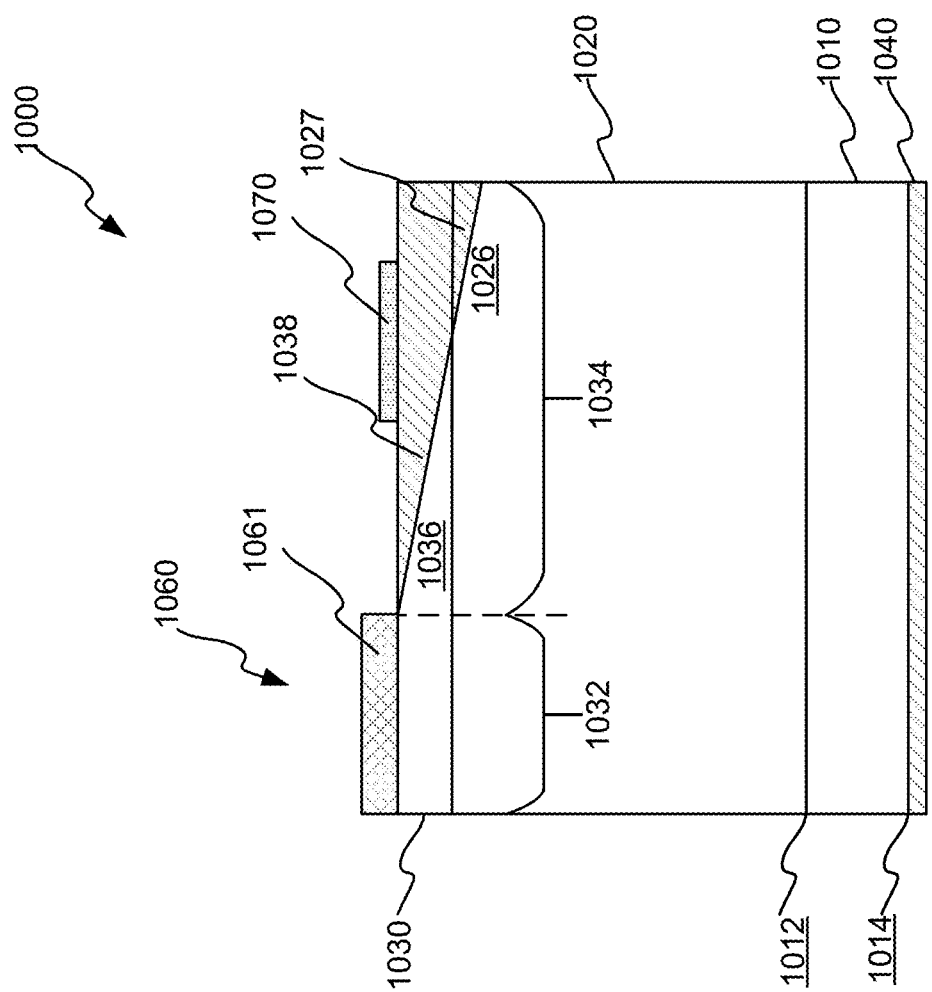

Referring to FIG. 10G, after removal of dielectric layer 1035, a contact structure 1060 is formed in contact region 1032 of second semiconductor layer 1030. In some embodiments, contact structure 1060 includes metallic structure 1061. For example, metallic structure 1061 may include nickel, platinum, palladium, silver, gold, the combination thereof, and the like. In some embodiments, semiconductor device 1000 is a Schottky diode. Metallic structure 1061 makes an ohmic contact with second semiconductor layer 1030. Tapered junction termination element 1036 results in the electrical field extending laterally to alleviate the edge effect of the electrical field. In some embodiments not shown, metallic structure 1061 may overlap a portion of tapered junction termination element 1036 to improve the performance of tapered junction termination element 1036 in alleviating the edge effect of the electrical field.

As shown in FIG. 10G, in some embodiments, semiconductor device 1000 may further include a metallic field plate 1070 formed over tapered junction termination element 1036. Specifically, metallic field plate 1070 is formed on the upper surface of implanted zone 1038. Metallic field plate 1070 may include the same metal as metallic structure 1061. In some embodiments, metallic field plate 1070 may include different metals from metallic structure 1061 depending on the particular applications. Metallic field plate 1070 may provide additional coupling of the electrical field to further alleviate the edge effect.

Figure 11:
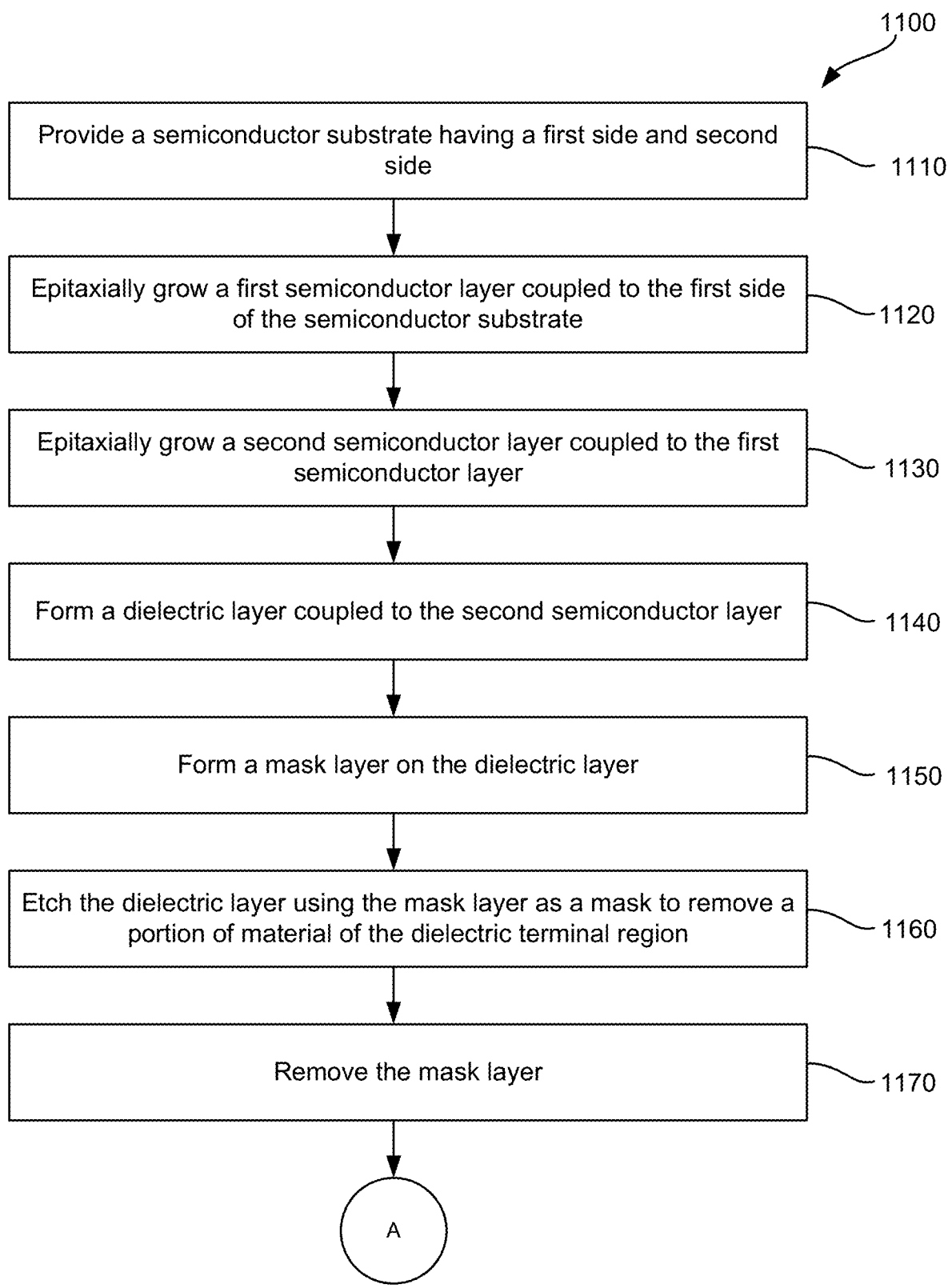
FIG. 11 illustrates a method for manufacturing a semiconductor device according to an embodiment of the present invention.
Figure 11:
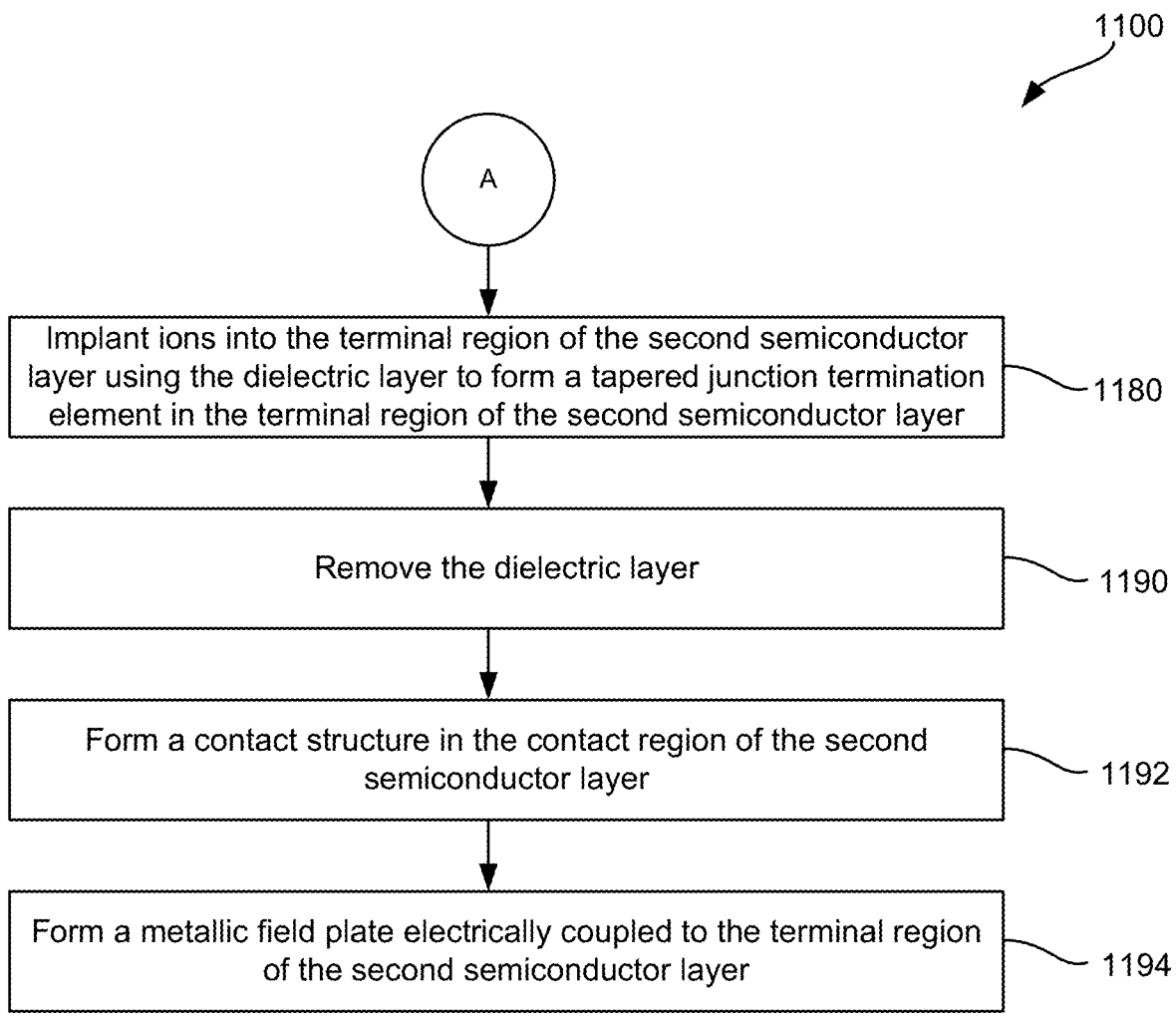

FIG. 11 illustrates a method for manufacturing a semiconductor device according to an embodiment of the present invention. In some embodiments, method 1100 includes providing a semiconductor substrate having a first side and second side (1110). The semiconductor substrate is characterized by a first conductivity type. For example, the semiconductor substrate includes n+ type GaN material, having a dopant concentration of about $1 \times 10^{17}$ cm$^{-3}$ to $1 \times 10^{19}$ cm$^{-3}$.

Method 1100 includes epitaxially growing a first semiconductor layer coupled to the first side of the semiconductor substrate (1120). In some embodiments, the first semiconductor layer is characterized by the first conductivity type. For example, the first semiconductor layer may include n-type GaN material, having a dopant concentration of about $1 \times 10^{14}$ cm$^{-3}$ to $1 \times 10^{18}$ cm$^{-3}$. In some embodiments, the first semiconductor layer can have a thickness of about 0.5 μm to 100 μm.

Next, method 1100 may include epitaxially growing a second semiconductor layer coupled to the first semiconductor layer (1130). In some embodiments, the second semiconductor layer is characterized by a second conductivity type opposite the first conductivity type. For example, the second semiconductor layer may include p-type GaN material, having a dopant concentration of about $1 \times 10^{17}$ cm$^{-3}$ to about $1 \times 10^{20}$ cm$^{-3}$. In some embodiment, second semiconductor layer 130 may have a thickness of about 0.01 μm to 5 μm. In some embodiments, the second semiconductor layer includes a contact region and a terminal region surrounding the contact region.

Method 1100 may further include forming a dielectric layer coupled to the second semiconductor layer (1140). In some embodiments, the dielectric layer may include oxide or nitride materials. For example, the dielectric layer may include silicon dioxide material. In some embodiments, the dielectric layer includes a dielectric terminal region aligned with the terminal region of the second semiconductor layer.

Then, method 1100 may include forming a mask layer on the dielectric layer (1150). In some embodiments, the mask layer is patterned with a planar region aligned with the contact region and a tapered region aligned with the terminal region of the second semiconductor layer. In some embodiments, the mask layer may include a photoresist that can be patterned using a photolithography process to form the tapered region. In some embodiments, the mask layer may be patterned using the photolithography process as described above with reference to FIG. 2C.

Method 1100 may include etching the dielectric layer using the mask layer as a mask to remove a portion of material of the dielectric terminal region (1160). In some embodiments, the etching process forms a tapered profile to the dielectric terminal region of the dielectric layer. In some embodiment, the etching process may include an RIE process. Then, method 1100 may include removing the mask layer (1170).

Method 1100 may further include implanting ions into the terminal region of the second semiconductor layer using the dielectric layer to form a tapered junction termination element in the terminal region of the second semiconductor layer (1180). In some embodiments, the implanted ions stop in the second semiconductor layer to form an implanted zone that is characterized by a conductivity lower than the conductivity of the second semiconductor layer. In some embodiments, the implanted ions species may be argon, nitrogen, helium, hydrogen, oxygen, silicon, or other appropriate species that reduce the electrical conductivity in the second semiconductor layer. In some embodiments, the implantation energy may be about 20 keV-1500 keV depending on the desired profile of the tapered junction termination element. In one embodiment, relatively higher implantation energy (e.g., 200 keV-1500 keV) may be used to perform a single-step implantation process. In another embodiment, relatively lower implantation energy (e.g., 50 keV-150 keV) may be used to perform multiple implantations. In one embodiment, the implantation species include argon, implant doses of which may be in the range of about $1 \times 10^{12}$ cm$^{-3}$ to $5 \times 10^{16}$ cm$^{-2}$. In another embodiment, the implantation species include nitrogen, the implant doses of which may be in the range of about $1 \times 10^{12}$ cm$^{-3}$ to $1 \times 10^{16}$ cm$^{-2}$. In yet another embodiment, the implantation species include helium, the implant doses of which may be in the range of about $1 \times 10^{14}$ cm$^{-3}$ to $1 \times 10^{16}$ cm$^{-2}$.

In some embodiments, the ion implantation process may implant ions through the thickness of the second semiconductor layer and ions may stop in the first semiconductor layer to form a tapered implanted zone in an area of the first semiconductor layer that is aligned with the terminal region.

Then, method 1100 may include removing the dielectric layer (1190), and forming a contact structure in the contact region of the second semiconductor layer (1192). In some embodiments, forming the contact structure in the contact region of the second semiconductor layer includes forming a metallic structure electrically coupled to the contact region of the second semiconductor layer. In some embodiments, the metallic structure may overlap a portion of the tapered junction termination element.

In some embodiments, method 1100 may further include forming a metallic field plate electrically coupled to the terminal region of the second semiconductor layer (1194). In some embodiments, the metallic field plate may include the same metal as the metallic structure. In some embodiments, the metallic field plate may include different metals from the metallic structure depending on the particular applications.

It should be noted, the substeps for forming a contact structure as described with reference to FIGS. 6-8 can be similarly applied to method 1100 to form a contact structure.

It should be understood that the specific steps illustrated in FIG. 11 provide a particular method of manufacturing a semiconductor device with a tapered junction termination element according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple substeps that may be performed in various sequences as appropriate to the individual steps. Furthermore, additional steps may be added or removed depending on a particular application. One of ordinary skill in the art would recognize many variations, modifications, and alternatives.

Figure 12:
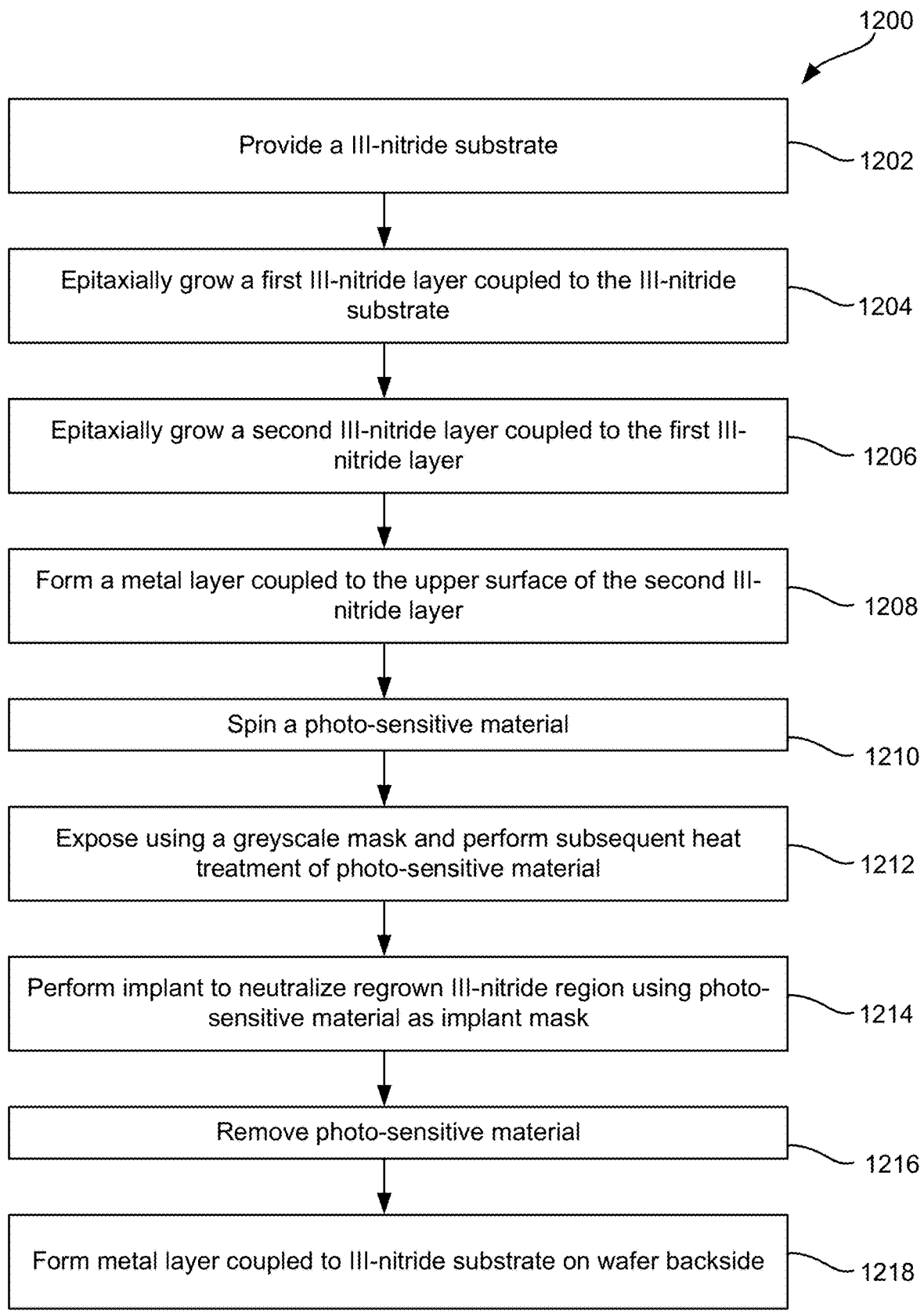
FIG. 12 illustrates a method for manufacturing a semiconductor device according to an embodiment of the present invention.

FIG. 12 illustrates a method for manufacturing a semiconductor device according to an embodiment of the present invention. Method 1200 may include providing a III-nitride substrate having a first side and second side (1202). The III-nitride substrate is characterized by a first conductivity type. For example, the III-nitride substrate includes n+ type GaN material, having a dopant concentration of about $1\times10^{17}$ cm$^{-3}$ to $1\times10^{19}$ cm$^{-3}$.

Method 1200 includes epitaxially growing a first III-nitride layer coupled to the first side of the semiconductor substrate (1204). In some embodiments, the first III-nitride layer is characterized by the first conductivity type. For example, the first III-nitride layer may include n-type GaN material, having a dopant concentration of about $1\times10^{14}$ cm$^{-3}$ to $1\times10^{18}$ cm$^{-3}$. In some embodiments, the first III-nitride layer can have a thickness of about 0.5 µm to 100 µm.

Next, method 1200 may include epitaxially growing a second III-nitride layer coupled to the first III-nitride layer (1206). In some embodiments, the second III-nitride layer is characterized by a second conductivity type opposite the first conductivity type. For example, the second III-nitride layer may include p-type GaN material, having a dopant concentration of about $1\times10^{17}$ cm$^{-3}$ to about $1\times10^{20}$ cm$^{-3}$. In some embodiments, the second III-nitride layer may have a thickness of about 0.01 µm to 5 µm. In some embodiments, the second III-nitride layer includes a contact region and a terminal region surrounding the contact region.

Method 1200 may further include forming a metal layer coupled to the upper surface of the second III-nitride layer (1208). Specifically, the metal layer is coupled to the contact region of the second III-nitride layer. In some embodiments, the metal layer may include nickel, platinum, palladium, silver, gold, the combination thereof, and the like.

Next, method 1200 may include a process of forming a tapered termination element using a greyscale mask. Method 1200 may include spinning a photo-sensitive material (1210). Specifically, the photo-sensitive material is spun on the second III-nitride layer and overlaying the metal layer. In some embodiments, the photo-sensitive material may include a photoresist that can be patterned using a photolithography process.

Method 1200 may further include exposing using a greyscale mask, which may be a specially designed greyscale mask, and performing subsequent heat treatment of photo-sensitive material (1212). Specifically, the photo-sensitive material can be processed using the methods illustrated referring to FIG. 2D or 2E. After the processing, the photo-sensitive material is patterned with a planar region aligned with the contact region and a tapered region aligned with the terminal region of the second III-nitride layer.

Then, method 1200 may further include performing an implant to neutralize at least a portion of the III-nitride layer(s) using photo-sensitive material as an implant mask (1214). Specifically, method 1200 may include implanting ions into the terminal region of the second III-nitride layer using the photo-sensitive material as a mask to form a tapered junction termination element in the terminal region of the second III-nitride layer. In some embodiments, the implanted ions may stop in the second semiconductor to form an implanted zone that is characterized by a conductivity less than a conductivity of the second III-nitride layer. In some embodiments, the implanted ion species may be argon, nitrogen, helium, hydrogen, oxygen, silicon, or other appropriate species that reduce the electrical conductivity in the second III-nitride layer.

Next, method 1200 may include removing the photo-sensitive material (1216). It should be noted the process of forming the tapered termination element using the greyscale mask can be moved around in the process flow, such as being performed at different stages in the method 1200 as appropriate to particular applications.

Method 1200 may further include forming a metal layer coupled to the III-nitride substrate on wafer backside (1218). Specifically, the metal layer may be formed to the second side of the III-nitride substrate. In some embodiments, the metal layer may include a titanium-aluminum (Ti/Al) metal.

It should be appreciated that the specific steps illustrated in FIG. 12 provide a particular method for manufacturing a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 13A:
FIGS. 13A-13I illustrate the intermediate stages of a method for manufacturing a semiconductor device according to some embodiments of the present invention.

FIGS. 13A-13I illustrate the intermediate stages of a method for manufacturing a semiconductor device according to some embodiments of the present invention. For example, the semiconductor device may include a diode. FIG. 13A illustrates a partial cross-sectional view of semiconductor device 1300 having a III-nitride substrate 1301 (e.g., an n+ doped III-nitride substrate) with first side 1301a and second side 1301b.

Figure 13B:
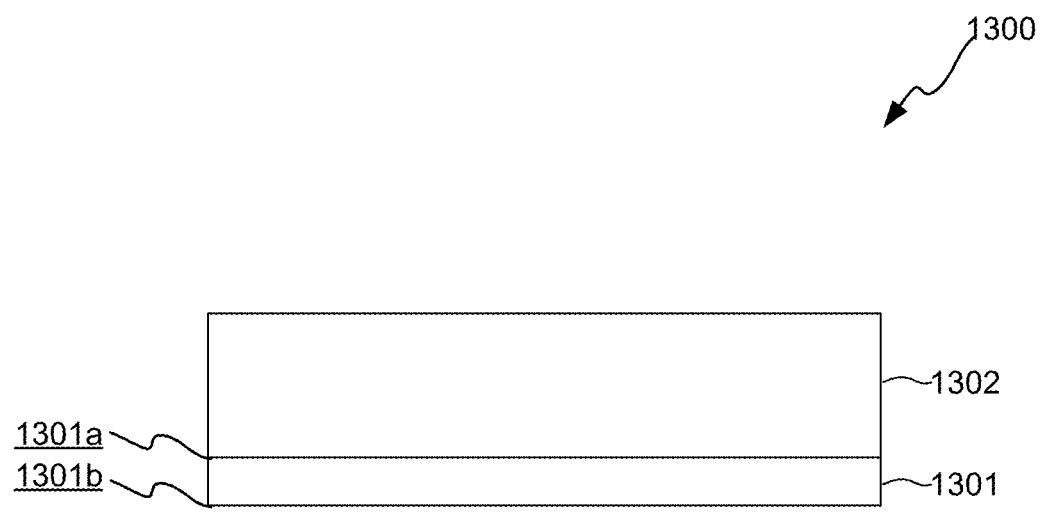

As shown in FIG. 13B, a first III-nitride layer 1302 is epitaxially grown on first side 1301a of III-nitride substrate 1301. For example, first III-nitride layer 1302 may include n-type GaN material, having a dopant concentration of about $1\times10^{14}$ cm$^{-3}$ to $1\times10^{18}$ cm$^{-3}$. In some embodiments, the first III-nitride layer can have a thickness of about 0.5 µm to 100 µm.

Figure 13C:
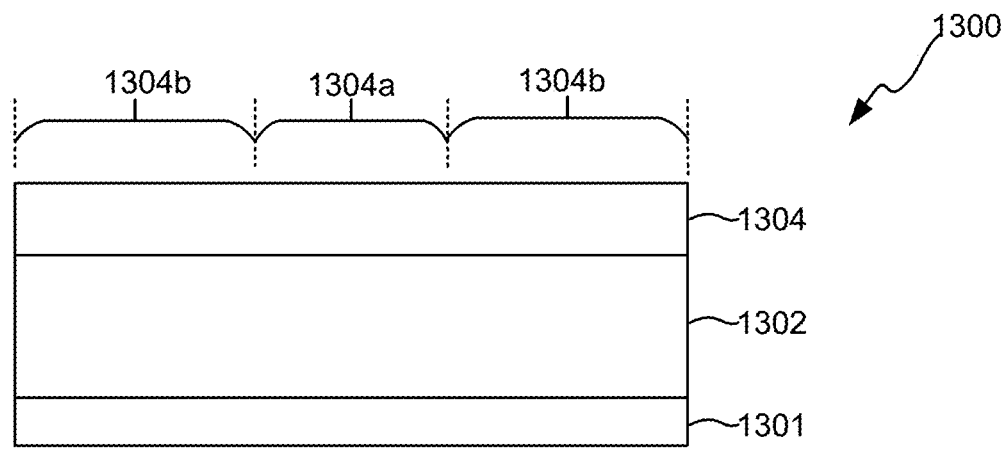

Referring to FIG. 13C, second III-nitride layer 1304 (e.g., a p+ doped III-nitride layer) is epitaxially grown on first III-nitride layer 1302. For example, second III-nitride layer 1304 may include p-type GaN material, having a dopant concentration of about $1\times10^{17}$ cm$^{-3}$ to about $1\times10^{20}$ cm$^{-3}$. In some embodiments, second III-nitride layer 1304 may have a thickness of about 0.01 µm to 5 µm. For clarity of description, second III-nitride layer 1304 include a contact region 1304a and a terminal region 1304b surrounding contact region 1304a.

Figure 13D:
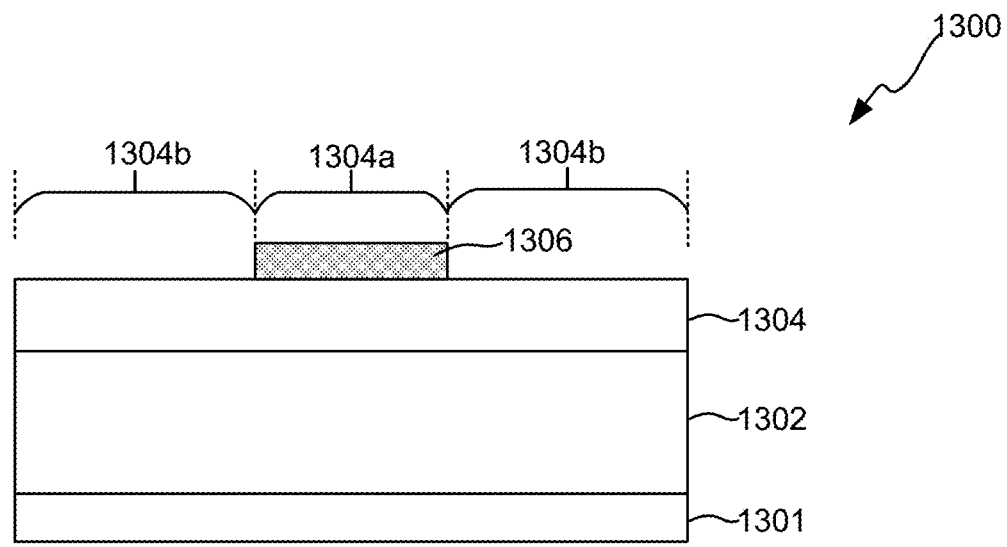

Referring to FIG. 13D, a metal layer 1306 is deposited on contact region 1304a of second III-nitride layer 1304. In some embodiment, metal layer 1306 may include nickel, platinum, palladium, silver, gold, the combination thereof, and the like. Metal layer 1306 makes an ohmic contact with second III-nitride layer 1304.

Figure 13E:
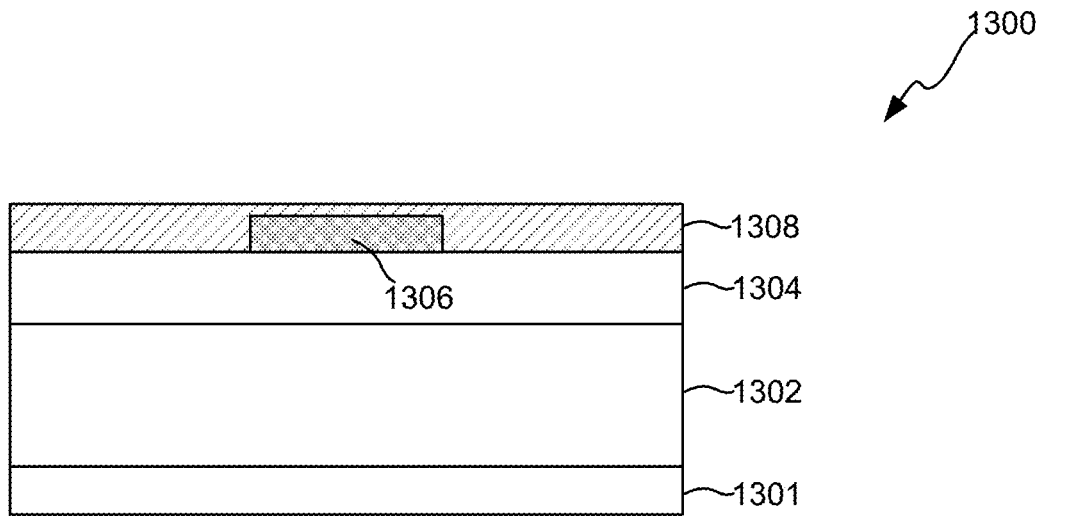

Referring to FIG. 13E, a mask layer 1308 is formed on second III-nitride layer 1304, overlaying metal layer 1306. In some embodiments, mask layer 1308 includes photo-sensitive material, such as photoresist. In some embodiments, mask layer 1308 may include a positive photoresist.

Figure 13F:
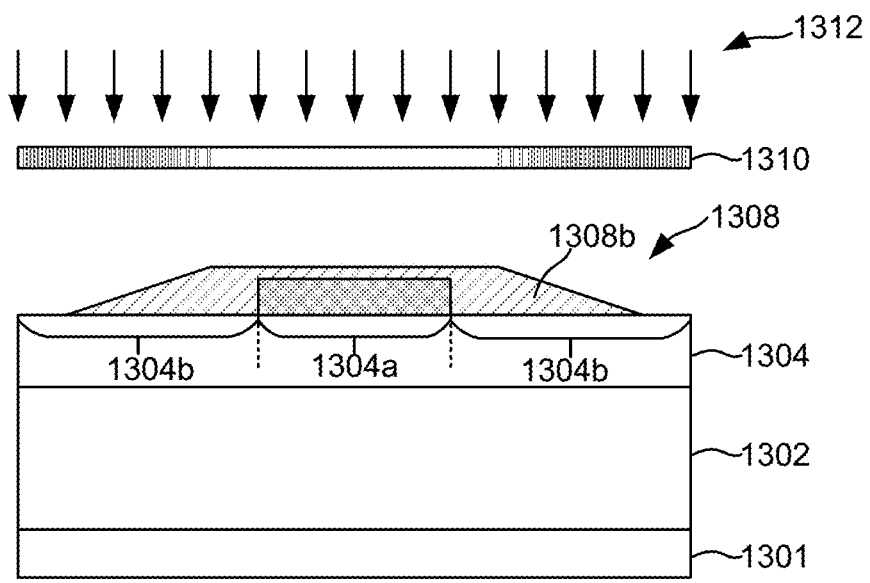

Referring to FIG. 13F, a photolithographic process is performed using a photomask 1310 as a mask to pattern mask layer 1308. In some embodiments, the photomask 1310 is processed using the method as illustrated in FIG. 2D or 2E. Light 1312 (e.g., 365 nm wavelength ultraviolet light) irradiates mask layer 1308 through photomask 1310. After the photolithographic process, a tapered region 1308b is formed in mask layer 1308 that is aligned with a portion of terminal region 1304b of second III-nitride layer 1304.

Figure 13G:
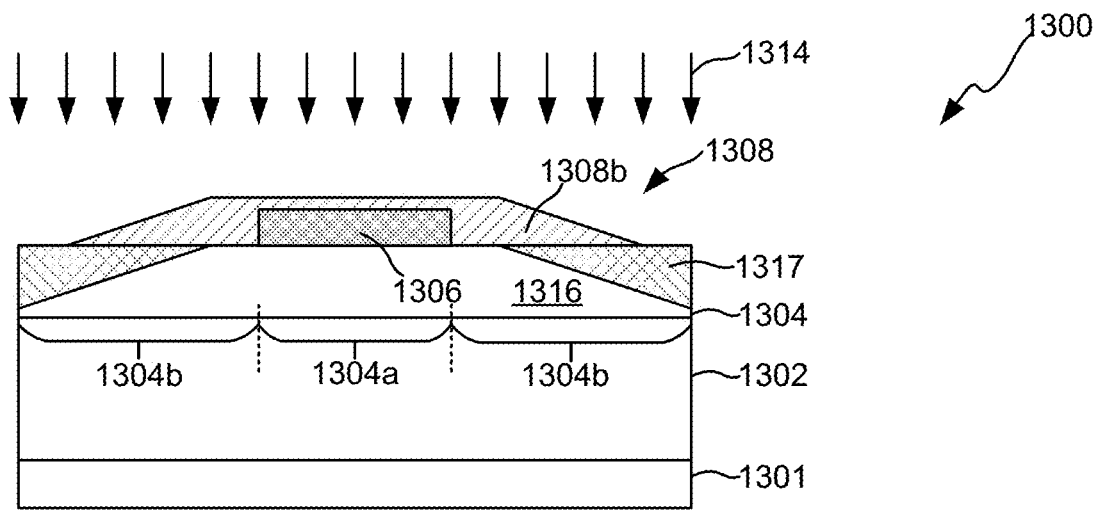

Referring to FIG. 13G, an ion implantation process is performed using mask layer 1308 as a mask. Ion beam 1314 irradiates second III-nitride layer 1304 through mask layer 1308. Due to the presence of tapered region 1308b of mask layer 1308, implanted ions stop in second III-nitride layer 1304 to form an implanted zone 1317 in second III-nitride layer 1304. Thus, tapered junction termination element 1316 is formed. The implanted ion species may be argon, nitrogen, helium, hydrogen, or other appropriate species that reduce the electrical conductivity in second III-nitride layer 1304.

Figure 13H:
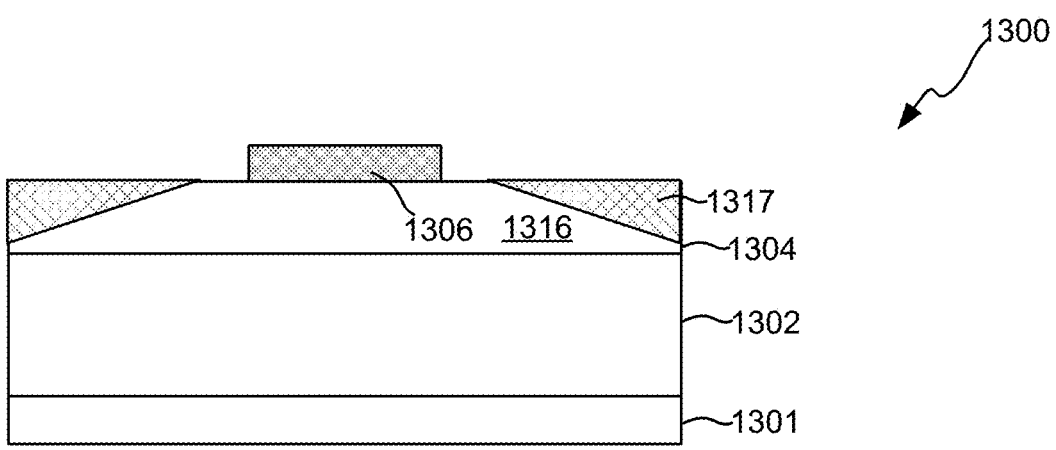

Referring to FIG. 13H, mask layer 1308 (shown in FIG. 13G) is removed after the ion implantation process. In some embodiments, mask layer 1308 is removed by wet etching or dry etching using one or more processing techniques. For example, mask layer 1308 may be removed by plasma ashing in an oxygen plasma, followed by a wet clean treatment such as a sulfuric acid/hydrogen peroxide mixture at 65-120° C.

Figure 13I:
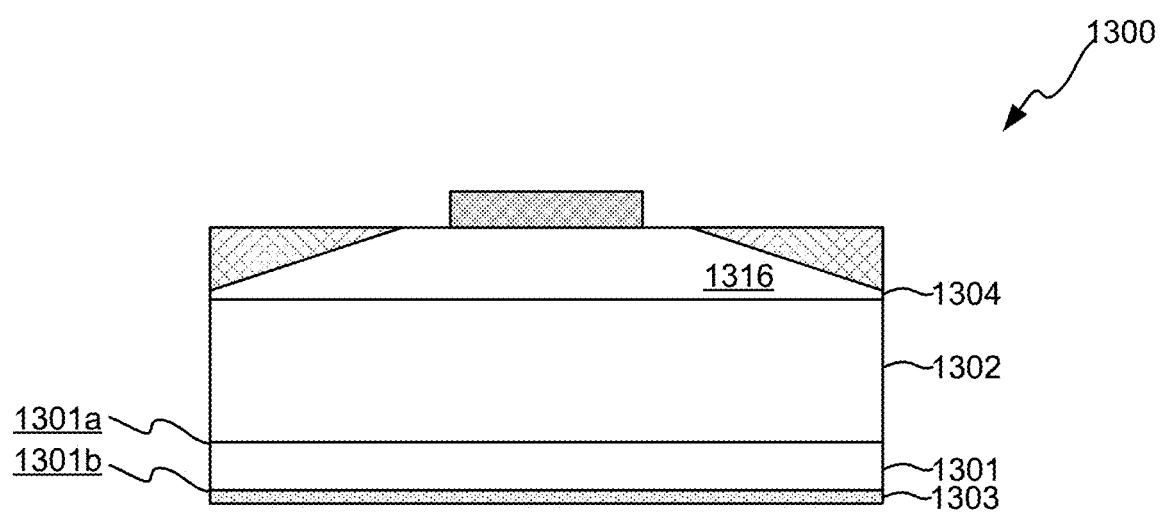

Referring to FIG. 13I, a metal layer 1303 is formed on second side 1301b of III-nitride substrate 1301. For example, metal layer 1303 may include a titanium-aluminum (Ti/Al) metal.

Figure 14:
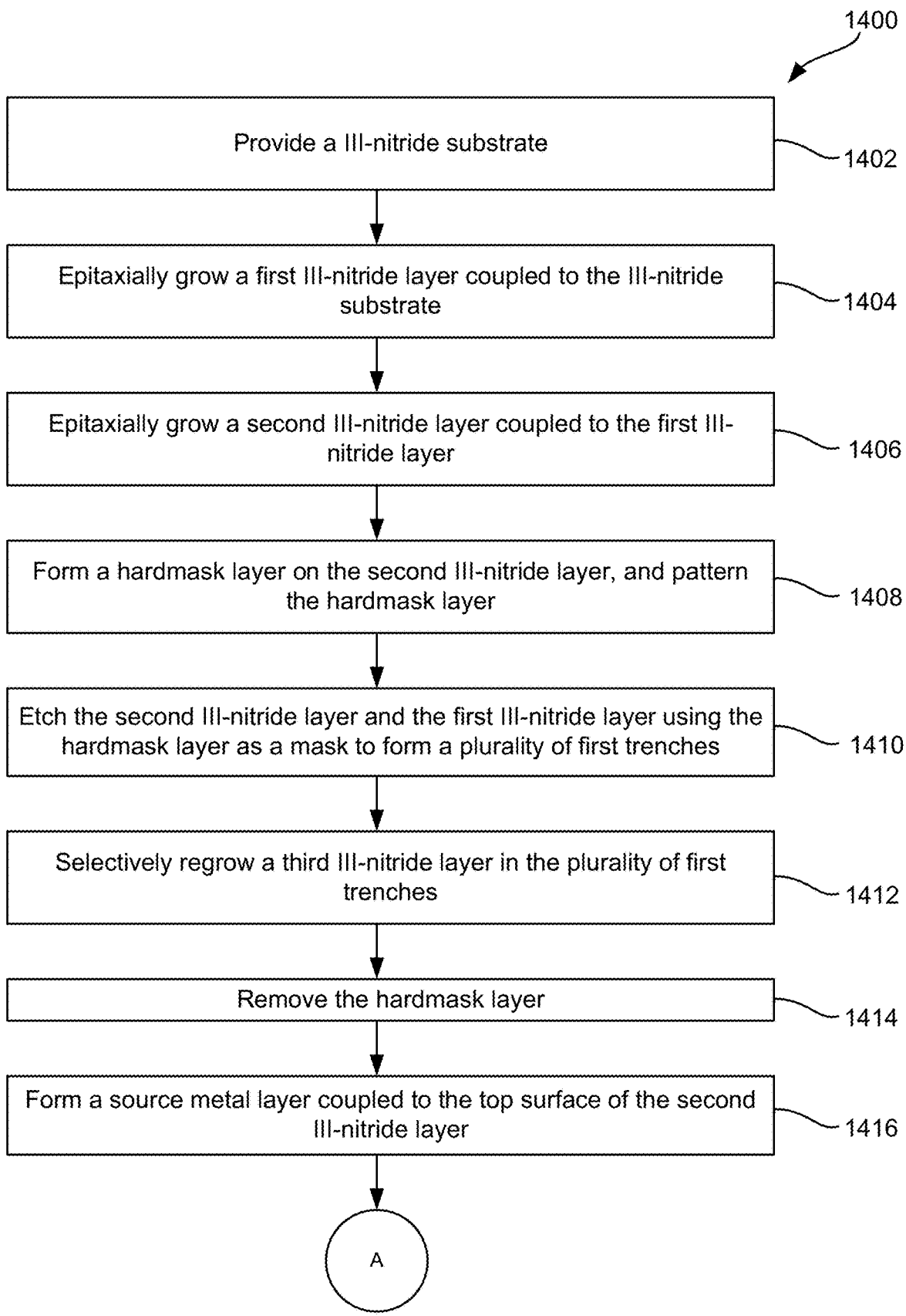
FIG. 14 illustrates a method for manufacturing a semiconductor device according to an embodiment of the present invention.
Figure 14:
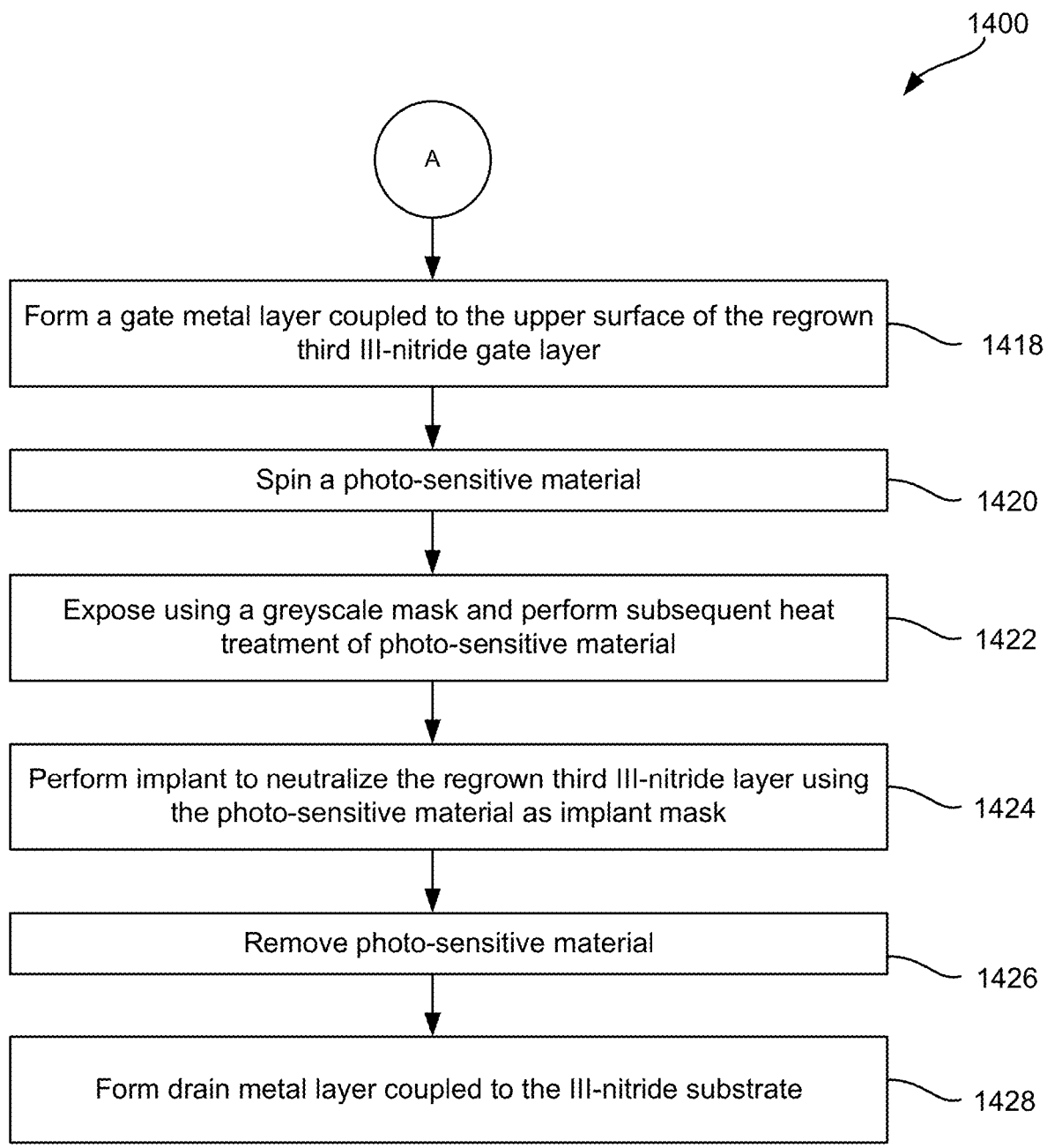

FIG. 14 illustrates a method for manufacturing a semiconductor device according to an embodiment of the present invention. For example, the semiconductor device may include a vertical JFET device. Method 1400 may include providing a III-nitride substrate having a first side and second side (1402). The III-nitride substrate is characterized by a first conductivity type. For example, the III-nitride substrate may include n+ type GaN material, having a dopant concentration of about $1 \times 10^{17}$ cm$^{-3}$ to $1 \times 10^{19}$ cm$^{-3}$.

Method 1400 includes epitaxially growing a first III-nitride layer coupled to the first side of the III-nitride substrate (1404). In some embodiments, the first III-nitride layer is characterized by the first conductivity type. For example, the first III-nitride layer may include n-type GaN material, having a dopant concentration of about $1 \times 10^{14}$ cm$^{-3}$ to $1 \times 10^{18}$ cm$^{-3}$. In some embodiments, the first III-nitride layer can have a thickness of about 0.5 μm to 100 μm.

Next, method 1400 may include epitaxially growing a second III-nitride layer coupled to the first III-nitride layer (1406). In some embodiments, the second III-nitride layer is characterized by the first conductivity type. For example, the second III-nitride layer may include n-type GaN material, having a dopant concentration of about $5 \times 10^{16}$ cm$^{-3}$ to about $1 \times 10^{18}$ cm$^{-3}$. In some embodiments, the second III-nitride layer may have a thickness of about 0.1 μm to 2 μm.

Then, method 1400 may include forming a hardmask layer on the second III-nitride layer, and patterning the hardmask layer (1408). In some embodiments, a composite hard mask is formed by depositing a metal layer and then a dielectric layer to form the composite hard mask. In these embodiments, as will be evident to one of skill in the art, the composite hard mask is then patterned prior to performing etching processes.

Method 1400 may further include etching the second III-nitride layer and the first III-nitride layer using the hardmask layer as a mask to form a plurality of first trenches (1410). Specifically, the etching process may be performed through the second III-nitride layer and continue to extend into a portion of the thickness of the first III-nitride layer.

Method 1400 may further include selectively regrowing a third III-nitride layer in the plurality of first trenches (1412). In some embodiments, the third III-nitride layer is characterized by a second conductivity type opposite the first conductivity type. In one embodiment, the third III-nitride layer may include p-type doped GaN with a dopant concentration in the range of about $1 \times 10^{18}$ atoms/cm$^3$ to $5 \times 10^{19}$ atoms/cm$^3$. In some embodiments, the third III-nitride layer is selectively regrown to complete fill the plurality of first trenches. In this embodiment, the upper surface of the third III-nitride layer is planar with the upper surface of the second III-nitride layer. In some embodiments, the third III-nitride layer may include an active region in which the second III-nitride layer is deposited, and a terminal region is formed adjacent the active region. Then method 1400 may include removing the hardmask layer (1414).

Method 1400 may further include forming a source metal layer coupled to the top surface of the second III-nitride layer (1416). In some embodiments, the source metal layer may include a refractory metal, a refractory metal compound or a refractory metal alloy (e.g., TiN).

Method 1400 may further include forming a gate metal layer coupled to the upper surface of the regrown third III-nitride gate layer (1418). In some embodiments, the gate metal layer may include molybdenum, gold, nickel, platinum, tantalum, tungsten, palladium, silver, aluminum, combinations thereof, and the like.

Next, method 1400 may include a process of forming a tapered termination element using a greyscale mask. Method 1400 may include spinning a photo-sensitive material (1420). Specifically, the photo-sensitive material is spun on the third III-nitride layer, overlaying the source metal layer and the gate metal layer. In some embodiments, the photo-sensitive material may include a photoresist that can be patterned using a photolithography process.

Method 1400 may further include exposing using a greyscale mask and performing subsequent heat treatment of photo-sensitive material (1422). Specifically, the photo-sensitive material can be processed using the methods illustrated referring to FIG. 2D or 2E. After the processing, the photo-sensitive material is patterned with a planar region aligned with the active region of the third III-nitride layer, and a tapered region aligned with the terminal region of the third III-nitride layer.

Then, method 1400 may further include performing an ion implantation process to neutralize the regrown third III-nitride layer using the photo-sensitive material as an implant mask (1424). Specifically, method 1400 may include implanting ions into the terminal region of the third III-nitride layer using the photo-sensitive material as a mask to form a tapered junction termination element in the terminal region of the third III-nitride layer. In some embodiments, the implanted ions stop in the third III-nitride layer to form an implanted zone that is characterized by a conductivity less than a conductivity of the third III-nitride layer. In some embodiments, the implanted ion species may be argon, nitrogen, helium, hydrogen, oxygen, silicon, or other appropriate species that reduce the electrical conductivity in the third III-nitride layer.

Next, method 1400 may include removing the photo-sensitive material (1426). It should be noted the process of forming the tapered termination element using the greyscale mask can be moved around in the process flow, such as being performed at different stages in the method 1400 as appropriate to particular applications.

Method 1400 may further include forming a drain metal layer coupled to III-nitride substrate (1428), for example, on the backside of the III-nitride substrate. Specifically, the drain metal layer may be formed on the second side of the III-nitride substrate. In some embodiments, the drain metal layer may include a titanium-aluminum (Ti/Al) metal.

It should be appreciated that the specific steps illustrated in FIG. 14 provide a particular method for manufacturing a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIG. 14 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 15A:
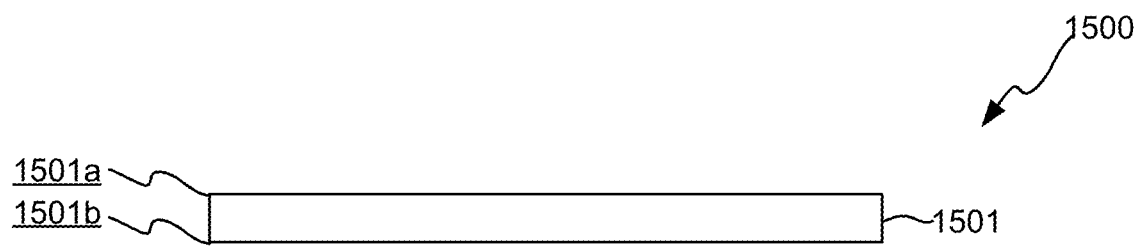
FIGS. 15A-15N illustrate the intermediate stages of a method for manufacturing a semiconductor device according to some embodiments of the present invention.
Figure 15B:
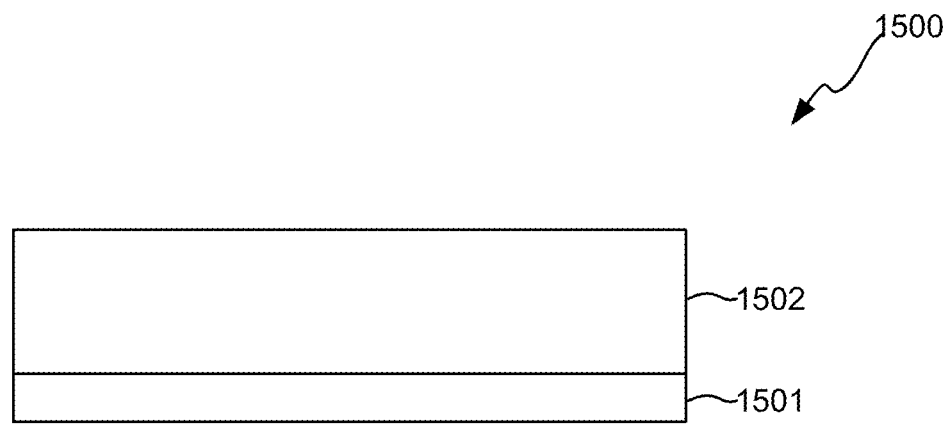
Figure 15C:
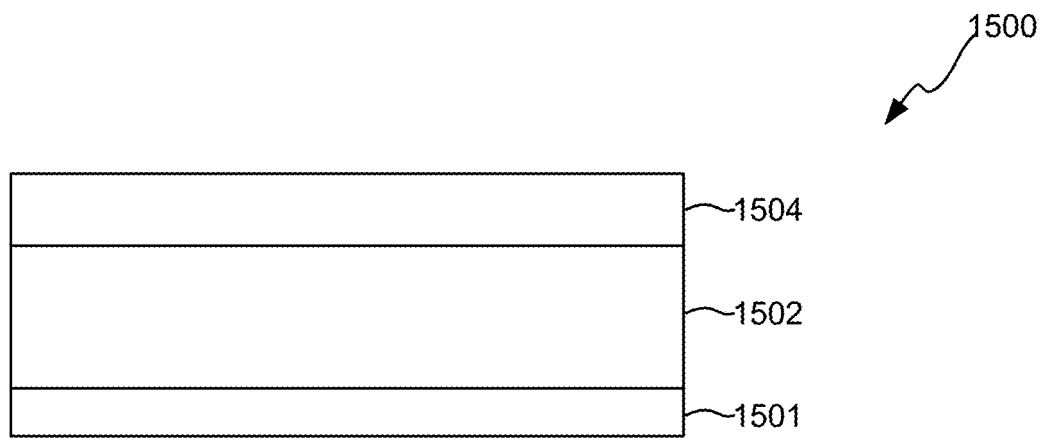
Figure 15D:
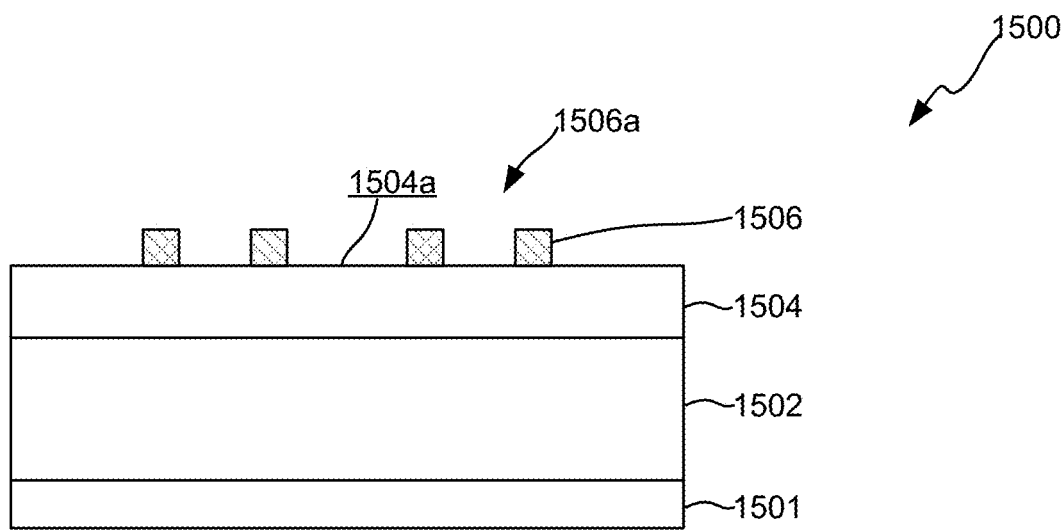
Figure 15E:
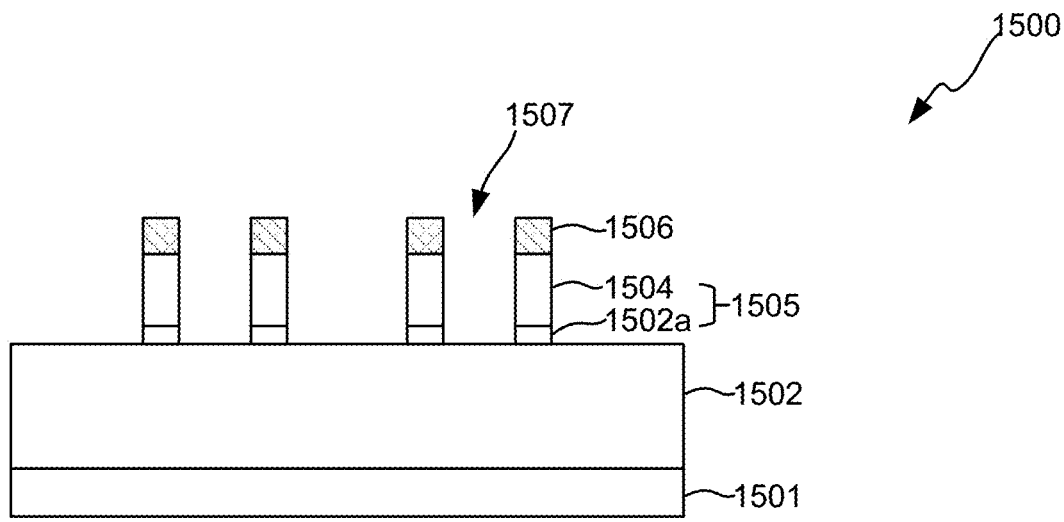
Figure 15F:
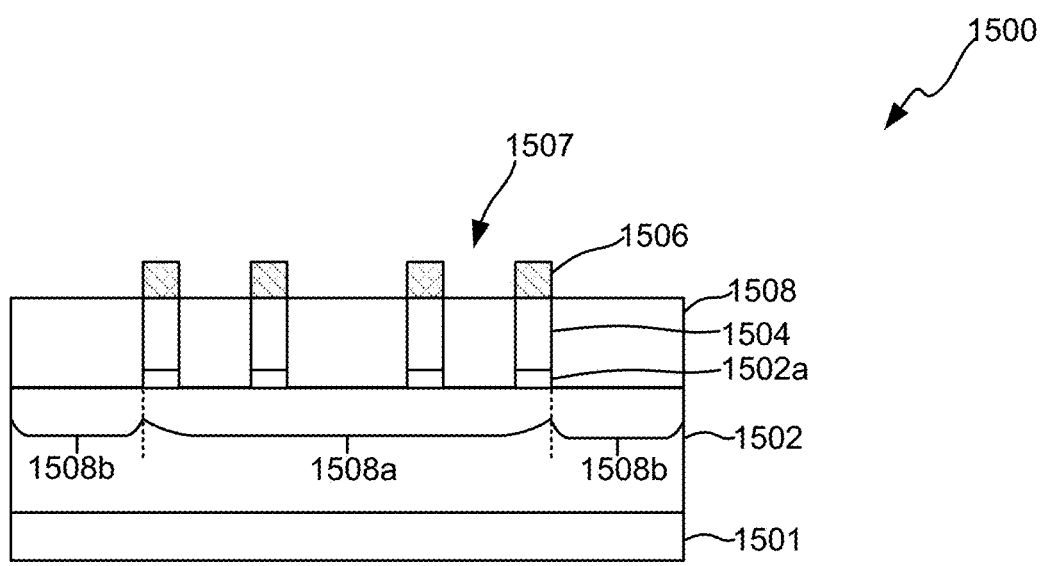
Figure 15G:
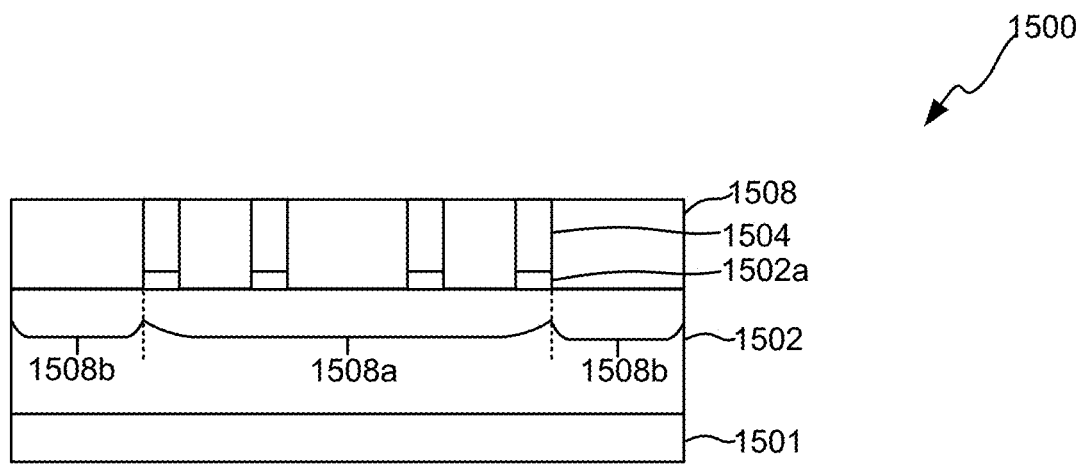
Figure 15H:
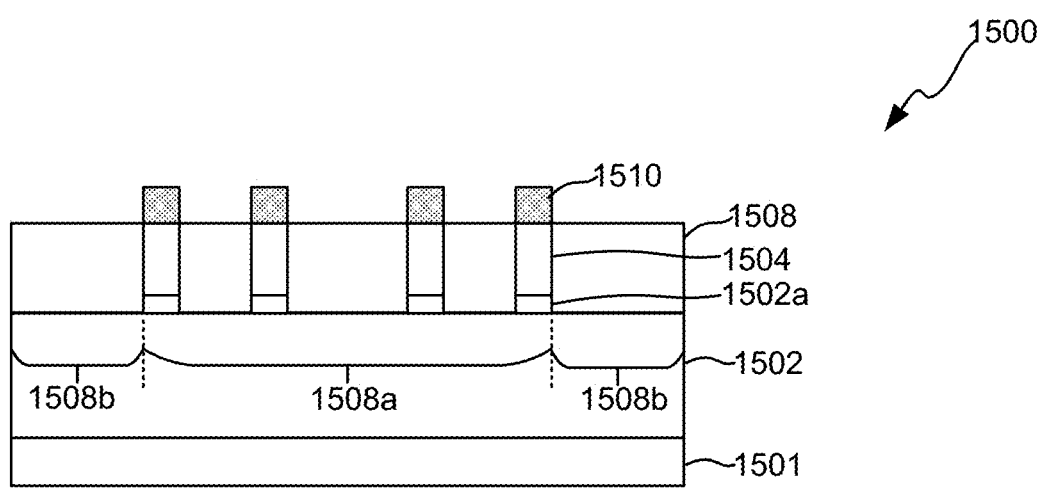
Figure 15I:
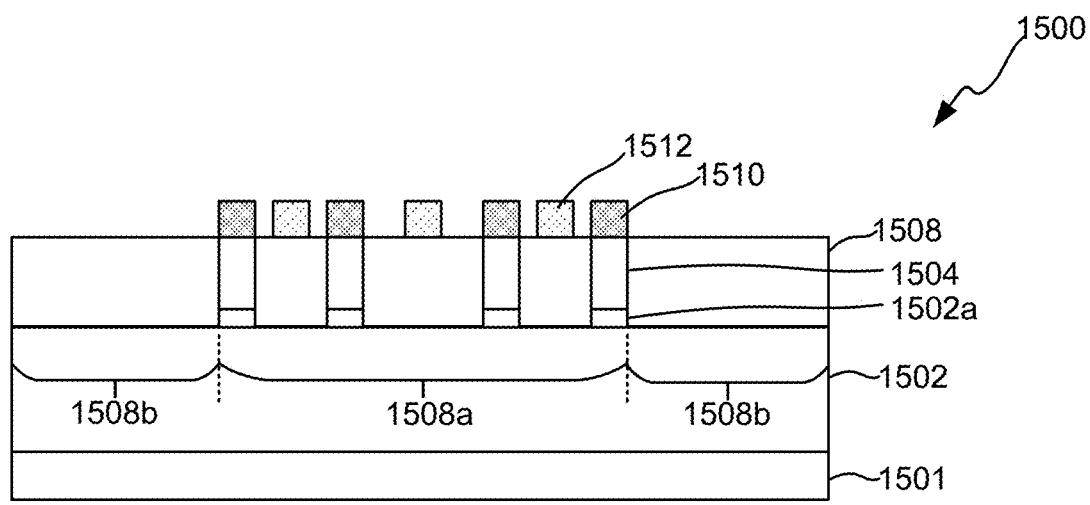
Figure 15J:
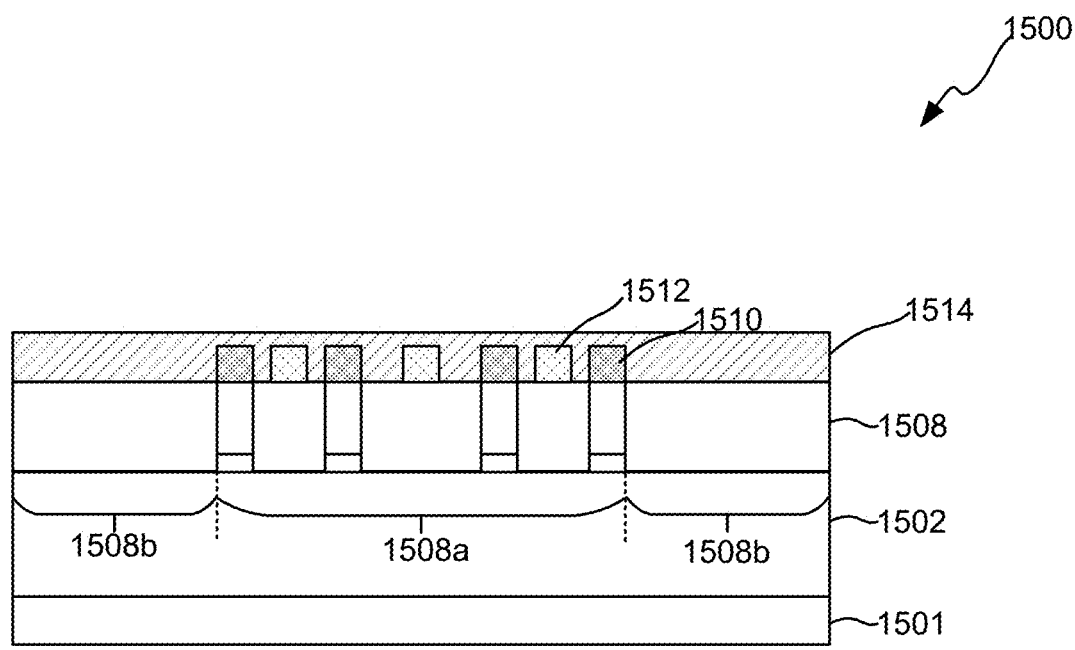
Figure 15K:
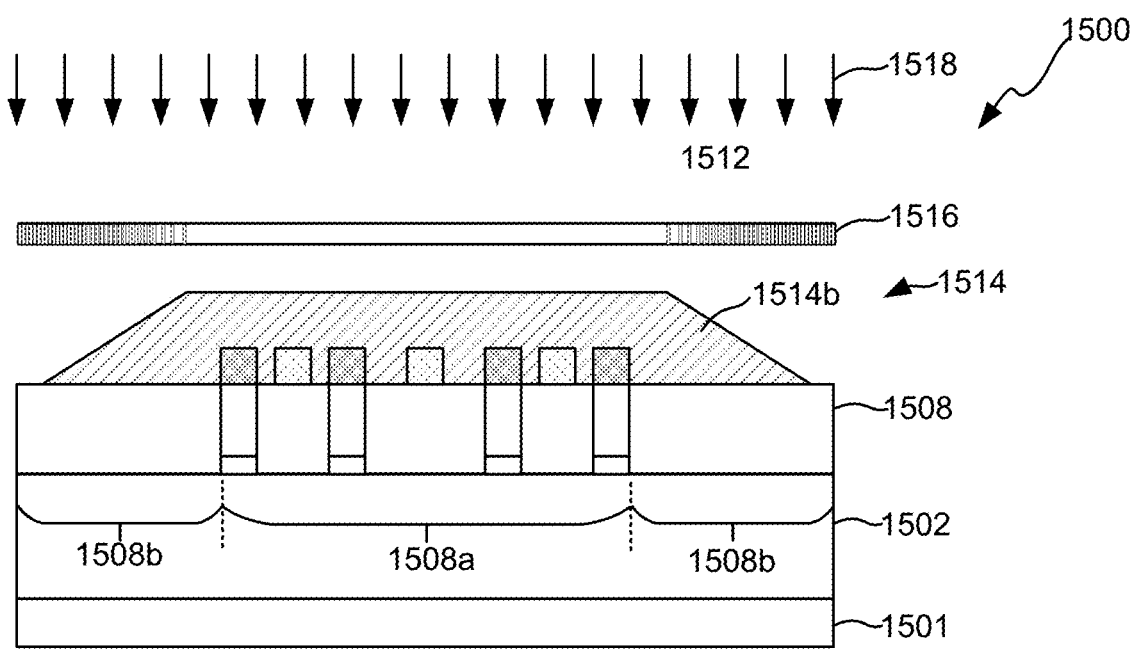
Figure 15L:
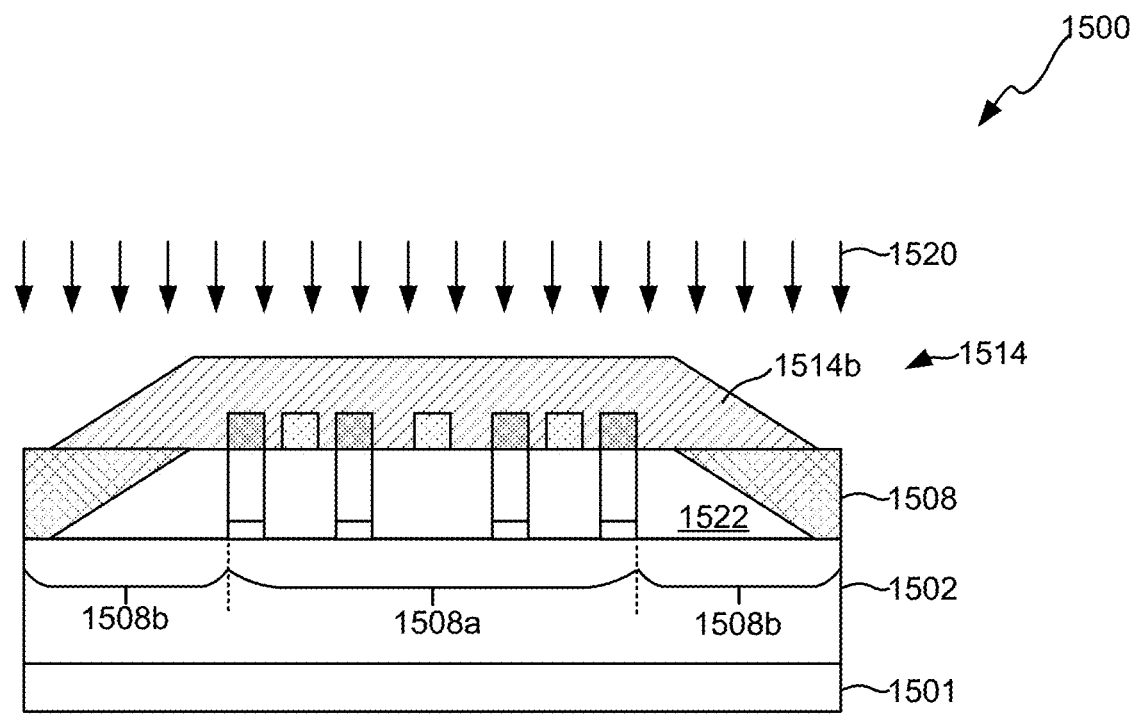
Figure 15M:
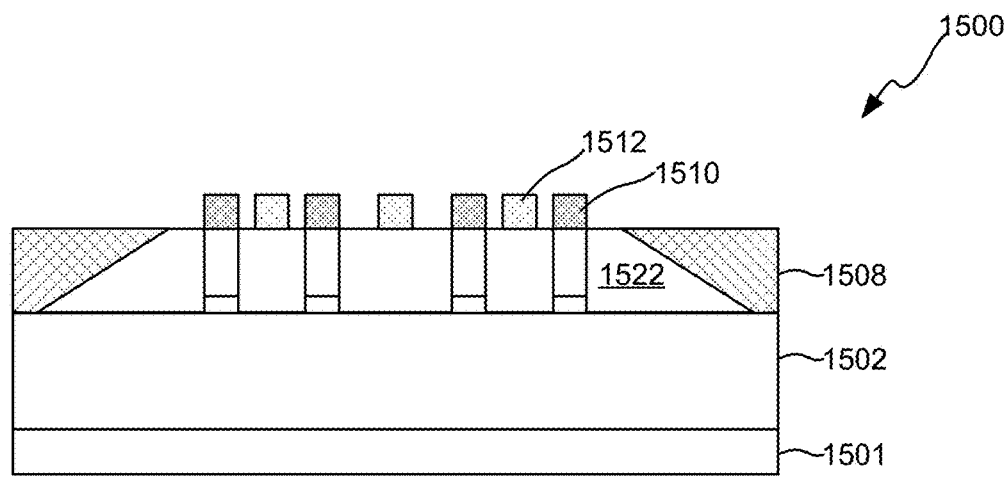
Figure 15N:
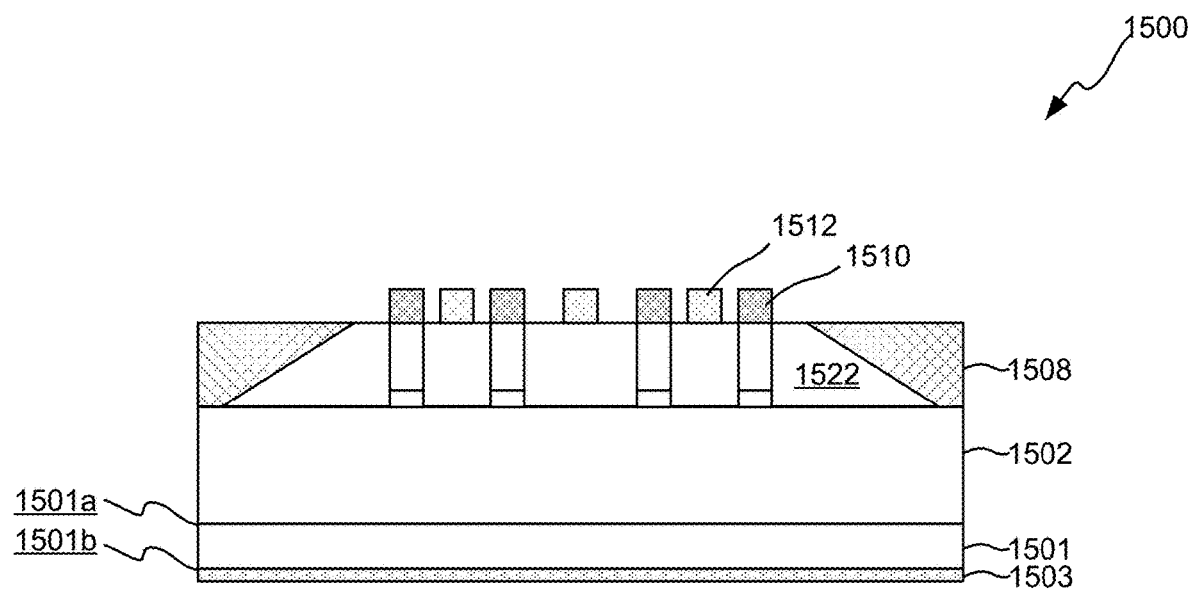

FIGS. 15A-15N illustrate the intermediate stages of a method for manufacturing a semiconductor device according to some embodiments of the present invention. For example, the semiconductor device may include a vertical JFET device. FIG. 15A illustrates a partial cross-sectional view of semiconductor device 1500 having III-nitride substrate 1501 (e.g., an n+ doped III-nitride substrate) with first side 1501a and second side 1501b.

As shown in FIG. 15B, a first III-nitride layer 1502 is epitaxially grown on first side 1501a of III-nitride substrate 1501. For example, first III-nitride layer 1502 may include n-type GaN material, having a dopant concentration of about $1 \times 10^{14}$ cm$^{-3}$ to $1 \times 10^{18}$ cm$^{-3}$. In some embodiments, the first III-nitride layer can have a thickness of about 0.5 μm to 100 μm.

Referring to FIG. 15C, second III-nitride layer 1504 (e.g., an n+ doped second III-nitride layer) is epitaxially grown on first III-nitride layer 1502. For example, second III-nitride layer 1504 may include n-type GaN material, having a dopant concentration of about $5 \times 10^{16}$ cm$^{-3}$ to about $1 \times 10^{18}$ cm$^{-3}$. In some embodiments, second III-nitride layer 1504 may have a thickness of about 0.5 μm to 15 μm.

Referring to FIG. 15D, a hardmask layer 1506 is formed on second III-nitride layer 1504. Hardmask layer 1506 comprises a set of openings 1506a operable to expose an upper surface portion 1504a of second III-nitride layer 1504.

Referring to FIG. 15E, an etching process is performed using hardmask layer 1506 as a mask to etch second III-nitride layer 1504. In some embodiments, the etching process may etch through the thickness of second III-nitride layer 1504, and continue to etch a portion of first III-nitride layer 1502, for example, etching 0.01 μm to 0.3 μm of first III-nitride layer 1502. After the etching process, a plurality of fins 1505 are formed. As shown in FIG. 15E, fin 1505 may include materials from second III-nitride layer 1504 and a portion 1502a of first III-nitride layer 1502. Each of the plurality of fins 1505 is separated by one of a plurality of first trenches 1507.

Referring to FIG. 15F, a third III-nitride layer 1508 is selectively regrown in the plurality of first trenches 1507. In some embodiments, third III-nitride layer 1508 is coplanar with the upper surface of second III-nitride layer 1504. In some embodiments, third III-nitride layer 1508 may include p-type doped GaN with a dopant concentration in the range of about $5 \times 10^{17}$ atoms/cm$^3$ to $5 \times 10^{19}$ atoms/cm$^3$. In some embodiments, third III-nitride layer 1508 is selectively regrown to complete fill the plurality of first trenches 1507. For clarity of description, third III-nitride layer 1508 may include an active region 1508a in which the plurality of fins 1505 are disposed, and a terminal region 1508b adjacent active region 1508a.

Referring to FIG. 15G, hardmask layer 1506 (shown in FIG. 15D) is removed.

Referring to FIG. 15H, a source metal layer 1510 is formed to the top surface of second III-nitride layer 1504. In some embodiments, source metal layer 1510 may include a refractory metal, a refractory metal compound or a refractory metal alloy (e.g., TiN).

Referring to FIG. 15I, a gate metal layer 1512 is formed on the upper surface of the regrown third III-nitride layer 1508. In some embodiments, gate metal layer 1512 may include molybdenum, gold, nickel, platinum, tantalum, tungsten, palladium, silver, aluminum, combinations thereof, and the like.

Referring to FIG. 15J, a mask layer 1514 is formed on third III-nitride layer 1508, overlaying source metal layer 1510 and gate metal layer 1512. In some embodiments, mask layer 1514 includes a photo-sensitive material, such as photoresist. In some embodiments, mask layer 1514 may include a positive photoresist.

Referring to FIG. 15K, a photolithographic process is performed using a photomask 1516 as a mask to pattern mask layer 1514. In some embodiments, the photomask 1516 is processed using the method as illustrated in FIG. 2D or 2E. Light 1518 (e.g., 365 nm wavelength ultraviolet light) irradiates mask layer 1514 through photomask 1516. After the photolithographic process, a tapered region 1514b is formed in mask layer 1514 that is aligned with a portion of terminal region 1508b of third III-nitride layer 1508.

Referring to FIG. 15L, an ion implantation process is performed using mask layer 1514 as a mask. Ion beam 1520 irradiates third III-nitride layer 1508 through mask layer 1514. Due to tapered region 1514b of mask layer 1514, implanted ions stop in third III-nitride layer 1508 to form a tapered junction termination element 1522. The implanted ion species may be argon, nitrogen, helium, oxygen, silicon, or other appropriate species that reduce the electrical conductivity in third III-nitride layer 1508.

Referring to FIG. 15M, mask layer 1514 (shown in FIG. 15L) is removed after the ion implantation process. In some embodiments, mask layer 1514 is removed by wet etching or dry etching using one or more processing techniques. For example, mask layer 1514 may be removed by ashing in an oxygen plasma, followed by a wet clean treatment such as a sulfuric acid/hydrogen peroxide mixture at 65-120° C.

Referring to FIG. 15N, a metal layer 1503 is formed on second side 1501b of III-nitride substrate 1501. For example, metal layer 1503 may include a titanium-aluminum (Ti/Al) metal.

Figure 16:
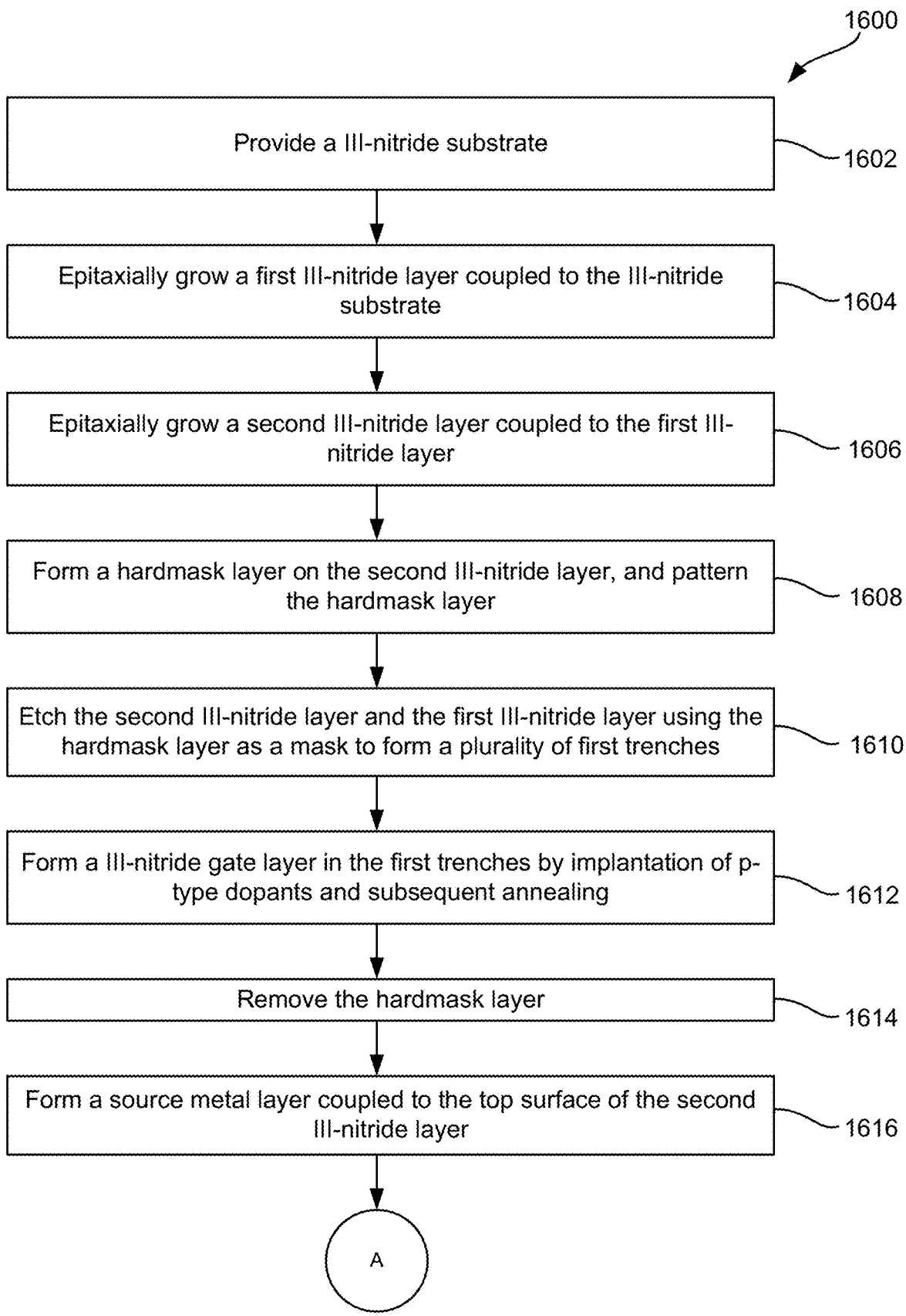
FIG. 16 illustrates a method for manufacturing a semiconductor device according to an embodiment of the present invention.
Figure 16:
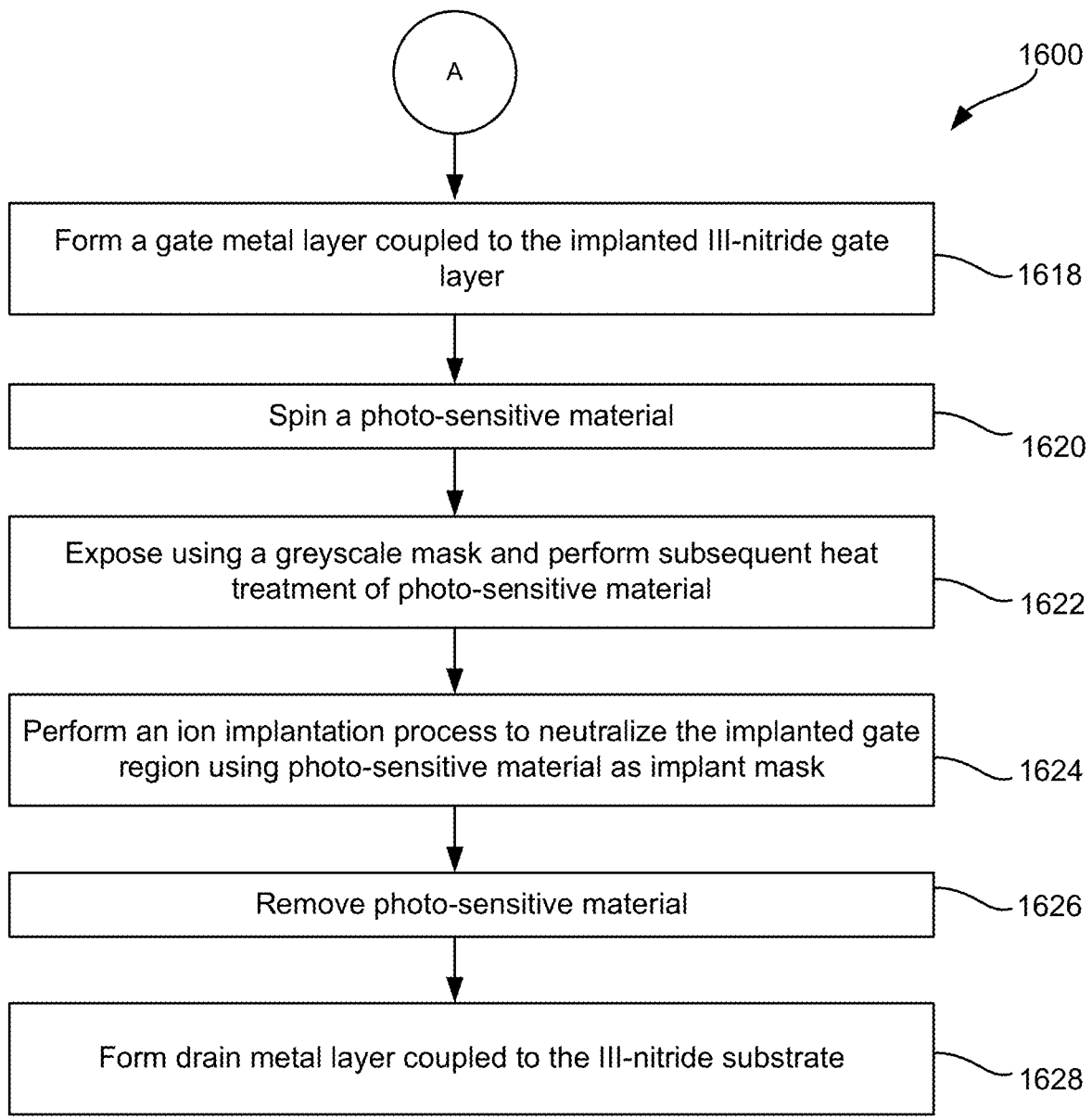

FIG. 16 illustrates a method for manufacturing a semiconductor device according to an embodiment of the present invention. For example, the semiconductor device may include a vertical JFET device. In some embodiments, method 1600 includes providing a III-nitride substrate having a first side and second side (1602). The III-nitride substrate is characterized by a first conductivity type. For example, the III-nitride substrate may include n+ type GaN material, having a dopant concentration of about $1 \times 10^{17}$ cm$^{-3}$ to $1 \times 10^{19}$ cm$^{-3}$.

Method 1600 includes epitaxially growing a first III-nitride layer coupled to the first side of the semiconductor substrate (1604). In some embodiments, the first III-nitride layer is characterized by the first conductivity type. For example, the first III-nitride layer may include n-type GaN material, having a dopant concentration of about $1 \times 10^{14}$ cm$^{-3}$ to $1 \times 10^{18}$ cm$^{-3}$. In some embodiments, the first III-nitride layer can have a thickness of about 0.5 μm to 100 μm.

Next, method 1600 may include epitaxially growing a second III-nitride layer coupled to the first III-nitride layer (1606). In some embodiments, the second III-nitride layer is characterized by the first conductivity type. For example, the second III-nitride layer may include n-type GaN material, having a dopant concentration of about $5 \times 10^{16}$ cm$^{-3}$ to about $1 \times 10^{18}$ cm$^{-3}$. In some embodiments, the second III-nitride layer may have a thickness of about 0.1 µm to 2 µm.

Then, method 1600 may include form a hardmask layer on the second III-nitride layer, and patterning the hardmask layer (1608). In some embodiments, a composite hard mask is formed by depositing a metal layer and then a dielectric layer to form the composite hard mask. In these embodiments, as will be evident to one of skill in the art, the composite hard mask is then patterned prior to performing etching processes.

Method 1600 may further include etching the second III-nitride layer and the first III-nitride layer using the hardmask layer as a mask to form a plurality of first trenches (1610). Specifically, the etching process may be performed through the second III-nitride layer and continue to extend into a portion of the thickness of the first III-nitride layer.

Method 1600 may further include forming a III-nitride gate layer in the first trenches by implantation of p-type dopants and subsequent annealing (1612). Specifically, an ion implantation process is performed to implant ions into the plurality of first trenches. In some embodiments, the implanted III-nitride gate layer is formed at the bottom of the first trenches. In other words, the implanted III-nitride gate layer is formed within the first III-nitride layer. In some embodiments, the ion implantation process may also implant ions into a contiguous portion of the sidewall of the first trenches. In other words, in these embodiments, the implanted III-nitride gate layer is formed within a portion of the second III-nitride layer that is exposed within the plurality of the first trenches. In some embodiments, the implanted III-nitride gate layer is characterized by a second conductivity type opposite to the first conductivity type. In one embodiment, the III-nitride gate layer may include p-type doped GaN with a dopant concentration in the range of about $5 \times 10^{17}$ atoms/cm$^3$ to $5 \times 10^{19}$ atoms/cm$^3$.

In some embodiments, the implanted gate region is formed by ion-implantation of a p-type dopant, such as Mg, Be or Zn, followed by a high-temperature anneal process. In some such embodiments, the implanted surface is encapsulated by a dielectric (e.g., silicon nitride, aluminum nitride, silicon-aluminum nitride, etc.) prior to the high-temperature anneal, and then the encapsulation dielectric is removed after the anneal. Then method 1600 may include removing the hardmask layer (1614).

Method 1600 may further include forming a source metal layer coupled to the top surface of the second III-nitride layer (1616). In some embodiments, the source metal layer may include a refractory metal, a refractory metal compound or a refractory metal alloy (e.g., TiN).

Method 1600 may further include forming a gate metal layer coupled to the implanted III-nitride gate layer (1618). Specifically, the gate metal layer is formed within the plurality of first trenches, and is coupled to the III-nitride gate layer. In some embodiments, the gate metal layer may include molybdenum, gold, nickel, platinum, tantalum, tungsten, palladium, silver, aluminum, combinations thereof, and the like.

Next, method 1600 may include a process of forming a tapered termination element using a greyscale mask. Method 1600 may include spinning a photo-sensitive material (1620). Specifically, the photo-sensitive material is spun on the implanted III-nitride gate layer, overlaying the source metal layer, the gate metal layer. In some embodiments, the photo-sensitive material may include a photoresist that can be patterned using a photolithography process.

Method 1600 may further include exposing using a greyscale mask and performing subsequent heat treatment of photo-sensitive material (1622). Specifically, the photo-sensitive material can be processed using the method illustrated referring to FIG. 2D or 2E. For clarity of description, the area on the implanted III-nitride gate layer including the source metal layer, and the gate metal layer may be referred to as the active region, and the area on the implanted III-nitride gate layer adjacent the active region may be referred to as the terminal region. After the processing, the photo-sensitive material is patterned with a planar region aligned with the active region, and a tapered region aligned with the terminal region of the implanted III-nitride gate layer.

Then, method 1600 may further include performing an ion implantation process to neutralize the implanted gate region using the photo-sensitive material as an implant mask (1624). Specifically, method 1600 may include implanting ions into the terminal region of the implanted III-nitride gate layer using the photo-sensitive material as a mask to form a tapered junction termination element in the terminal region of the implanted III-nitride gate layer. In some embodiments, the implanted ions stop in the III-nitride gate layer to form an implanted zone that is characterized by a conductivity less than a conductivity of the implanted III-nitride gate layer. In some embodiments, the implanted ion species may be argon, nitrogen, helium, oxygen, silicon, or other appropriate species that reduce the electrical conductivity in the implanted gate region.

Next, method 1600 may include removing the photo-sensitive material (1626). It should be noted the process of forming the tapered termination element using the greyscale mask can be moved around in process flow, such as being performed at different stages in the method 1600 as appropriate to particular applications.

Method 1600 may further include forming a drain metal layer coupled to the III-nitride substrate (1628), for example on the backside of the III-nitride substrate. Specifically, the drain metal layer may be formed to the second side of the III-nitride substrate. In some embodiments, the drain metal layer may include a titanium-aluminum (Ti/Al) metal.

It should be appreciated that the specific steps illustrated in FIG. 16 provide a particular method for manufacturing a semiconductor device region according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 17A:
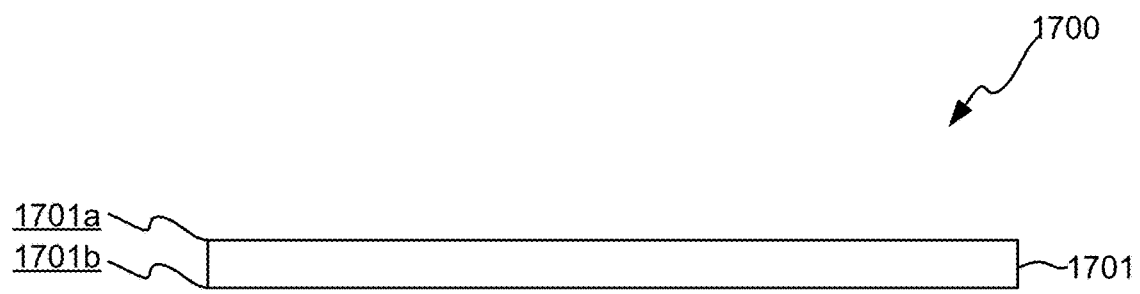
FIGS. 17A-17N illustrate the intermediate stages of a method for manufacturing a semiconductor device according to some embodiments of the present invention.
Figure 17B:
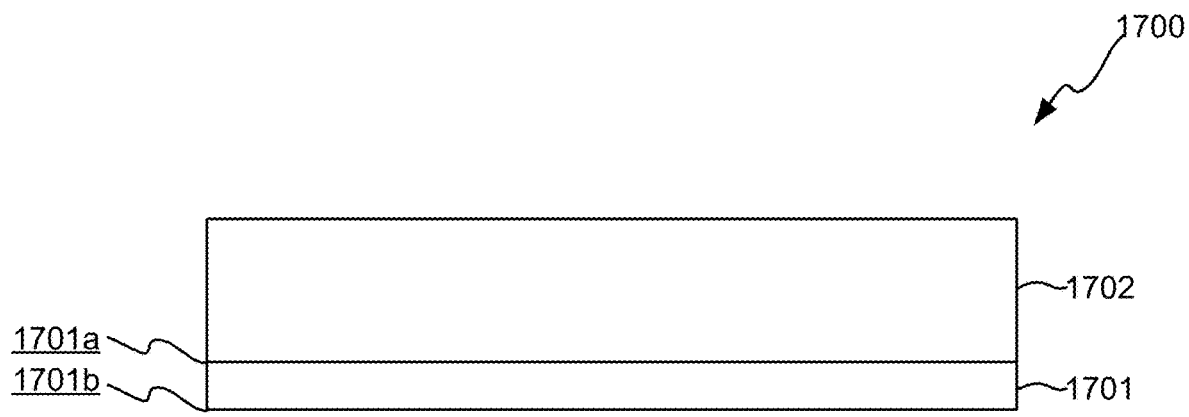
Figure 17C:
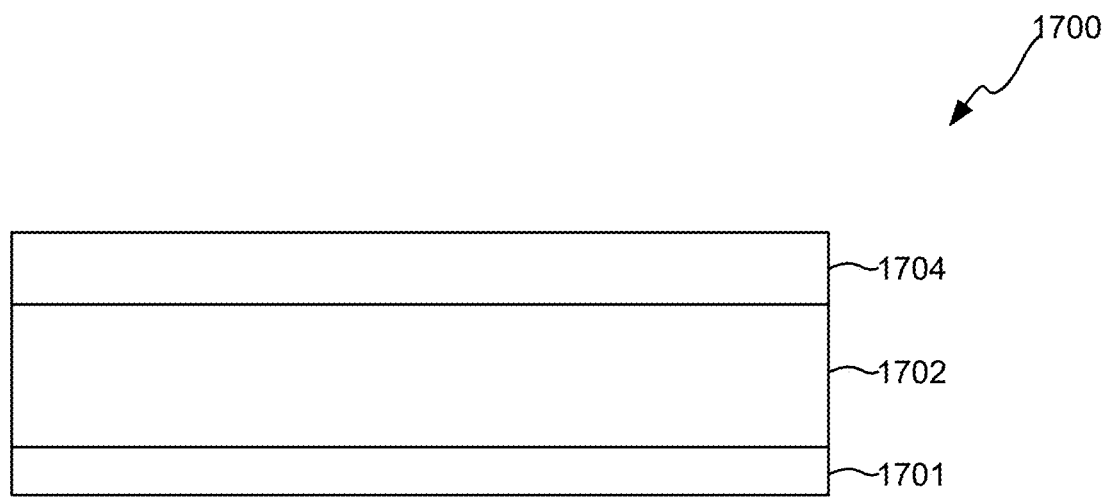
Figure 17D:
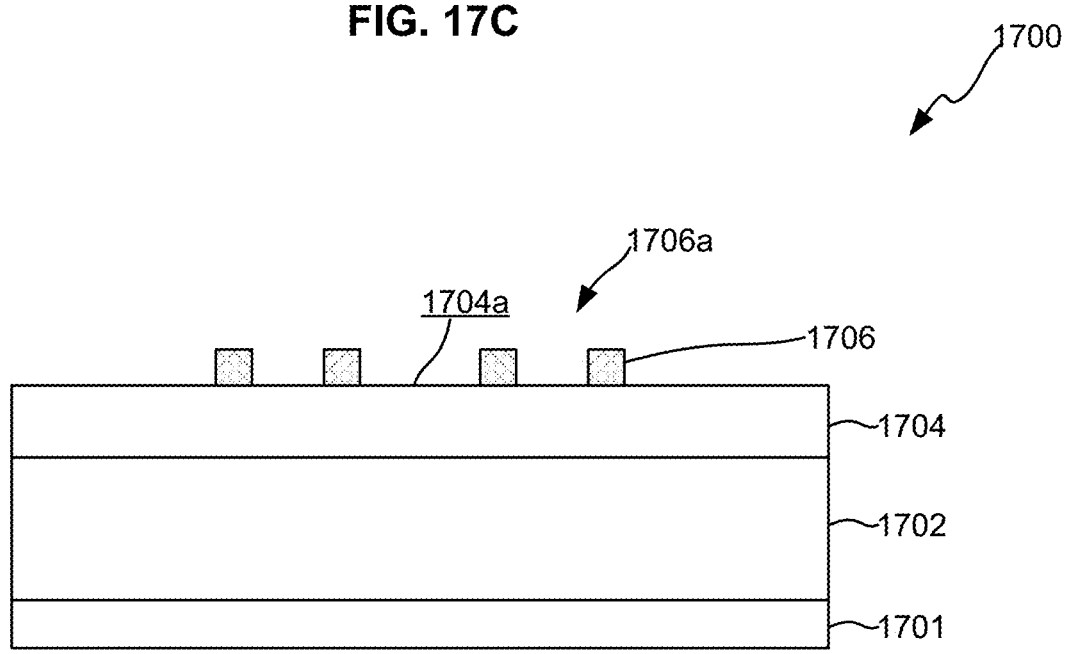
Figure 17E:
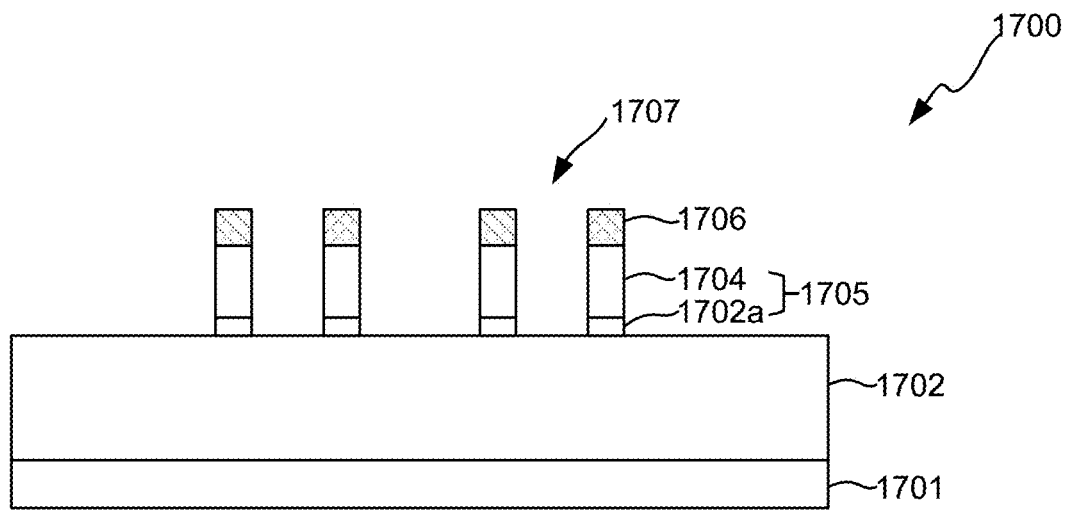
Figure 17F:
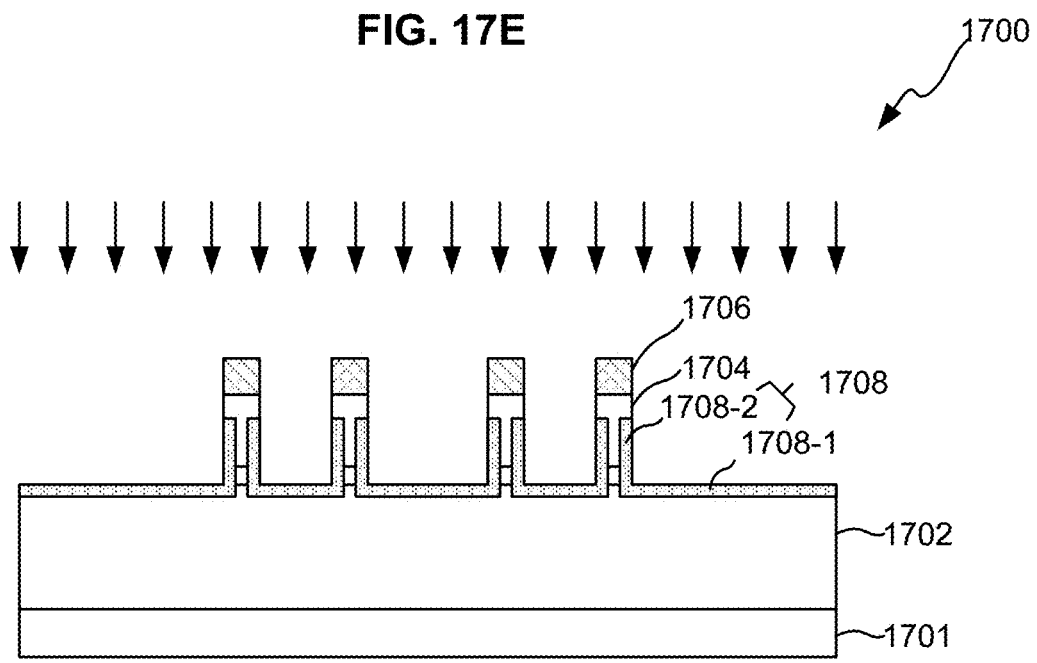
Figure 17G:
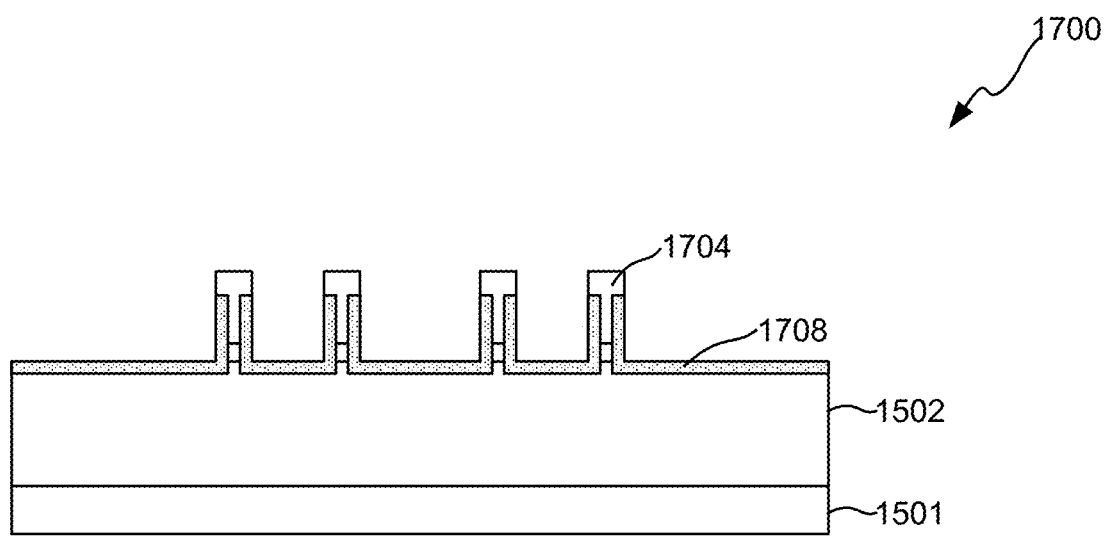
Figure 17H:
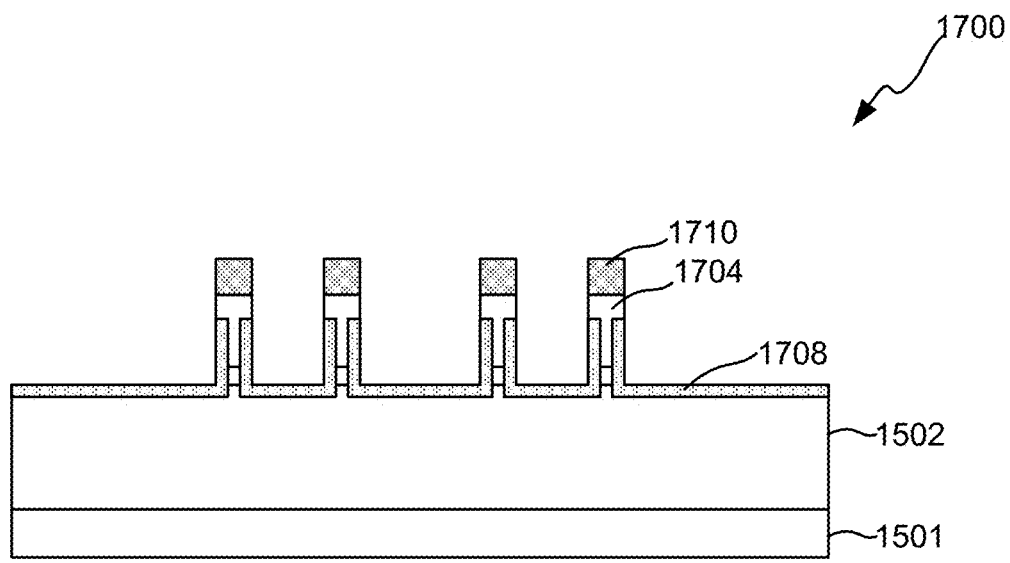
Figure 17I:
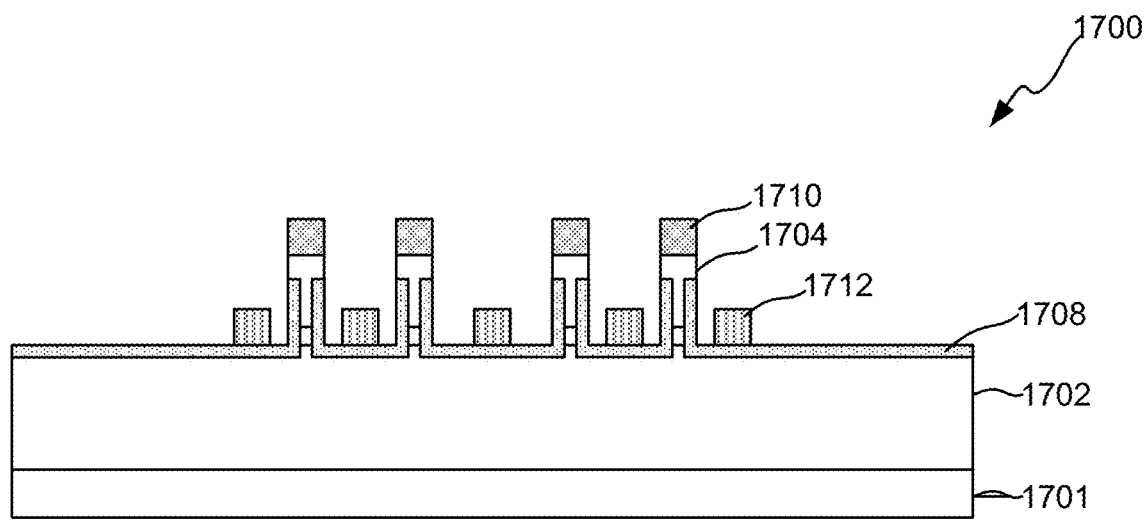
Figure 17J:
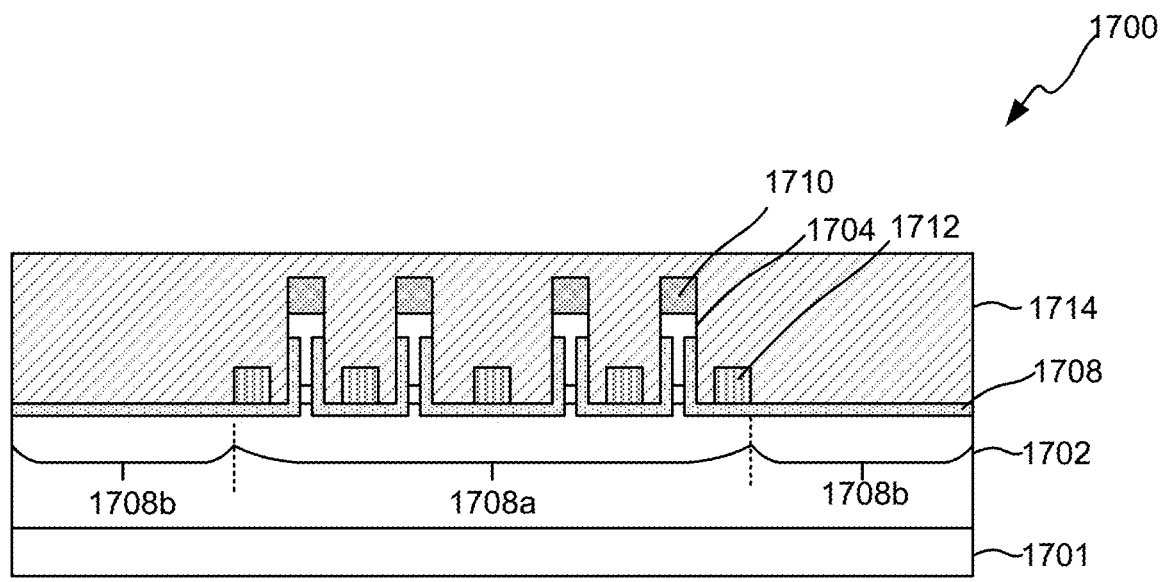
Figure 17K:
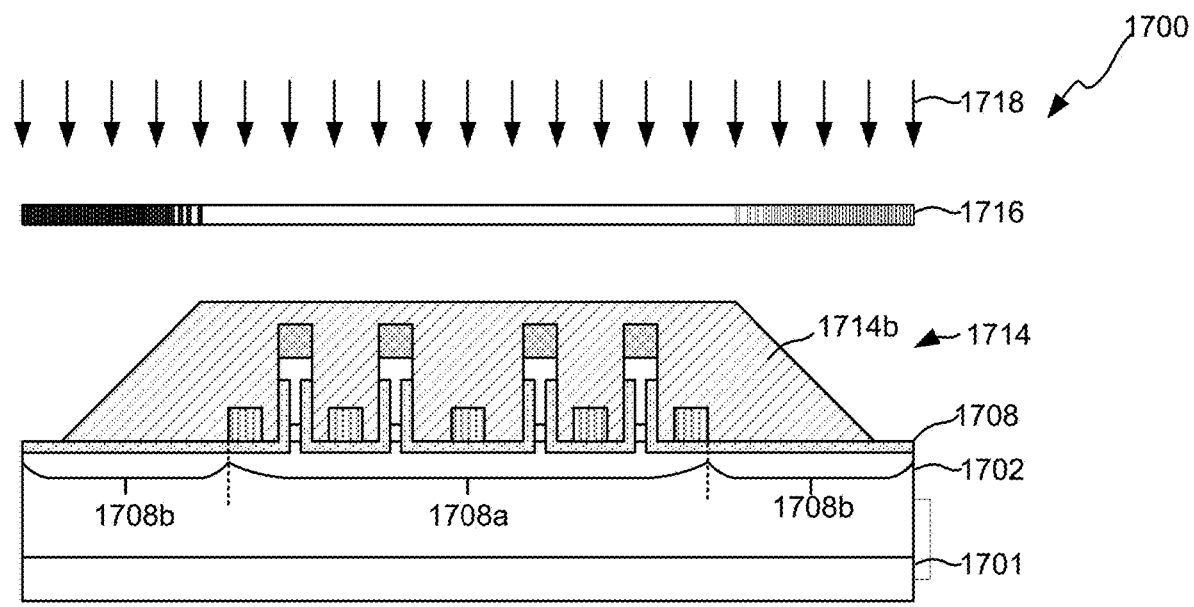
Figure 17L:
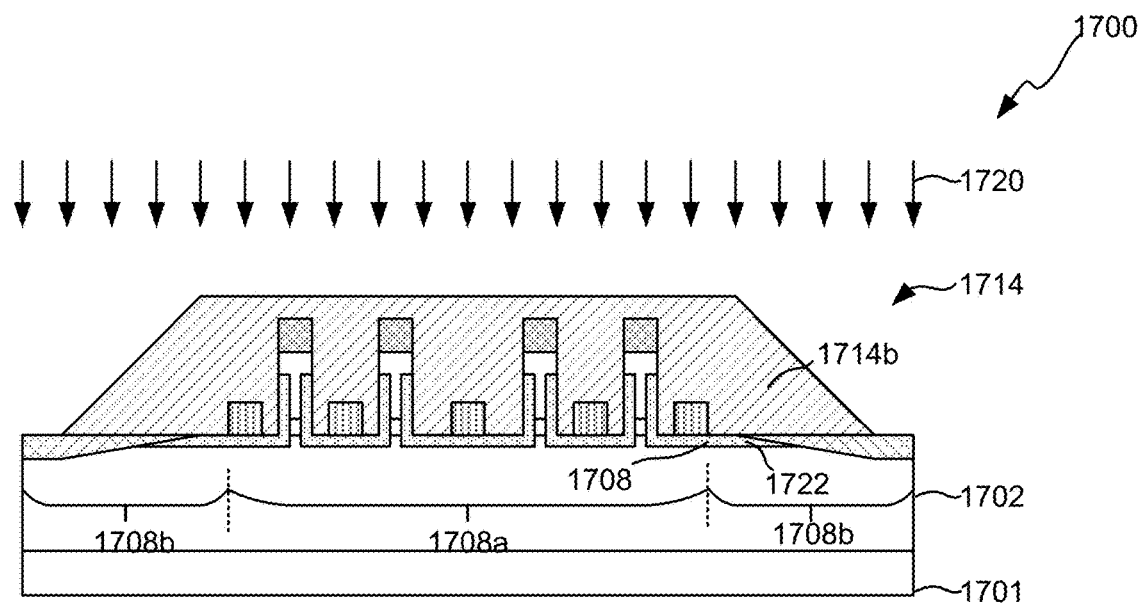
Figure 17M:
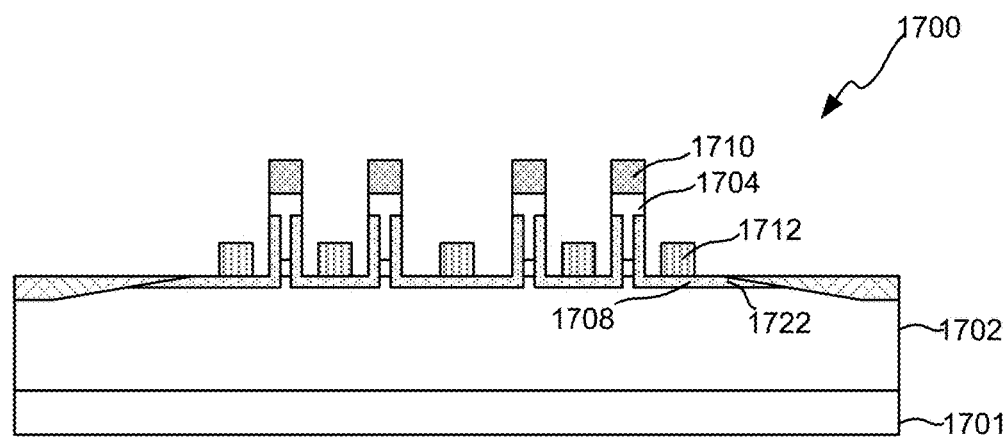
Figure 17N:
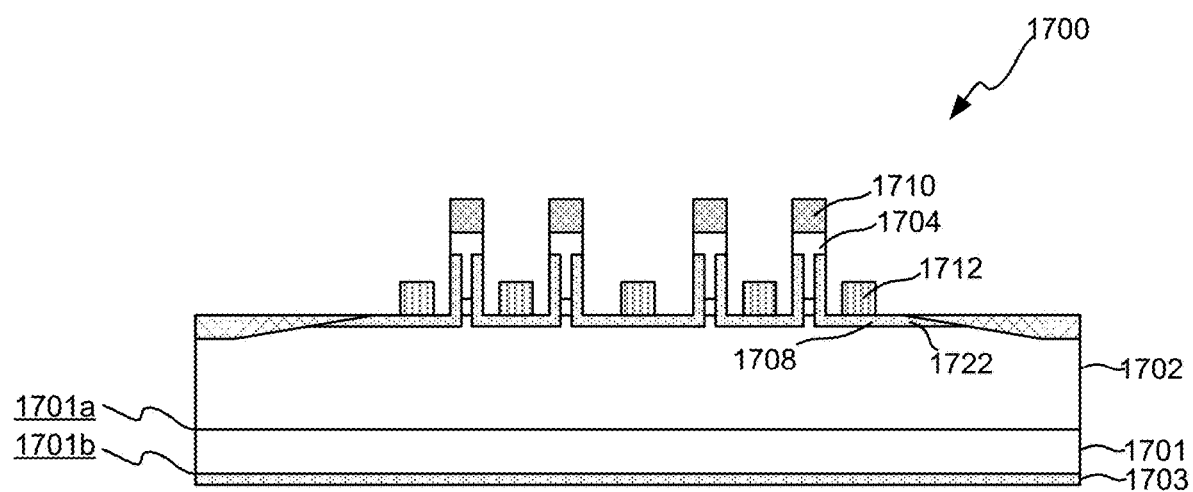

FIGS. 17A-17N illustrate the intermediate stages of a method for manufacturing a semiconductor device according to some embodiments of the present invention. For example, the semiconductor device may include a vertical JFET device. FIG. 17A illustrates a partial cross-sectional view of semiconductor device 1700 having III-nitride substrate 1701 (e.g., an n+ doped III-nitride substrate) with first side 1701a and second side 1701b.

As shown in FIG. 17B, a first III-nitride layer 1702 is epitaxially grown on first side 1701a of III-nitride substrate 1701. For example, first III-nitride layer 1702 may include n-type GaN material, having a dopant concentration of about $1\times10^{14}$ cm$^{-3}$ to $1\times10^{18}$ cm$^{-3}$. In some embodiments, the first III-nitride layer can have a thickness of about 0.5 µm to 100 µm.

Referring to FIG. 17C, second III-nitride layer 1704 (e.g., an n+ doped III-nitride layer) is epitaxially grown on first III-nitride layer 1702. For example, second III-nitride layer 1704 may include n-type GaN material, having a dopant concentration of about $5\times10^{16}$ cm$^{-3}$ to about $1\times10^{18}$ cm$^{-3}$. In some embodiments, second III-nitride layer 1704 may have a thickness of about 0.5 µm to 15 µm.

Referring to FIG. 17D, a hardmask layer 1706 is formed on second III-nitride layer 1704. Hardmask layer 1706 comprises a set of openings 1706a operable to expose an upper surface portion 1704a of second III-nitride layer 1704.

Referring to FIG. 17E, an etching process is performed using hardmask layer 1706 as a mask to etch second III-nitride layer 1704. In some embodiments, the etching process may etch through the thickness of second III-nitride layer 1704, and continue to etch a portion of first III-nitride layer 1702, for example, etching 0.01 µm to 0.3 µm of first III-nitride layer 1702. After the etching process, a plurality of fins 1705 are formed. As shown in FIG. 17E, fin 1705 may include materials from second III-nitride layer 1704 and a portion 1702a of first III-nitride layer 1702. Each of the plurality of fins 1705 is separated by one of a plurality of first trenches 1707.

Referring to FIG. 17F, an ion implantation process is performed within the plurality of first trenches 1707 to form an implanted III-nitride gate layer 1708. In some embodiments, the implanted III-nitride gate layer 1708 may include a first portion 1708-1 formed at the bottom of the plurality of first trenches 1707. In other word, first portion 1708-1 is coupled to first III-nitride layer 1702. In some embodiments, the ion implantation process may also implant ions into a contiguous portion of the sidewall of the plurality of first trenches 1707, e.g., by tilting the ion beam at an angle to the normal to the surface of the bottom of first trenches 1707, and then implanting in multiple steps at different angles to implant both sidewalls of the fins 1705. In other words, in these embodiments, the implanted III-nitride gate layer 1708 may include a second portion 1708-2 formed within the second III-nitride layer 1704. In one embodiment, implanted III-nitride gate layer 1708 may include p-type doped GaN with a dopant concentration in the range of about $5\times10^{17}$ atoms/cm$^3$ to $5\times10^{19}$ atoms/cm$^3$. In some embodiments, implanted III-nitride gate layer 1708 is formed by implanting p-type dopants such as Mg, Be or Zn, and subsequently annealing the implant damage to activate the dopants.

Referring to FIG. 17G, hardmask layer 1706 (shown in FIG. 17D) is removed.

Referring to FIG. 17H, a source metal layer 1710 is formed on the top surface of second III-nitride layer 1704. In some embodiments, source metal layer 1710 may include a refractory metal, a refractory metal compound or a refractory metal alloy (e.g., TiN).

Referring to FIG. 17I, a gate metal layer 1712 is formed on the upper surface of implanted III-nitride gate layer 1708. In some embodiments, gate metal layer 1712 may include molybdenum, gold, nickel, platinum, tantalum, tungsten, palladium, silver, aluminum, combinations thereof, and the like.

Referring to FIG. 17J, a mask layer 1714 is formed on implanted III-nitride gate layer 1708, overlaying source metal layer 1710 and gate metal layer 1712. In some embodiments, mask layer 1714 includes a photo-sensitive material, such as photoresist. In some embodiments, mask layer 1714 may include a positive photoresist. For clarity of description, the area on implanted III-nitride gate layer 1708 that includes second III-nitride layer 1704, source metal layer 1710, and gate metal layer 1712 may be referred to as active region 1708a. The area on implanted III-nitride gate layer 1708 that is adjacent to active region 1708a may be referred to as terminal region 1708b, as shown in FIG. 17J.

Referring to FIG. 17K, a photolithographic process is performed using a photomask 1716 as a mask to pattern mask layer 1714. In some embodiments, the photomask 1716 is processed using the method as illustrated in FIG. 2D or 2E. Light 1718 (e.g., 365 nm wavelength ultraviolet light) irradiates mask layer 1714 through photomask 1716. After the photolithographic process, a tapered region 1714b is formed in mask layer 1714 that is aligned with a portion of terminal region 1708b of implanted III-nitride gate layer 1708.

Referring to FIG. 17L, an ion implantation process is performed using mask layer 1714 as a mask. Ion beam 1720 irradiates implanted III-nitride gate layer 1708 through mask layer 1714. Due to tapered region 1714b of mask layer 1714, implantation ions stop in implanted III-nitride gate region 1708 to form a tapered junction termination element 1722. The implanted ion species may be argon, nitrogen, helium, oxygen, silicon, or other appropriate species that reduce the electrical conductivity in implanted III-nitride gate layer 1708.

Referring to FIG. 17M, mask layer 1714 (shown in FIG. 17J) is removed after the ion implantation process. In some embodiments, mask layer 1714 is removed by wet etching or dry etching using one or more processing techniques. For example, mask layer 1714 may be removed by ashing in an oxygen plasma, followed by a wet clean treatment such as a sulfuric acid/hydrogen peroxide mixture at 65-120° C.

Referring to FIG. 17N, a metal layer 1703 is formed on second side 1701b of III-nitride substrate 1701. For example, metal layer 1703 may include a titanium-aluminum (Ti/Al) metal.

Figure 18:
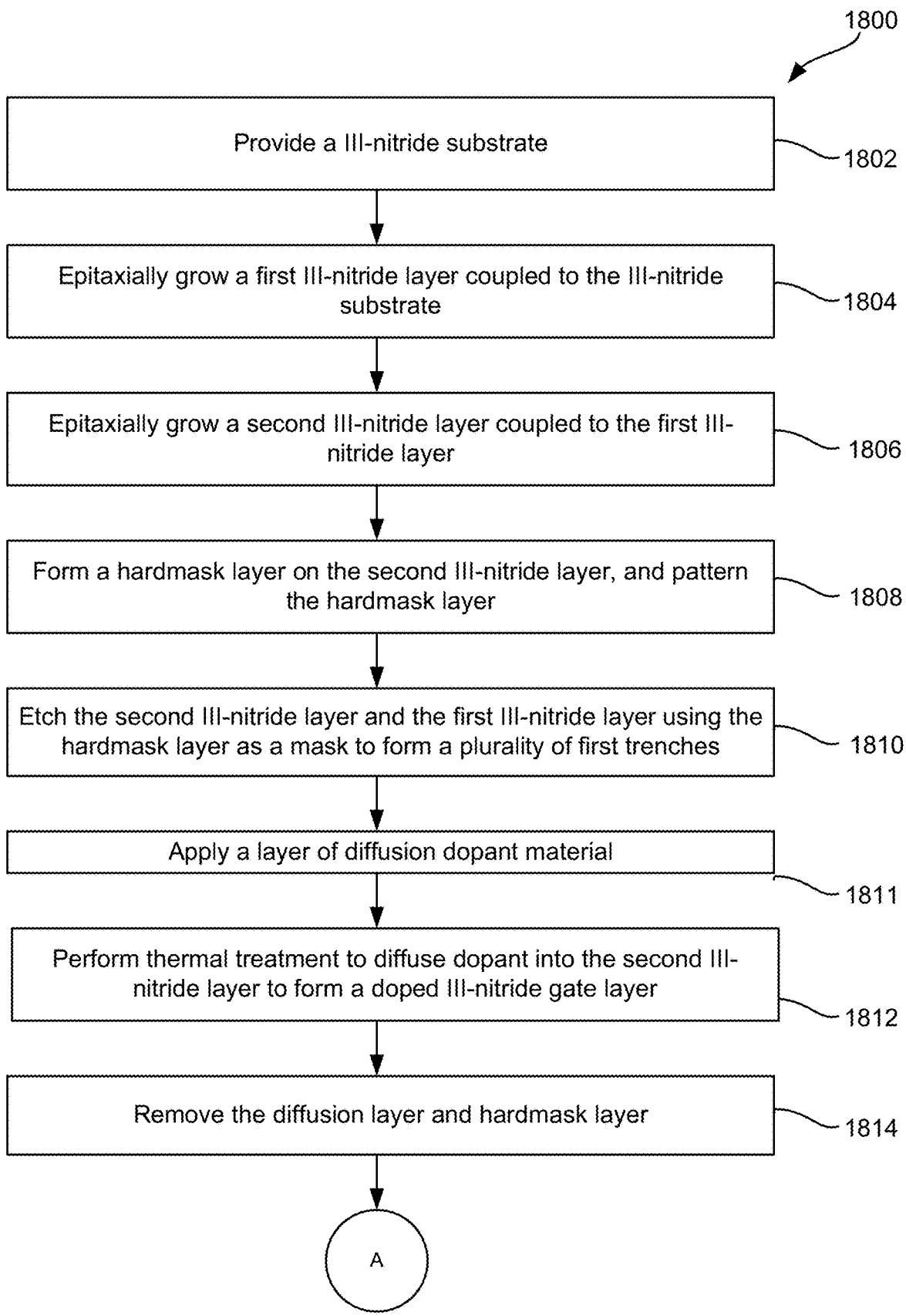
FIG. 18 illustrates a method for manufacturing a semiconductor device according to an embodiment of the present invention.
Figure 18:
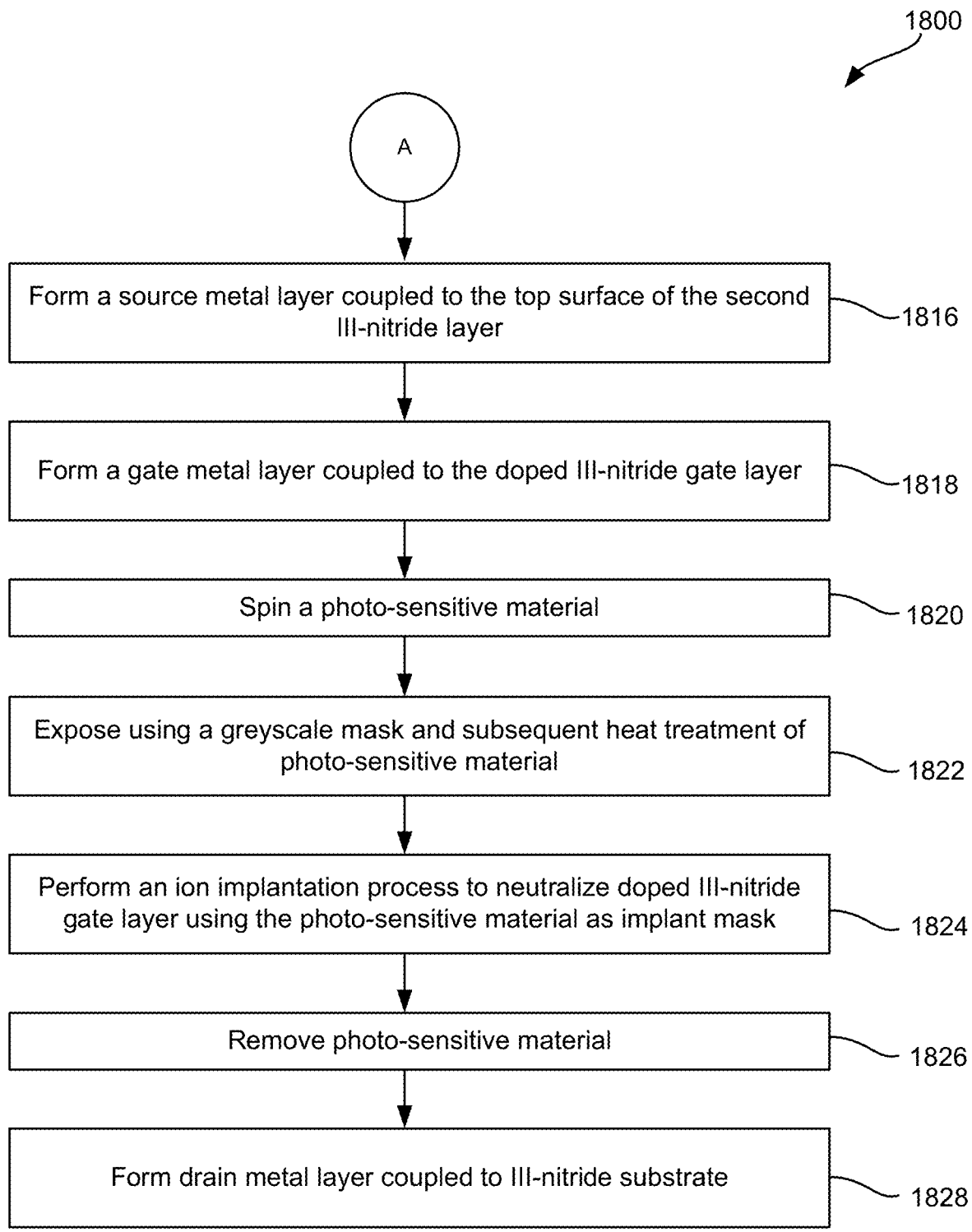

FIG. 18 illustrates a method for manufacturing a semiconductor device according to an embodiment of the present invention. For example, the semiconductor device may include a vertical JFET device. In some embodiments, method 1800 includes providing a III-nitride substrate having a first side and second side (1802). The III-nitride substrate is characterized by a first conductivity type. For example, the III-nitride substrate may include n+ type GaN material, having a dopant concentration of about $1\times10^{17}$ cm$^{-3}$ to $1\times10^{19}$ cm$^{-3}$.

Method 1800 includes epitaxially growing a first III-nitride layer coupled to the first side of the III-nitride substrate (1804). In some embodiments, the first III-nitride layer is characterized by the first conductivity type. For example, the first III-nitride layer may include n-type GaN material, having a dopant concentration of about $1\times10^{14}$ cm$^{-3}$ to $1\times10^{18}$ cm$^{-3}$. In some embodiments, the first III-nitride layer can have a thickness of about 0.5 µm to 100 µm.

Next, method 1800 may include epitaxially growing a second III-nitride layer coupled to the first III-nitride layer (1806). In some embodiments, the second III-nitride layer is characterized by the first conductivity type. For example, the second III-nitride layer may include n-type GaN material, having a dopant concentration of about $5\times10^{16}$ cm$^{-3}$ to about $1\times10^{18}$ cm$^{-3}$. In some embodiments, the second III-nitride layer may have a thickness of about 0.1 µm to 2 µm.

Then, method 1800 may include form a hardmask layer on the second III-nitride layer, and patterning the hardmask layer (1808). In some embodiments, a composite hard mask is formed by depositing a metal layer and then a dielectric layer to form the composite hard mask. In these embodiments, as will be evident to one of skill in the art, the composite hard mask is then patterned prior to performing etching processes.

Method 1800 may further include etching the second III-nitride layer and the first III-nitride layer using the hardmask layer as a mask to form a plurality of first trenches (1810). Specifically, the etching process may be performed through the second III-nitride layer and continue to extend a portion of the thickness of the first III-nitride layer.

Method 1800 may further include applying a layer of diffusion dopant material (1811). Specifically, the diffusion dopant material may overlay the bottom and sidewall of the plurality of the first trenches. In some embodiments, the diffusion dopant material may include a p-type dopant such as boron and magnesium.

Method 1800 then includes performing thermal treatment to diffuse dopants into the second III-nitride layer (1812). Specifically, the thermal treatment may form a doped III-nitride gate layer. In some embodiments, the doped III-nitride gate layer is formed by a solid-phase diffusion process as described in U.S. Pat. No. 9,136,116, which is hereby incorporated by reference in its entirety for all purposes. In some embodiments, the doped III-nitride gate layer is formed by a gas-phase doping process involving a p-type dopant precursor gas (e.g., biscyclopentadienylmagnesium) in an ammonia-rich ambient in a metalorganic chemical vapor deposition (MOCVD) reactor, at temperatures between 950° C. and 1,150° C. and pressures between 100 mTorr and 1 atmosphere. In some embodiments, only a portion of the sidewall of the plurality of first trenches is doped to form the doped III-nitride gate layer. In such embodiments, the doped III-nitride gate layer is formed on the bottom of the plurality of first trenches. Then method 1800 may include removing the diffusion dopant material layer and the hardmask layer (1814).

Method 1800 may further include forming a source metal layer coupled to the top surface of the second III-nitride layer (1816). In some embodiments, the source metal layer may include a refractory metal, a refractory metal compound or a refractory metal alloy (e.g., TiN).

Method 1800 may further include forming a gate metal layer coupled to the doped III-nitride gate layer (1818). Specifically, the gate metal layer is formed within the plurality of first trenches, and is coupled to the doped III-nitride gate layer. In some embodiments, the gate metal layer may include molybdenum, gold, nickel, platinum, tantalum, tungsten, palladium, silver, aluminum, combinations thereof, and the like.

Next, method 1800 may include a process of forming a tapered termination element using a greyscale mask. Method 1800 may include spinning a photo-sensitive material (1820). Specifically, the photo-sensitive material is spun on the doped III-nitride gate layer, overlaying the source metal layer and the gate metal layer. In some embodiments, the photo-sensitive material may include a photoresist that can be patterned using a photolithography process.

Method 1800 may further include exposing using a greyscale mask and performing subsequent heat treatment of photo-sensitive material (1822). Specifically, the photo-sensitive material can be processed using the methods illustrated referring to FIG. 2D or 2E. For clarity of description, the area on the doped III-nitride gate layer including the second III-nitride layer, the source metal layer, and the gate metal layer may be referred to as the active region, and the area on the doped III-nitride gate layer adjacent the active region may be referred to as the terminal region. After the processing, the photo-sensitive material is patterned with a planar region aligned with the active region, and a tapered region aligned with the terminal region of the doped III-nitride gate layer.

Then, method 1800 may further include performing an ion implantation process to neutralize the doped III-nitride gate layer using the photo-sensitive material as implant mask (1824). Specifically, method 1800 may include implanting ions into the terminal region of the doped III-nitride gate layer using the photo-sensitive material as a mask to form a tapered junction termination element in the doped III-nitride gate layer within the terminal region. In some embodiments, the implanted ions stop in the doped III-nitride gate layer to form an implanted zone that is characterized by a conductivity less than a conductivity of the doped III-nitride gate layer. In some embodiments, the implanted ion species may be argon, nitrogen, helium, oxygen, silicon, or other appropriate species that reduce the electrical conductivity in the doped III-nitride gate layer.

Next, method 1800 may include removing the photo-sensitive material (1826). It should be noted the process of forming the tapered termination element using the greyscale mask can be moved around in the process flow, such as being performed at different stages in the method 1800 as appropriate to particular applications.

Method 1800 may further include forming a drain metal layer coupled to the III-nitride substrate (1828), for example, on the backside of the III-nitride substrate. Specifically, the drain metal layer may be formed to the second side of the III-nitride substrate. In some embodiments, the drain metal layer may include a titanium-aluminum (Ti/Al) metal.

It should be appreciated that the specific steps illustrated in FIG. 18 provide a particular method for manufacturing a semiconductor device according to an embodiment of the present invention. Other sequences of steps may also be performed according to alternative embodiments. For example, alternative embodiments of the present invention may perform the steps outlined above in a different order. Moreover, the individual steps illustrated in FIG. 18 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 19A:
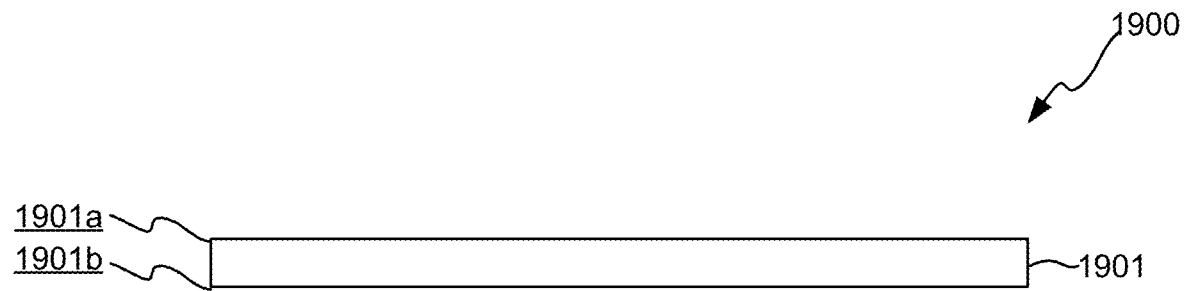
FIGS. 19A-19O illustrate the intermediate stages of a method for manufacturing a semiconductor device according to some embodiments of the present invention.
Figure 19B:
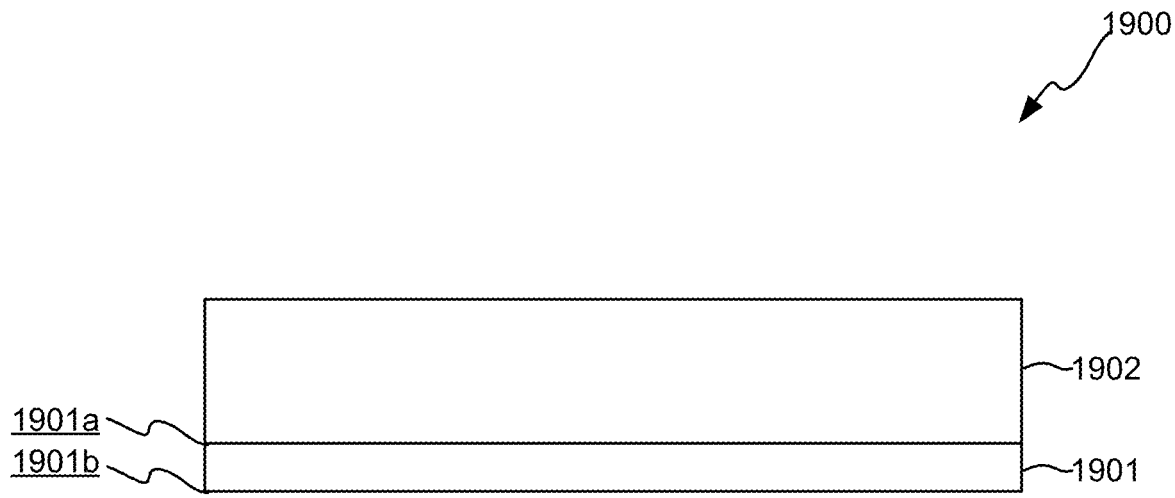
Figure 19C:
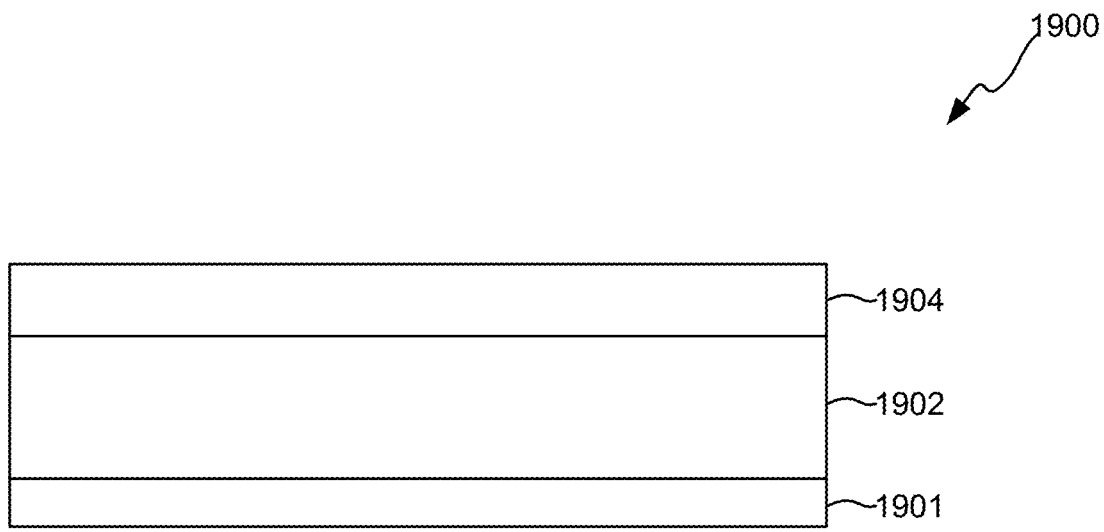
Figure 19D:
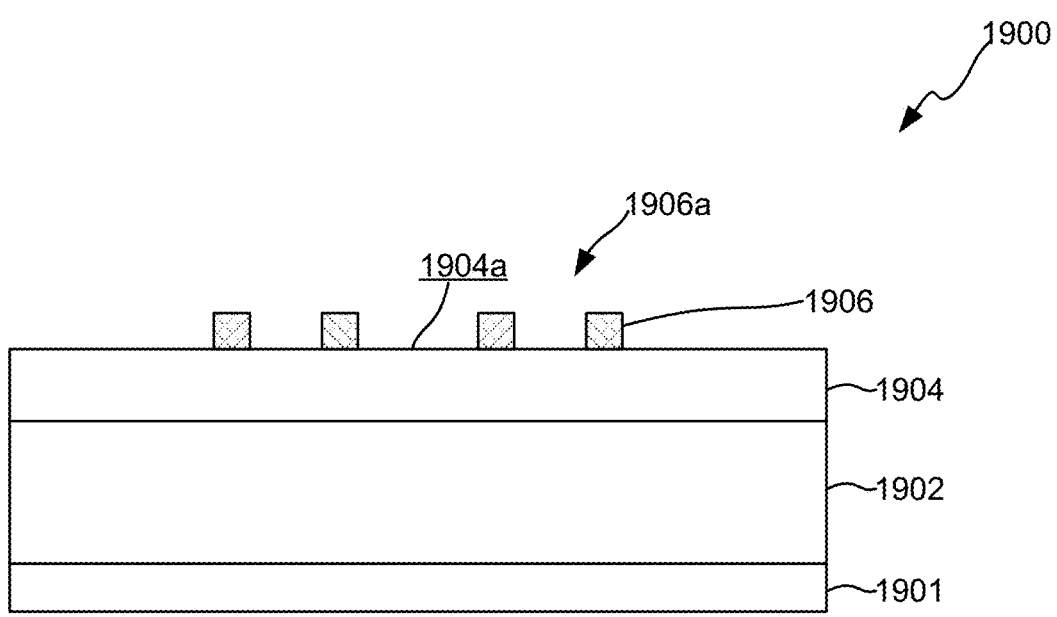
Figure 19E:
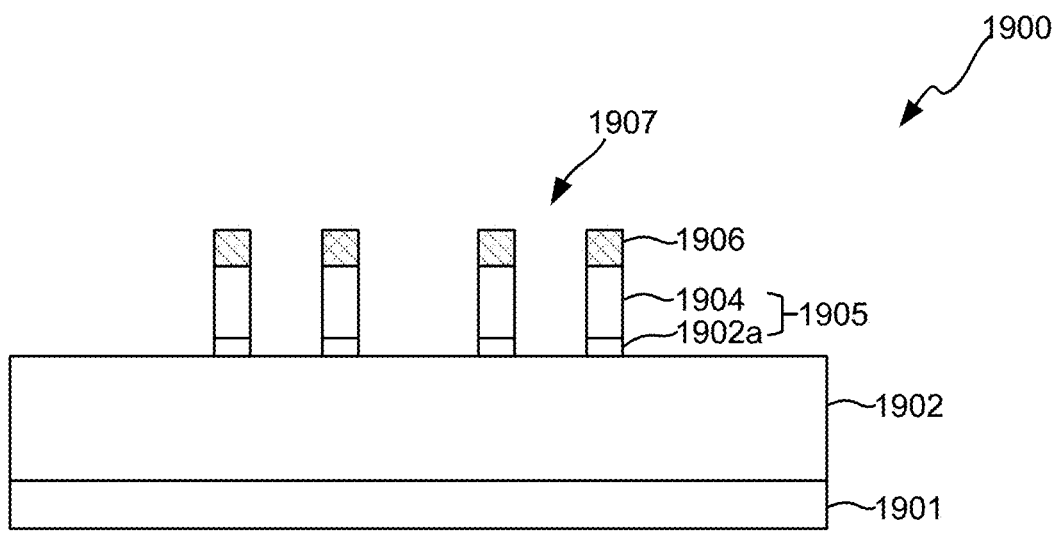
Figure 19F:
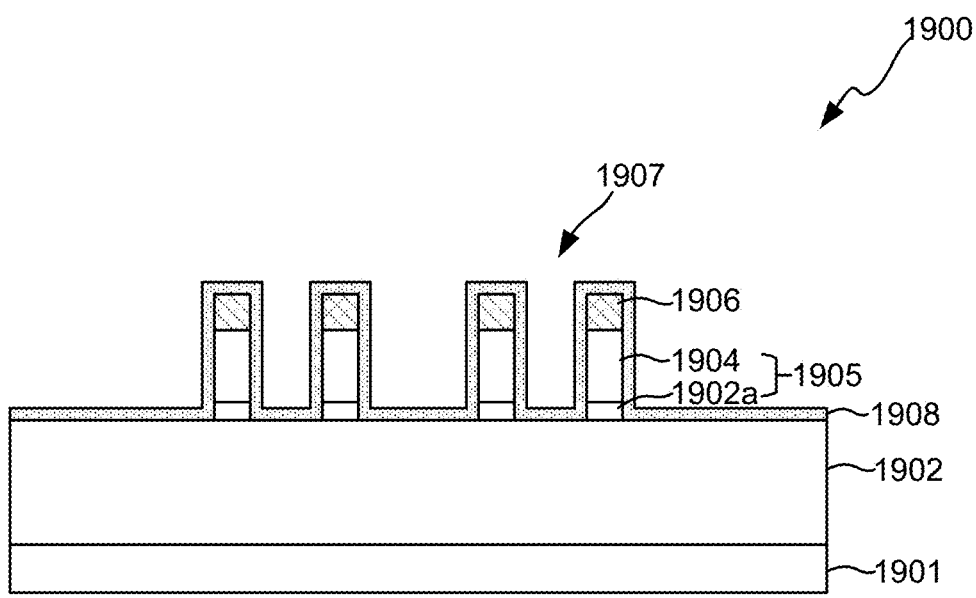
Figure 19G:
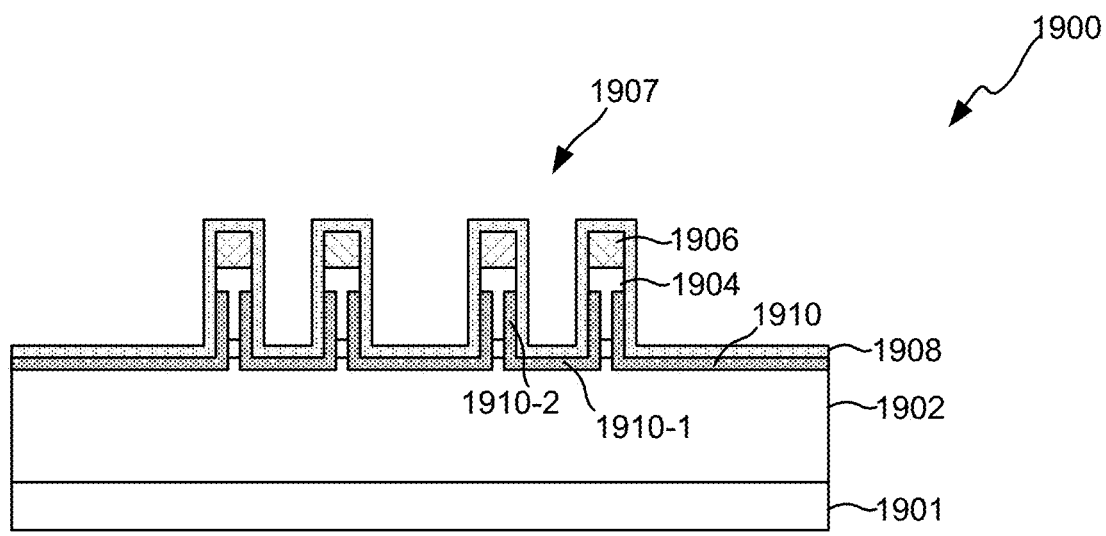
Figure 19H:
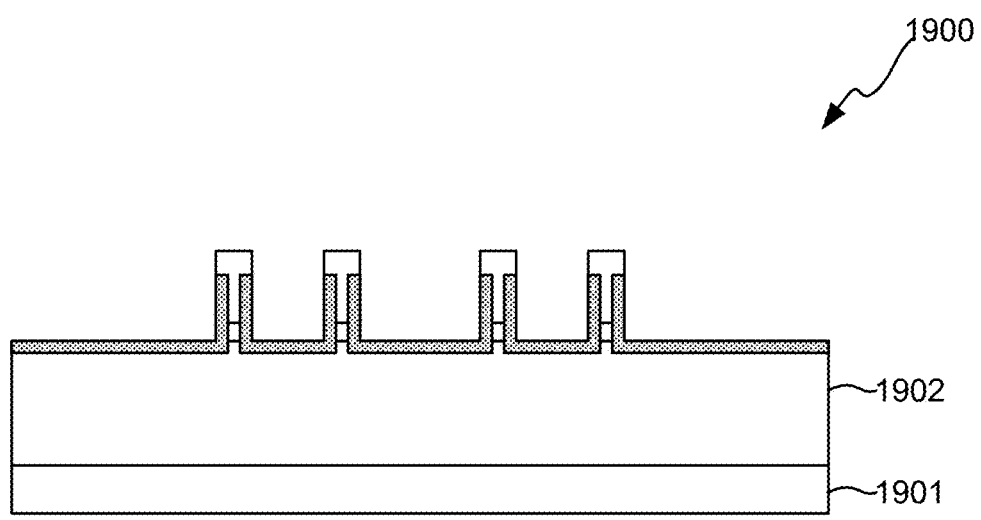
Figure 19I:
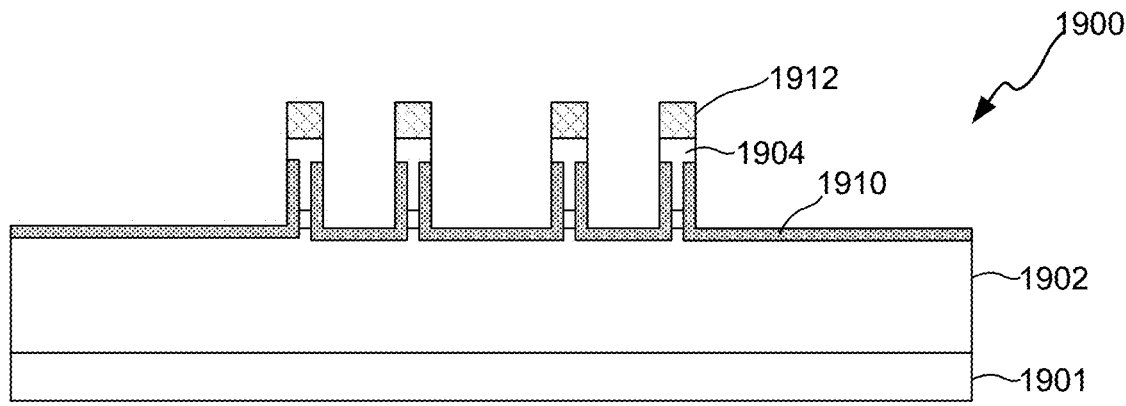
Figure 19J:
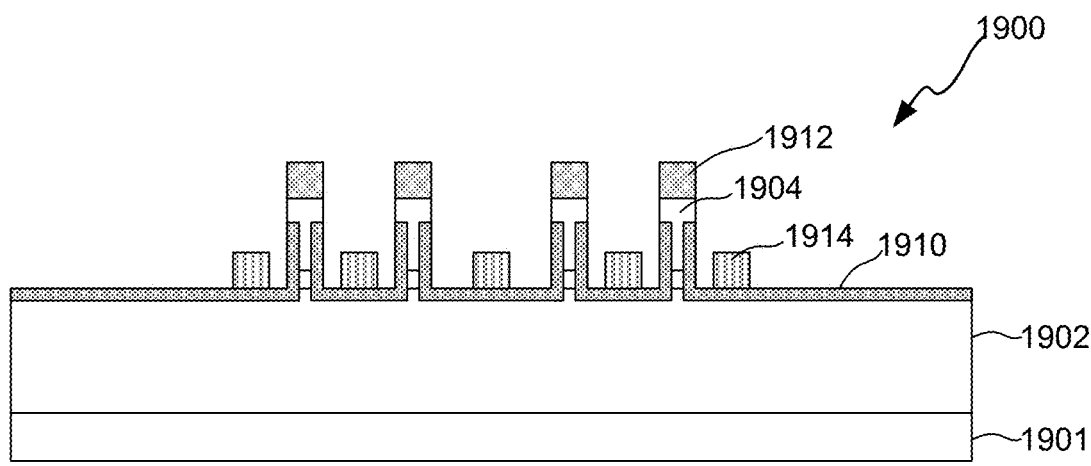
Figure 19K:
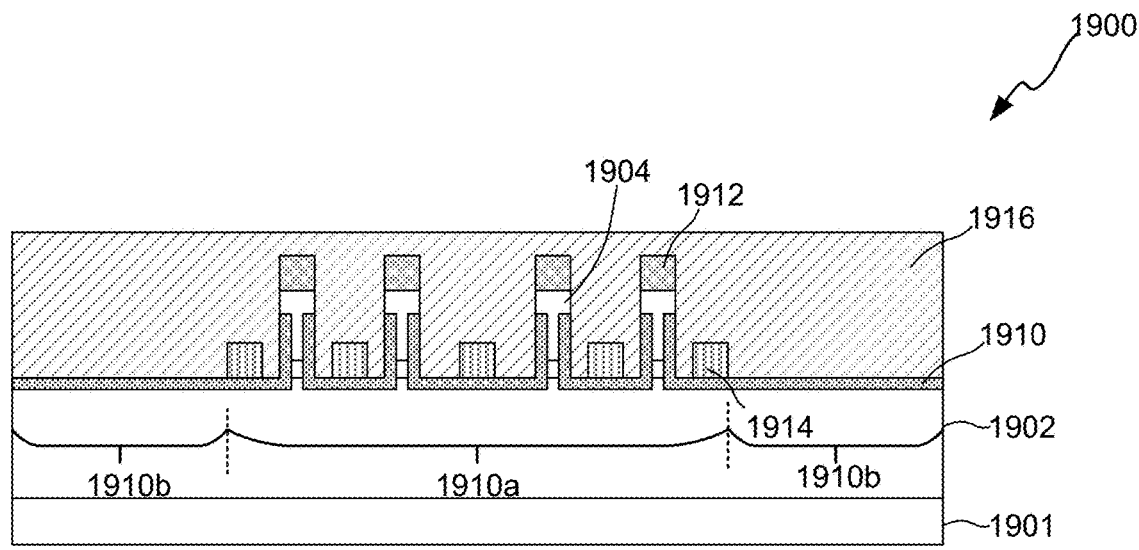
Figure 19L:
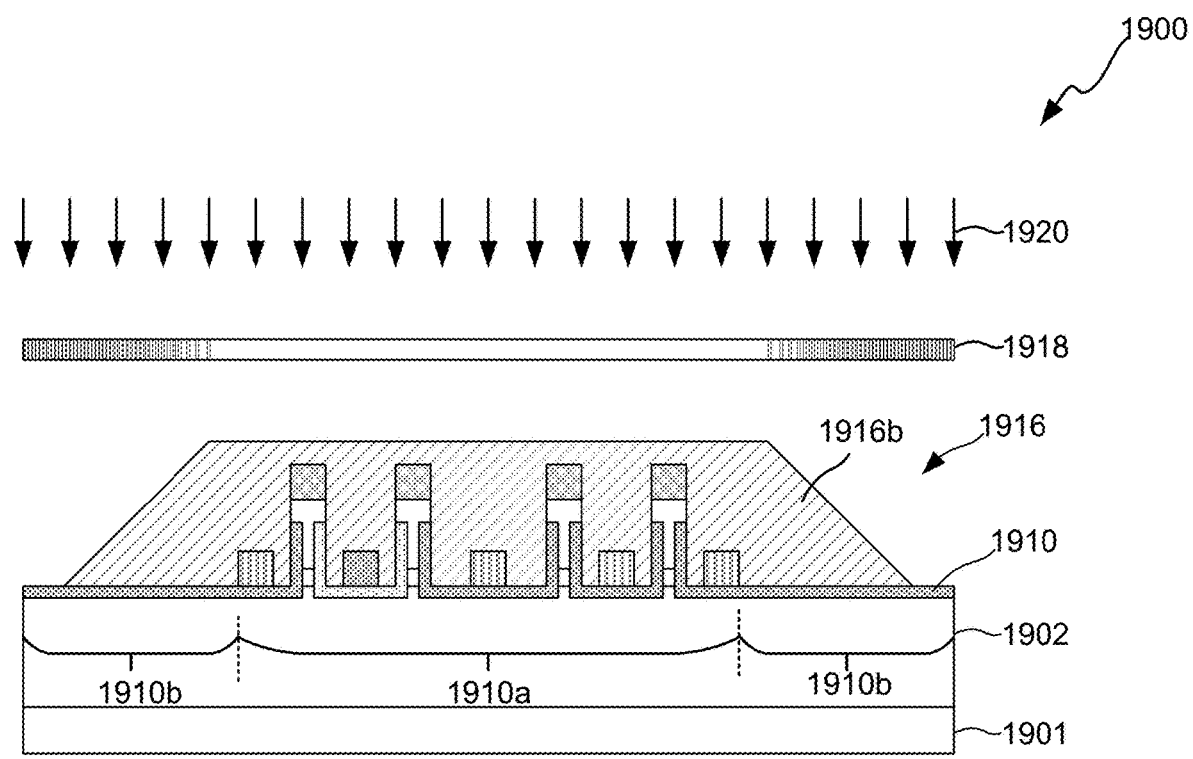
Figure 19M:
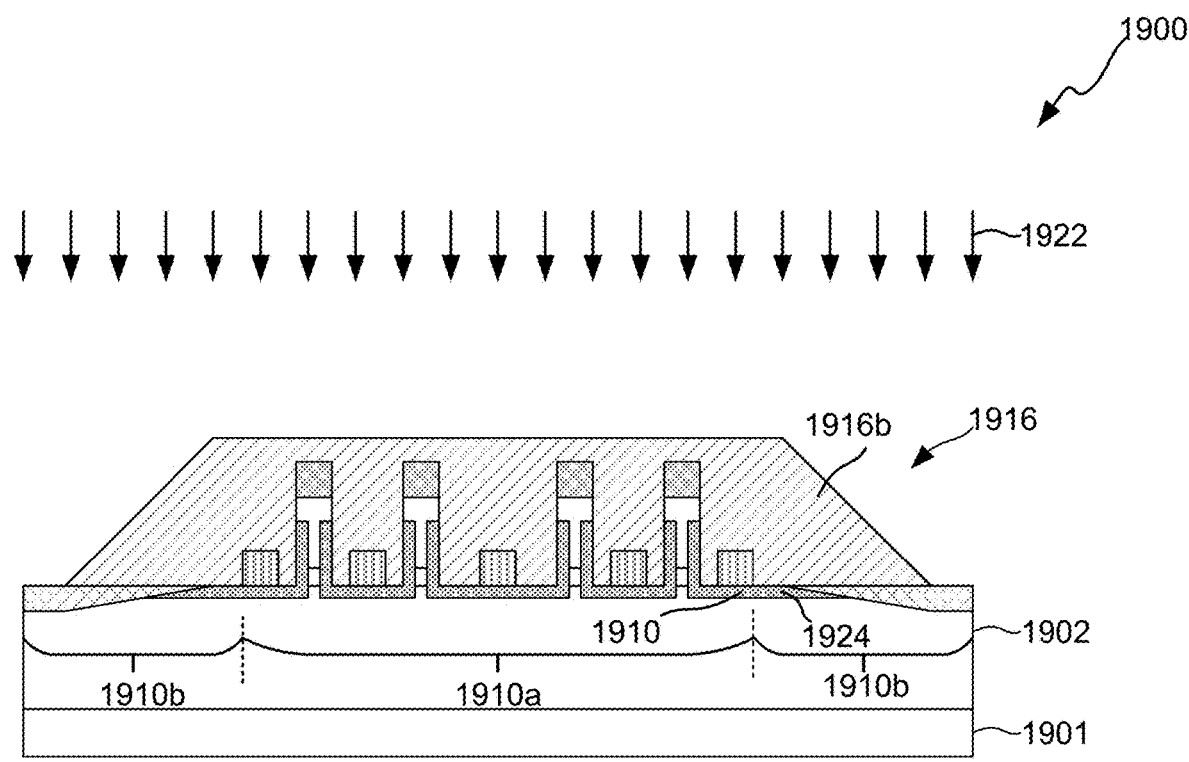
Figure 19N:
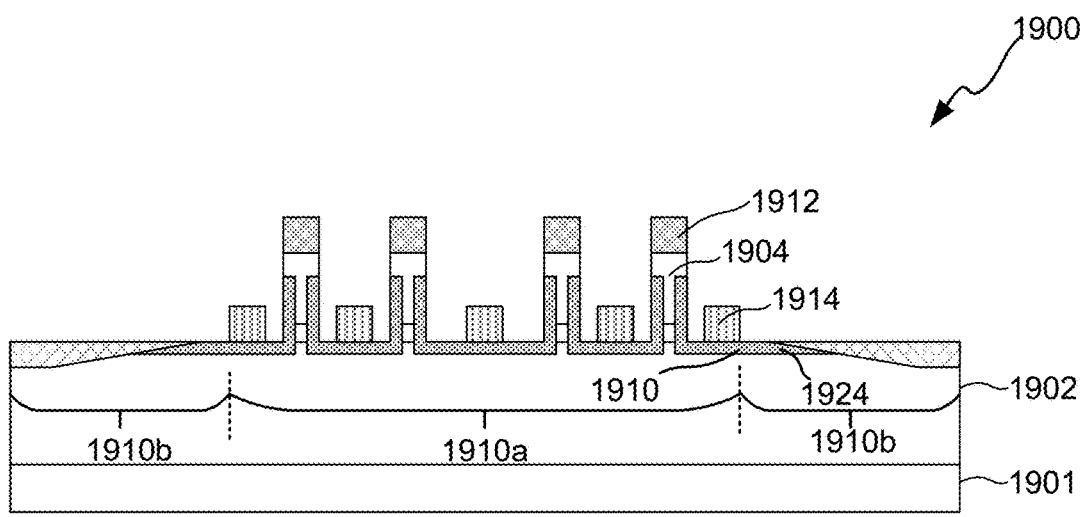
Figure 19O:
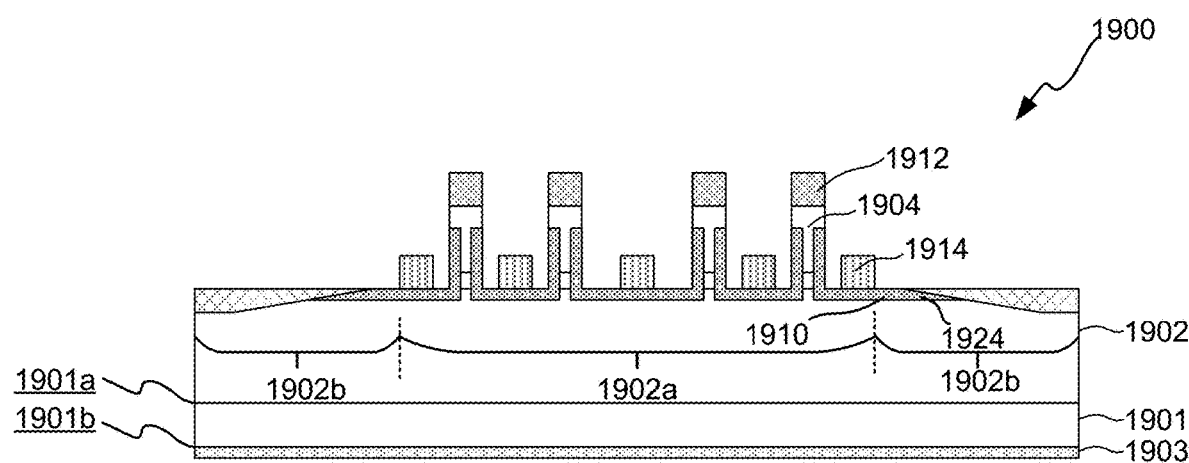

FIGS. 19A-19O illustrate the intermediate stages of a method for manufacturing a semiconductor device according to some embodiments of the present invention. For example, the semiconductor device may include a vertical JFET device. FIG. 19A illustrates a partial cross-sectional view of semiconductor device 1900 having III-nitride substrate 1901 (e.g., an n+ doped III-nitride substrate) with first side 1901a and second side 1901b.

As shown in FIG. 19B, a first III-nitride layer 1902 is epitaxially grown on first side 1901a of III-nitride substrate 1901. For example, first III-nitride layer 1902 may include n-type GaN material, having a dopant concentration of about $1 \times 10^{14}$ cm$^{-3}$ to $1 \times 10^{18}$ cm$^{-3}$. In some embodiments, the first III-nitride layer can have a thickness of about 0.5 μm to 100 μm.

Referring to FIG. 19C, second III-nitride layer 1904 (e.g., an n+ doped III-nitride layer) is epitaxially grown on first III-nitride layer 1902. For example, second III-nitride layer 1904 may include n-type GaN material, having a dopant concentration of about $5 \times 10^{16}$ cm$^{-3}$ to about $1 \times 10^{18}$ cm$^{-3}$. In some embodiments, second III-nitride layer 1904 may have a thickness of about 0.5 μm to 15 μm.

Referring to FIG. 19D, a hardmask layer 1906 is formed on second III-nitride layer 1904. Hardmask layer 1906 comprises a set of openings 1906*a* operable to expose an upper surface portion 1904*a* of second III-nitride layer 1904.

Referring to FIG. 19E, an etching process is performed using hardmask layer 1906 as a mask to etch second III-nitride layer 1904. In some embodiments, the etching process may etch through the thickness of second III-nitride layer 1904, and continue to etch a portion of first III-nitride layer 1902, for example, etching 0.01 μm to 0.3 μm of first III-nitride layer 1902. After the etching process, a plurality of fins 1905 are formed. As shown in FIG. 19E, fin 1905 may include materials from second III-nitride layer 1904 and a portion 1902*a* of first III-nitride layer 1902. Each of the plurality of fins 1905 is separated by one of a plurality of first trenches 1907.

Referring to FIG. 19F, a layer of diffusion dopant material 1908 is applied to the plurality of first trenches 1907. In some embodiments, diffusion dopant material 1908 overlays first III-nitride layer 1902, the plurality of fins 1905, and hardmask layer 1906. In some embodiments, diffusion dopant material 1908 may include a p-type dopant such as zinc or magnesium.

Referring to FIG. 19G, a thermal treatment is performed to the diffusion dopant material 1908 to form a doped III-nitride gate layer 1910. In some embodiments, doped III-nitride gate layer 1910 include a first portion 1910-1 formed on the bottom of the plurality of first trenches 1907. As shown in FIG. 19G, first portion 1910-1 is formed in the upper portion of first III-nitride layer 1902. In some embodiments, doped III-nitride gate layer 1910 may also include a second portion 1910-2 formed in a contiguous portion of the sidewall of the plurality of first trenches 1907. As shown in FIG. 19G, second portion 1910-2 is formed in second III-nitride layer 1904 and a portion of first III-nitride layer 1902.

Referring to FIG. 19H, diffusion dopant material 1908 (shown in FIG. 19F) and hardmask layer 1906 (shown in FIG. 19D) are removed.

Referring to FIG. 19I, a source metal layer 1912 is formed on the top surface of second III-nitride layer 1904. In some embodiments, source metal layer 1912 may include a refractory metal, a refractory metal compound or a refractory metal alloy (e.g., TiN).

Referring to FIG. 19J, a gate metal layer 1914 is formed on the upper surface of doped III-nitride gate layer 1910. In some embodiments, gate metal layer 1914 may include molybdenum, gold, nickel, platinum, tantalum, tungsten, palladium, silver, aluminum, combinations thereof, and the like.

Referring to FIG. 19K, a mask layer 1916 is formed on doped III-nitride gate layer 1910, overlaying source metal layer 1912 and gate metal layer 1914. In some embodiments, mask layer 1916 includes a photo-sensitive material, such as photoresist. In some embodiments, mask layer 1916 may include a positive photoresist. For clarity of description, the area on doped III-nitride gate layer 1910 that includes second III-nitride layer 1904, source metal layer 1912, and gate metal layer 1914 may be referred to as active region 1910*a*. The area on doped III-nitride gate layer 1910 that is adjacent to active region 1910*a* may be referred to terminal region 1910*b*, as shown in FIG. 19K.

Referring to FIG. 19L, a photolithographic process is performed using a photomask 1918 as a mask to pattern mask layer 1916. In some embodiments, the photomask 1918 is processed using the method as illustrated in FIG. 2D or 2E. Light 1920 (e.g., 365 nm wavelength ultraviolet light) irradiates mask layer 1916 through photomask 1918. After the photolithographic process, a tapered region 1916*b* is formed in mask layer 1916 that is aligned with a portion of terminal region 1910*b* in doped III-nitride gate layer 1910.

Referring to FIG. 19M, an ion implantation process is performed using mask layer 1916 as a mask. Ion beam 1922 irradiates doped III-nitride gate layer 1910 through mask layer 1916. Due to tapered region 1916*b* of mask layer 1916, implantation ions stop in doped III-nitride gate layer 1910 to form a tapered junction termination element 1924 within the terminal region 1910*b* in doped III-nitride gate layer 1910. The implanted ion species may be argon, nitrogen, helium, oxygen, silicon, or other appropriate species that reduce the electrical conductivity in doped III-nitride gate layer 1910.

Referring to FIG. 19N, mask layer 1916 (shown in FIG. 19M) is removed after the ion implantation process. In some embodiments, mask layer 1916 is removed by wet etching or dry etching using one or more processing techniques. For example, mask layer 1916 may be removed by plasma ashing in an oxygen plasma, followed by a wet clean treatment such as a sulfuric acid/hydrogen peroxide mixture at 65-120° C.

Referring to FIG. 19O, a metal layer 1903 is formed on second side 1901*b* of III-nitride substrate 1901. For example, metal layer 1903 may include a titanium-aluminum (Ti/Al) metal.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over", and "under"

are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It is to be understood that the appended claims are not limited to the precise configuration illustrated in the drawings. One of ordinary skill in the art would recognize various modification, alternatives, and variations may be made in the arrangement and steps of the methods and devices above without departing from the scope of the invention.

What is claimed is:

1. A semiconductor device comprising:
    a semiconductor substrate comprising a first side and second side, wherein the semiconductor substrate is characterized by a first conductivity type;
    a first III-nitride epitaxial semiconductor layer epitaxially grown on the first side of the semiconductor substrate, wherein the first III-nitride epitaxial semiconductor layer is characterized by a varying dopant concentration of the first conductivity type;
    a second III-nitride epitaxial semiconductor layer epitaxially grown on the first III-nitride epitaxial semiconductor layer, wherein the second III-nitride epitaxial semiconductor layer is characterized by the first conductivity type and an upper surface, wherein the second III-nitride epitaxial semiconductor layer comprises a contact region including a contact structure comprising a plurality of source contacts, each of the plurality of source contacts formed on a portion of the upper surface of the second III-nitride epitaxial semiconductor layer;
    a plurality of fins formed in the second III-nitride epitaxial semiconductor layer and a portion of the first III-nitride epitaxial semiconductor layer, wherein bottom surfaces of the fins extend from the first III-nitride epitaxial semiconductor layer and each of the plurality of fins is separated from an adjacent fin of the plurality of fins by a trench;
    a third III-nitride epitaxial semiconductor layer epitaxially regrown in the trenches separating the plurality of fins and defined by an upper surface coplanar with the upper surface of the second III-nitride epitaxial semiconductor layer and including a terminal region surrounding the contact region, wherein the terminal region comprises a tapered junction termination element having a linear profile and a non-conducting ion implanted zone adjacent to the tapered junction termination element, wherein the non-conducting ion implanted zone is characterized by the linear profile, and wherein the third III-nitride epitaxial layer is characterized by a second conductivity type opposite to the first conductive type; and
    a gate metal layer formed on the upper surface of the third III-nitride epitaxial semiconductor layer.

2. The semiconductor device of claim 1, further comprising a metallic field plate electrically coupled to the tapered junction termination element.

3. The semiconductor device of claim 1, further comprising a metallic layer coupled to the second side of the semiconductor substrate.

4. The semiconductor device of claim 1 wherein the contact structure comprises a metallic structure electrically coupled to the contact region of the second III-nitride epitaxial semiconductor layer.

5. The semiconductor device of claim 1 wherein the contact structure comprises:
    a fourth III-nitride epitaxial semiconductor layer coupled to the contact region of the second III-nitride epitaxial semiconductor layer, wherein the fourth III-nitride epitaxial semiconductor layer is characterized by the first conductivity type; and
    a metallic structure electrically coupled to the fourth III-nitride epitaxial semiconductor layer.

6. The semiconductor device of claim 5 wherein a dopant concentration of the fourth III-nitride epitaxial semiconductor layer is greater than a dopant concentration of the second III-nitride epitaxial semiconductor layer.

7. The semiconductor device of claim 1 wherein the semiconductor substrate is characterized by a first n-type dopant concentration and the first III-nitride epitaxial semiconductor layer is characterized by a second n-type dopant concentration less than the first n-type dopant concentration.

8. The semiconductor device of claim 1 wherein the contact region of the second III-nitride epitaxial semiconductor layer comprises a recess.

9. The semiconductor device of claim 8 wherein the recess includes a metallic structure electrically coupled to the second III-nitride epitaxial semiconductor layer.

10. The semiconductor device of claim 1 wherein an edge of each of the plurality of source contacts is aligned with an interface between each of the plurality of fins and the trench.

11. The semiconductor device of claim 1 wherein the non-conducting ion implanted zone comprises argon, nitrogen, helium, oxygen, or silicon.

12. The semiconductor device of claim 1 wherein a thickness of tapered junction termination element measured from a lower surface to an upper surface of the second III-nitride epitaxial semiconductor layer decreases linearly with a lateral distance from the contact region.

13. The semiconductor device of claim 1 wherein the tapered junction termination element has a non-symmetric arrangement.

14. The semiconductor device of claim 1 wherein the tapered junction termination element has a symmetric arrangement.

15. The semiconductor device of claim 1, wherein the second III-nitride epitaxial semiconductor layer further comprises an outer region surrounding the terminal region, wherein the outer region comprises a peripheral implanted zone having a peripheral zone conductivity.

16. The semiconductor device of claim 15 wherein the tapered junction termination element further comprises an implanted zone having a uniform implanted zone conductivity, wherein the peripheral zone conductivity is equal to the uniform implanted zone conductivity.

17. The semiconductor device of claim 1, wherein the non-conducting ion implanted zone extends into the first III-nitride epitaxial semiconductor layer.

18. The semiconductor device of claim 1, wherein the non-conducting ion implanted zone comprises a peripheral implanted zone extending into the first III-nitride epitaxial semiconductor layer and characterized by a uniform dopant concentration profile parallel to semiconductor substrate.

19. The semiconductor device of claim 1, wherein the non-conducting ion implanted zone is characterized by an implanted conductivity less than an epitaxial conductivity of the third III-nitride epitaxial semiconductor layer.

* * * * *